United States Patent
Toriumi et al.

(10) Patent No.: US 10,147,747 B2
(45) Date of Patent: Dec. 4, 2018

(54) SEMICONDUCTOR DEVICE, MANUFACTURING METHOD THEREOF, AND ELECTRONIC DEVICE

(71) Applicant: Semiconductor Energy Laboratory Co., Ltd., Atugi-shi, Kanagawa-ken (JP)

(72) Inventors: Satoshi Toriumi, Kanagawa (JP); Yoshikazu Hiura, Kanagawa (JP); Mai Sugikawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/824,268

(22) Filed: Aug. 12, 2015

(65) Prior Publication Data

US 2016/0056179 A1    Feb. 25, 2016

(30) Foreign Application Priority Data

Aug. 21, 2014    (JP) .................................. 2014-168143

(51) Int. Cl.
  *H01L 23/52*    (2006.01)
  *H01L 27/12*    (2006.01)
  (Continued)

(52) U.S. Cl.
  CPC .... *H01L 27/1259* (2013.01); *H01L 21/76801* (2013.01); *H01L 21/76828* (2013.01);
  (Continued)

(58) Field of Classification Search
  CPC ............ H01L 27/1207; H01L 29/7869; H01L 29/78693; H01L 29/66742; H01L 23/5226;
  (Continued)

(56) References Cited

U.S. PATENT DOCUMENTS 5,675,185 A * 10/1997 Chen ................... H01L 27/0688
                                                                257/752
5,731,856 A    3/1998 Kim et al.
(Continued)

FOREIGN PATENT DOCUMENTS

EP        1737044 A      12/2006
EP        2226847 A       9/2010
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Asok K Sarkar
*Assistant Examiner* — Dmitriy Yemelyanov
(74) *Attorney, Agent, or Firm* — Fish & Richardson P.C.

(57) ABSTRACT

A semiconductor device includes a first layer, a second layer over the first layer, and a third layer over the second layer. The first layer includes a first transistor. The third layer includes a second transistor. A channel formation region of the first transistor includes a single crystal semiconductor. A channel formation region of the second transistor includes an oxide semiconductor. The second layer includes a first insulating film, a second insulating film, and a conductive film. The conductive film has a function of electrically connecting the first transistor and the second transistor. The first insulating film is over and in contact with the conductive film. The second insulating film is provided over the first insulating film. The second insulating film includes a region with a carbon concentration of greater than or equal to $1.77 \times 10^{17}$ atoms/cm$^3$ and less than or equal to $1.0 \times 10^{18}$ atoms/cm$^3$.

18 Claims, 35 Drawing Sheets

(51) Int. Cl.
*H01L 29/786* (2006.01)
*H01L 23/532* (2006.01)
*H01L 21/768* (2006.01)
*H01L 27/06* (2006.01)
*H01L 21/8258* (2006.01)
*H01L 27/088* (2006.01)
*H01L 27/092* (2006.01)
*H01L 29/45* (2006.01)
*H01L 29/66* (2006.01)

(52) U.S. Cl.
CPC .... *H01L 21/8258* (2013.01); *H01L 23/53295* (2013.01); *H01L 27/0688* (2013.01); *H01L 27/088* (2013.01); *H01L 27/092* (2013.01); *H01L 27/1225* (2013.01); *H01L 29/45* (2013.01); *H01L 29/66969* (2013.01); *H01L 29/7869* (2013.01); *H01L 29/78606* (2013.01); *H01L 29/78696* (2013.01); *H01L 21/76829* (2013.01); *H01L 21/76834* (2013.01); *H01L 2924/0002* (2013.01)

(58) Field of Classification Search
CPC ........ H01L 23/53295; H01L 21/02271; H01L 21/76856; H01L 27/1259
See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,102,165 | B2 | 9/2006 | Yamazaki |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,530,944 | B2 | 9/2013 | Yamazaki |
| 8,680,679 | B2 | 3/2014 | Yamazaki |
| 8,828,789 | B2 | 9/2014 | Yamazaki et al. |
| 9,059,029 | B2 | 6/2015 | Arai et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0042613 | A1* | 3/2003 | Shioya .................. C23C 16/401 257/762 |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0059887 | A1* | 3/2010 | Ueki .................. H01L 21/02126 257/741 |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2012/0187395 | A1* | 7/2012 | Koezuka ............. H01L 29/7869 257/43 |
| 2013/0119531 | A1* | 5/2013 | Tanaka .............. H01L 21/28273 257/734 |
| 2013/0193433 | A1 | 8/2013 | Yamazaki |
| 2013/0207112 | A1 | 8/2013 | Isobe et al. |
| 2014/0042434 | A1* | 2/2014 | Yamazaki ........... H01L 29/7869 257/43 |
| 2014/0151693 | A1 | 6/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |

(56) References Cited

FOREIGN PATENT DOCUMENTS

| JP | 63-265818 | A | 11/1988 |
|---|---|---|---|
| JP | 05-251705 | A | 9/1993 |
| JP | 08-264794 | A | 10/1996 |
| JP | 08-288285 | A | 11/1996 |
| JP | 11-505377 | | 5/1999 |
| JP | 2000-044236 | A | 2/2000 |
| JP | 2000-150900 | A | 5/2000 |
| JP | 2001-318626 | | 11/2001 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2007-096055 | A | 4/2007 |
| JP | 2007-123861 | A | 5/2007 |
| WO | WO-2004/114391 | | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Let. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2005, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn], at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo. Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", Sid Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)_m$ (m<4):a Zn4s conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 14A
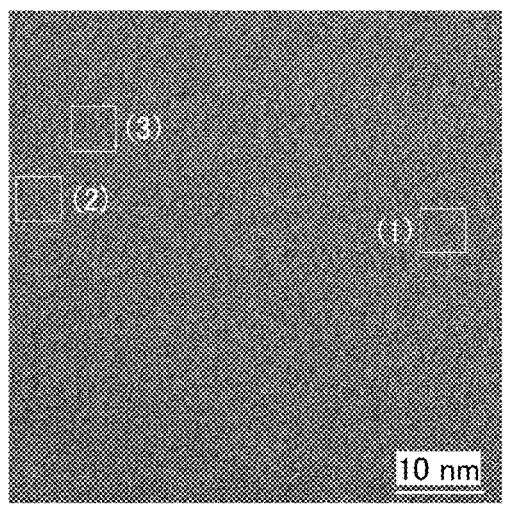
FIG. 14B     FIG. 14C     FIG. 14D
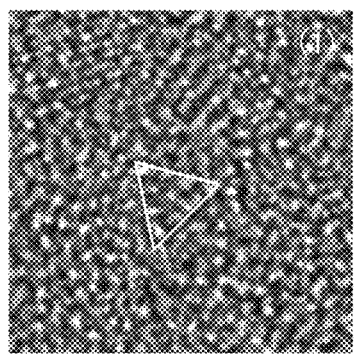 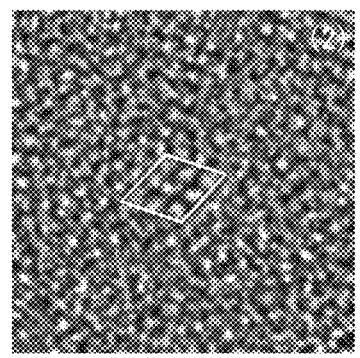 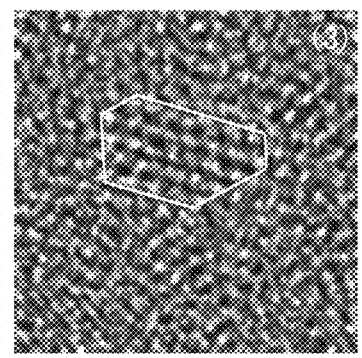

FIG. 18A
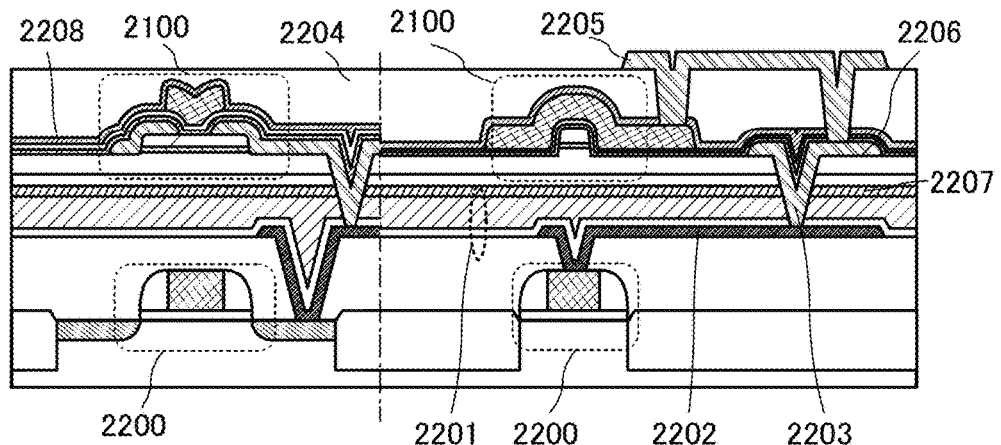
FIG. 18B  FIG. 18C
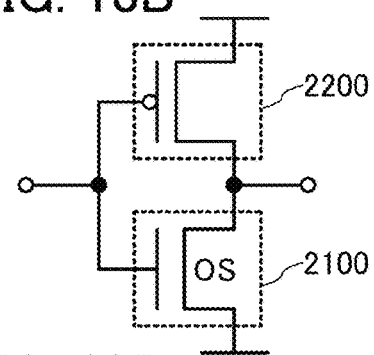 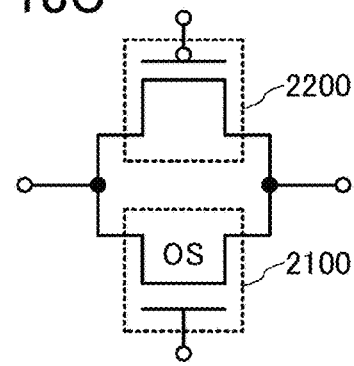
FIG. 18D
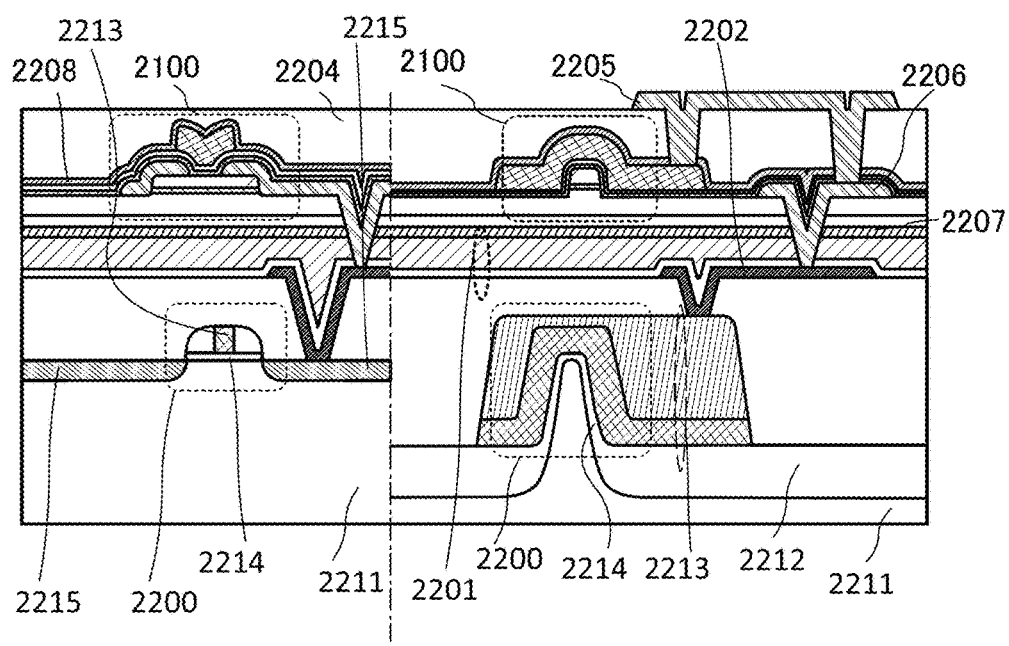

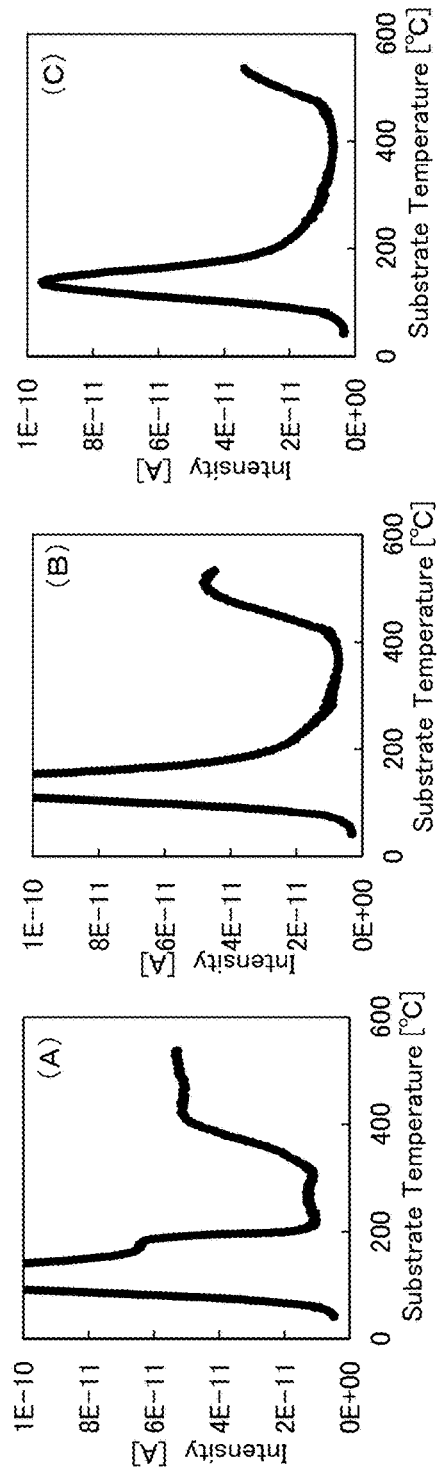
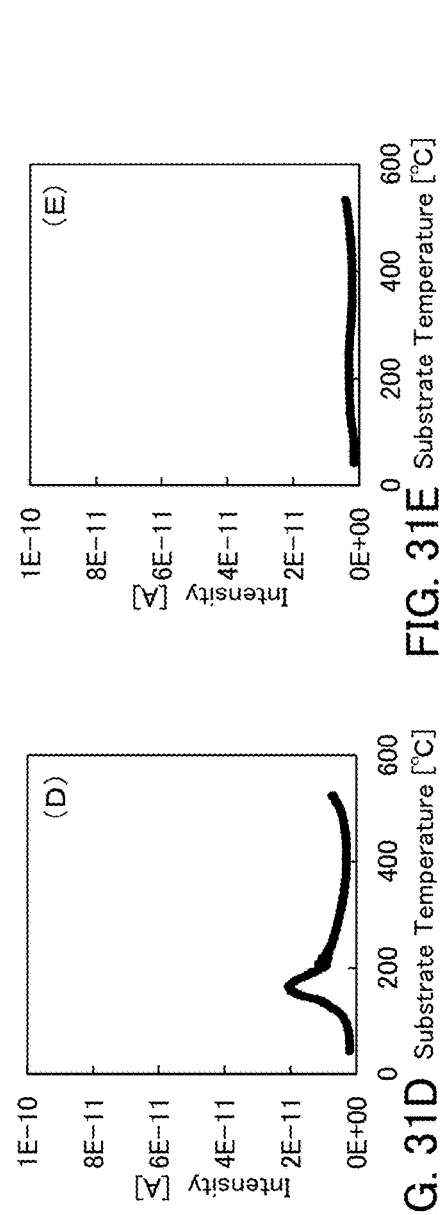
FIG. 31A  FIG. 31B  FIG. 31C  FIG. 31D  FIG. 31E

SEMICONDUCTOR DEVICE, MANUFACTURING METHOD THEREOF, AND ELECTRONIC DEVICE

BACKGROUND OF THE INVENTION

1. Field of the Invention

One embodiment of the present invention relates to a semiconductor device including a field-effect transistor.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

In this specification and the like, the term "semiconductor device" means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may have a semiconductor device.

2. Description of the Related Art

A technique in which a transistor is formed using a semiconductor material has attracted attention. The transistor is applied to a wide range of electronic devices such as an integrated circuit (IC) or an image display device (also simply referred to as a display device). As semiconductor materials applicable to the transistor, silicon-based semiconductor materials have been widely used, but oxide semiconductors have been attracting attention as alternative materials.

For example, a technique for forming a transistor using zinc oxide or an In—Ga—Zn-based oxide semiconductor as an oxide semiconductor is disclosed (see Patent Documents 1 and 2).

When such transistors each including an oxide semiconductor are stacked to have a three-dimensional layered structure, a complex circuit configuration can be formed in a small area. Furthermore, by combination of a transistor including an oxide semiconductor and a transistor which has high field effect mobility and formed using a single crystal silicon substrate, a higher functional circuit can be obtained.

REFERENCE

Patent Document

[Patent Document 1] Japanese Published Patent Application No. 2007-123861
[Patent Document 2] Japanese Published Patent Application No. 2007-96055

SUMMARY OF THE INVENTION

An object of one embodiment of the present invention is to provide a semiconductor device that is suitable for miniaturization and higher density. Another object of one embodiment of the present invention is to provide a semiconductor device with favorable electrical characteristics. Another object is to provide a semiconductor device capable of high-speed writing. Another object is to provide a semiconductor device capable of high-speed reading. Another object is to provide a semiconductor device with low power consumption. Another object is to provide a highly reliable semiconductor device. Another object is to provide a semiconductor device with a novel structure.

Note that the descriptions of these objects do not disturb the existence of other objects. Note that in one embodiment of the present invention, there is no need to achieve all the objects. Note that other objects will be apparent from the description of the specification, the drawings, the claims, and the like and other objects can be derived from the description of the specification, the drawings, the claims, and the like.

One embodiment of the present invention is a semiconductor device including a first layer, a second layer over the first layer, and a third layer over the second layer. The first layer includes a first transistor. The third layer includes a second transistor. A channel formation region of the first transistor includes a single crystal semiconductor. A channel formation region of the second transistor includes an oxide semiconductor. The second layer includes a first insulating film, a second insulating film, and a conductive film. The conductive film has a function of electrically connecting the first transistor and the second transistor. The first insulating film is over and in contact with the conductive film. The second insulating film is provided over the first insulating film. The second insulating film includes a region with a carbon concentration of greater than or equal to $1.77 \times 10^{17}$ atoms/cm$^3$ and less than or equal to $1.0 \times 10^{18}$ atoms/cm$^3$.

In the above structure, the second insulating film may include oxygen and silicon.

In any of the above structures, the second insulating film is preferably formed by an atmospheric pressure chemical vapor deposition method.

In any of the above structures, a nitride film may be on a surface of the conductive film.

Another embodiment of the present invention is an electronic device which includes the semiconductor device having any of the above structures and a display device, a microphone, a speaker, an operation key, a touch panel, or an antenna.

Another embodiment of the present invention is a method for manufacturing a semiconductor device including the steps of: forming a first transistor including a single crystal semiconductor in a channel formation region; forming a conductive film electrically connected to a first transistor over the first transistor; forming a first insulating film over and in contact with the conductive film; forming a second insulating film over the first insulating film; forming an oxide semiconductor film over the second insulating film; forming a pair of electrodes over the oxide semiconductor film; forming a third insulating film over the pair of electrodes; and forming a gate electrode over the third insulating film. The second insulating film is formed by an atmospheric pressure chemical vapor deposition method. One of the pair of electrodes is electrically connected to the conductive film.

In the above method, the conductive film may be nitrided after the conductive film is formed.

In any of the above methods, the second insulating film preferably includes oxygen and silicon and the deposition speed (deposition rate) of the second insulating film is greater than or equal to 100 nm/min and less than or equal to 200 nm/min.

According to one embodiment of the present invention, a semiconductor device that is suitable for miniaturization and higher density can be provided.

A semiconductor device with favorable electrical characteristics can be provided. A semiconductor device capable of high-speed writing can be provided. A semiconductor device capable of high-speed reading can be provided. A semiconductor device with low power consumption can be provided. A highly reliable semiconductor device can be provided. A semiconductor device or the like with a novel structure can be provided. Note that the description of these effects does not disturb the existence of other effects. One embodiment of the present invention does not necessarily achieve all the above effects. Other effects will be apparent from and can be derived from the description of the specification, the drawings, the claims, and the like.

BRIEF DESCRIPTION OF THE DRAWINGS

In the accompanying drawings:

FIGS. 14A to 14D are Cs-corrected high-resolution TEM images of a plane of a CAAC-OS film;

FIGS. 18A to 18D are cross-sectional views and circuit diagrams illustrating structure examples of semiconductor devices;

FIGS. 31A to 31E show results of TDS measurement of samples used in Example;

DETAILED DESCRIPTION OF THE INVENTION

Figure 1:
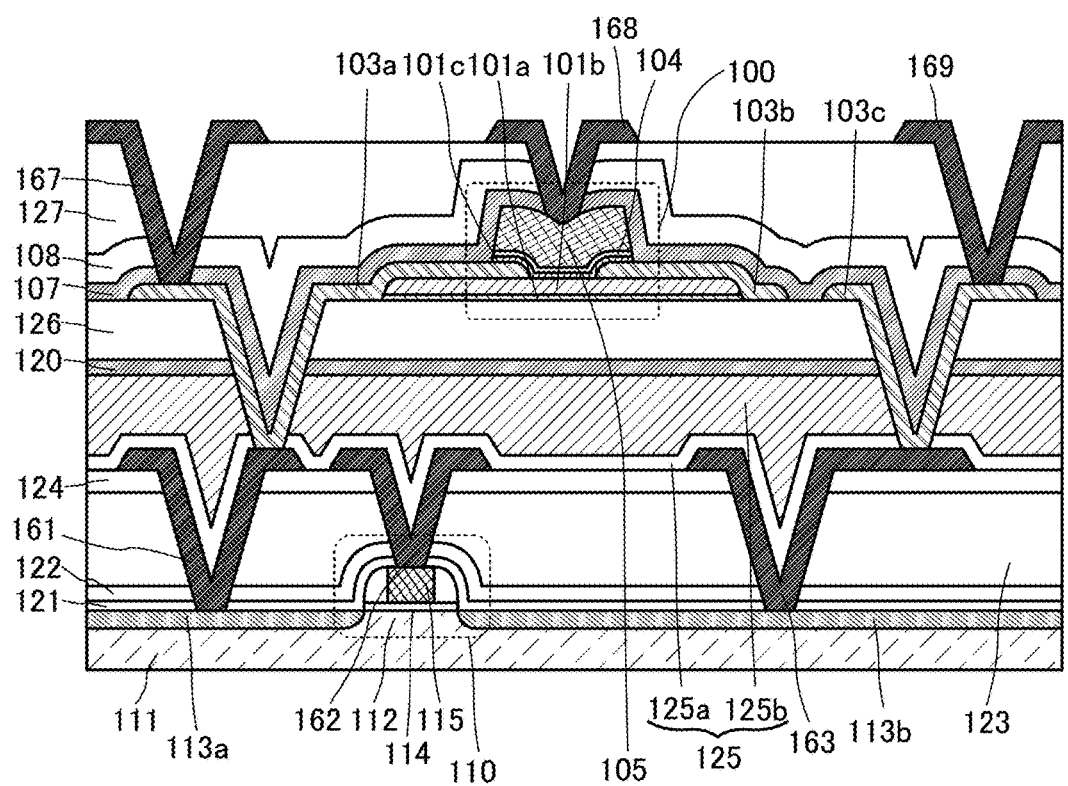
FIG. 1 is a cross-sectional view of a semiconductor device.

Embodiments will be described in detail with reference to drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatch pattern is applied to similar functions, and these are not especially denoted by reference numerals in some cases.

Note that in each drawing described in this specification, the size, the layer thickness, or the region of each component is exaggerated for clarity in some cases. Therefore, embodiments of the invention are not limited to such scales.

Note that ordinal numbers such as "first" and "second" in this specification and the like are used in order to avoid confusion among components, and the terms do not limit the components numerically.

A transistor is a kind of semiconductor element and can achieve amplification of a current or a voltage, switching operation for controlling conduction or non-conduction, or the like. A transistor in this specification includes an insulated-gate field effect transistor (IGFET) and a thin film transistor (TFT).

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

(Embodiment 1)

FIG. 1 illustrates an example of a cross-sectional view of a semiconductor device. The semiconductor device includes a first transistor 110 and a second transistor 100 as illustrated in FIG. 1. The second transistor 100 is provided above the first transistor 110. A barrier film 120, an interlayer insulating film, a conductive film which electrically connects the first transistor 110 and the second transistor 100, and the like are provided between the first transistor 110 and the second transistor 100.

The first transistor 110 is provided on a semiconductor substrate 111 and includes a semiconductor film 112 which is a portion of the semiconductor substrate 111, a gate insulating film 114, a gate electrode 115, and low-resistance layers 113a and 113b serving as source and drain regions.

The first transistor 110 can be either a p-channel transistor or an n-channel transistor; it is preferable to use a p-channel transistor. Alternatively, an appropriate transistor may be used depending on the circuit configuration or the driving method.

It is preferable that a region of the semiconductor film 112 where a channel is formed, a region in the vicinity thereof, the low-resistance layers 113a and 113b serving as source and drain regions, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the first transistor 110 may be a high-electron-mobility transistor (HEMT) with GaAs and GaAlAs or the like.

The low-resistance layers 113a and 113b contain an element which imparts n-type conductivity, such as arsenic or phosphorus, or an element which imparts p-type conductivity, such as boron, in addition to a semiconductor material used for the semiconductor film 112.

The gate electrode 115 can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material. It is preferable to use a high-melting-point material which has both heat resistance and conductivity, such as tungsten or molybdenum, and it is particularly preferable to use tungsten.

Figure 2:
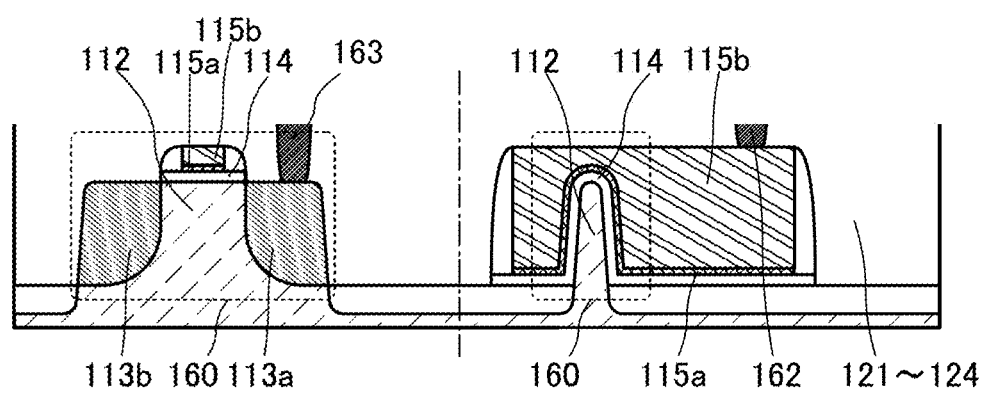
FIG. 2 illustrates a structure example of a semiconductor device.

Here, a transistor 160 illustrated in FIG. 2 may be used instead of the first transistor 110. FIG. 2 illustrates a cross section of the transistor 160 in a channel length direction on the left side of the dashed-dotted line and a cross section thereof in a channel width direction on the right side of the dashed-dotted line. In the transistor 160 illustrated in FIG. 2, the semiconductor film 112 (a portion of the semiconductor substrate) in which a channel is formed has a protrusion, and the gate insulating film 114, a gate electrode 115a, and a gate electrode 115b are provided along top and side surfaces of the protrusion. Note that the gate electrode 115a may be formed using a material with an adjusted work function. The transistor 160 having such a shape is also referred to as a FIN transistor because it utilizes a protruding portion of the semiconductor substrate. Note that an insulating film serving as a mask for forming the protruding portion may be provided in contact with the top of the protruding portion. Although the case where the protruding portion is formed by processing a portion of the semiconductor substrate is described here, a semiconductor film having a protruding shape may be formed by processing an SOI substrate.

The first transistor 110 is covered with an insulating film 121, an insulating film 122, an insulating film 123, and an insulating film 124 which are stacked in this order.

In the case where a silicon-based semiconductor material is used for the semiconductor film 112, the insulating film 122 preferably contains hydrogen. When the insulating film 122 containing hydrogen is provided over the first transistor 110 and heat treatment is performed, dangling bonds in the semiconductor film 112 are terminated by hydrogen contained in the insulating film 122, whereby the reliability of the first transistor 110 can be improved.

The insulating film 123 functions as a planarization film for eliminating a level difference generated by the first transistor 110 or the like underlying the insulating film 123. A top surface of the insulating film 123 may be planarized by planarization treatment using a chemical mechanical polishing (CMP) method or the like to increase planarity.

The insulating film 124 may have a function as a barrier film. The insulating film 124 is not necessarily provided.

A plurality of openings are provided in the insulating film 121, the insulating film 122, the insulating film 123, and the insulating film 124. A conductive film 161 electrically connected to the low-resistance layer 113a through one of the plurality of openings, a conductive film 163 electrically connected to the low-resistance layer 113b through another one of the plurality of openings, and a conductive film 162 electrically connected to the gate electrode 115 through the other of the plurality of openings.

Each of the conductive films (conductive films 161 to 163) can be formed using a conductive material such as a metal material, an alloy material, or a metal oxide material. It is preferable to use a high-melting-point material which has both heat resistance and conductivity, such as tungsten, molybdenum, titanium, or titanium nitride, and it is particularly preferable to use tungsten. Alternatively, a stacked-layer film including two or more layers containing more than one of the above high-melting-point metals may be used. For example, a two-layer structure with tungsten over titanium nitride may be used.

An interlayer insulating film 125 is provided over the conductive film 161, the conductive film 162, and the conductive film 163 which are electrically connected to the first transistor 110.

The interlayer insulating film 125 can be formed by a plasma chemical vapor deposition (CVD) method, a low-pressure CVD method, an atmospheric pressure CVD method, or the like. An atmospheric pressure CVD apparatus is preferable because its equipment costs are relatively lower than those of a plasma CVD apparatus including a vacuum pump.

In a plasma CVD method, when a deposition gas is supplied to a region with high plasma density, gas molecules are dissociated to generate radicals. Short-life active radicals are generated in the region with high plasma density and are reacted in a gas phase, whereby nuclei are formed. When nuclei are formed, reaction proceeds successively; thus, in the case where a formation surface is not uniform, a cavity (also referred to as a seam) is generated in a depressed portion in some cases. On the other hand, in an atmospheric pressure CVD method, a source gas is thermally decomposed on a formation surface heated at an appropriate temperature by thermal energy or in a gas phase, and a film is uniformly formed on the formation surface by a reaction due to a decomposition product or a chemical reaction; thus, an atmospheric pressure CVD method is preferable because the embeddability is high even when the formation surface is not uniform, and the seam size in the depressed portion is small or generation of seams can be suppressed.

A film using an atmospheric pressure CVD method is formed in such a manner that a source gas and an ozone gas are introduced into a deposition treatment chamber and then a substrate stage is heated. However, when an interlayer insulating film is formed over a conductive film by an atmospheric pressure CVD method, the conductive film is oxidized by an ozone gas.

To avoid the above problem, a stacked-layer film using different deposition methods is used as an interlayer insulating film so that embeddability is maintained and a conductive film is not oxidized. Specifically, an insulating film in contact with a conductive film is formed by a deposition method in which a film is not oxidized by a deposition gas (e.g., a plasma CVD method), and an insulating film formed by an atmospheric pressure CVD method with high embeddability is formed thereover.

In this embodiment, as the interlayer insulating film 125, a stacked-layer film of an insulating film 125a and an insulating film 125b is used.

The insulating film 125a can be formed to have a single-layer structure or a stacked-layer structure using, for example, one or more of an insulating film containing a so-called high-k material such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST) by a sputtering method, a CVD method (including a thermal CVD method, an MOCVD method, a PECVD method, and the like), an MBE method, an ALD method, or a PLD method. Alternatively, aluminum oxide, bismuth oxide, germanium oxide, niobium oxide, silicon oxide, titanium oxide, tungsten oxide, yttrium oxide, or zirconium oxide may be added to the insulating film, for example. Alternatively, the insulating film may be subjected to nitriding treatment. A layer of silicon oxide, silicon oxynitride, or silicon nitride may be stacked over the insulating film.

As the insulating film 125b, by an atmospheric pressure CVD method, an insulating film similar to the insulating film 125a can be used. In addition, the insulating film 125b has a lower carbon concentration in a film than the insulating film 125a and includes a region with a carbon concentration of greater than or equal to $1.77 \times 10^{17}$ atoms/cm$^3$ and less than or equal to $1.0 \times 10^{18}$ atoms/cm$^3$.

Before the interlayer insulating film 125 is deposited, surfaces of the conductive films 161 to 163 may be nitrided by nitrogen or ammonia. Nitridation can prevent oxidation due to an ozone gas.

The barrier film 120 is provided so as to cover a top surface of the interlayer insulating film 125.

The barrier film 120 has openings in which a pair of electrodes 103a and 103b described later are embedded.

An insulating film 126 is provided over the barrier film 120. An oxide material from which oxygen is partly released by heating is preferably used for the insulating film 126.

As the oxide material from which oxygen is released by heating, an oxide insulating film containing oxygen at a higher proportion than the stoichiometric composition is an oxide insulating film including a region of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The second transistor 100 is provided over the insulating film 126.

The second transistor 100 includes an oxide semiconductor film 101a in contact with a top surface of the insulating film 126, an oxide semiconductor film 101b in contact with a top surface of the oxide semiconductor film 101a, the pair of electrodes 103a and 103b in contact with the oxide semiconductor film 101b, an oxide semiconductor film 101c over the oxide semiconductor film 101b and in contact with the pair of electrodes 103a and 103b, a gate insulating film 104 over the oxide semiconductor film 101c, and a gate electrode 105 overlapping with the oxide semiconductor film 101b with the gate insulating film 104 and the oxide semiconductor film 101c provided therebetween. The second transistor 100 is covered with an insulating film 107, an insulating film 108, and an insulating film 127.

The electrode 103a is electrically connected to the conductive film 161. Furthermore, the electrode 103a is electrically connected to a conductive film 167 through an opening provided in the insulating film 127, the insulating film 108, and the insulating film 107. The gate electrode 105 is electrically connected to a conductive film 168 through an opening provided in the insulating film 127, the insulating film 108, and the insulating film 107.

The pair of electrodes 103a and 103b and an electrode 103c are formed at the same time, and the electrode 103c is electrically connected to a conductive film 169 through an opening provided in the insulating film 127, the insulating film 108, and the insulating film 107.

For example, the oxide semiconductor preferably contains at least indium (In) or zinc (Zn). More preferably, the oxide semiconductor contains an oxide represented by an In-M-Zn-based oxide (M is a metal such as Al, Ti, Ga, Ge, Y, Zr, Sn, La, Ce, or Hf).

As the semiconductor film, it is particularly preferable to use an oxide semiconductor film including a plurality of crystal parts whose c-axes are aligned perpendicular to a surface on which the semiconductor film is formed or a top surface of the semiconductor film and in which the adjacent crystal parts have no grain boundary.

The use of such materials for the semiconductor film makes it possible to provide a highly reliable transistor in which a change in the electrical characteristics is suppressed.

Note that details of a preferable mode and a formation method of an oxide semiconductor applicable to the semiconductor film are described in an embodiment below.

The semiconductor device of one embodiment of the present invention preferably includes another oxide semiconductor film between the oxide semiconductor film and the insulating film overlapping with the oxide semiconductor film, and the oxide semiconductor film between the oxide semiconductor film and the insulating film contains as its constituent element at least one of the metal elements that constitute the oxide semiconductor film. With such a structure, formation of a trap level at the interface between the oxide semiconductor film and the insulating film overlapping with the oxide semiconductor film can be suppressed.

That is, one embodiment of the present invention preferably has a structure in which each of the top surface and the bottom surface of at least the channel formation region of the oxide semiconductor film is in contact with an oxide film that functions as a barrier film for preventing formation of an interface state of the oxide semiconductor film. With this structure, formation of oxygen vacancies and entry of impurities which cause generation of carriers in the oxide semiconductor film and at the interface can be prevented. Thus, a highly purified intrinsic oxide semiconductor film can be obtained. Obtaining a highly purified intrinsic oxide semiconductor film refers to purifying or substantially purifying the oxide semiconductor film to be an intrinsic or substantially intrinsic oxide semiconductor film. In this way, a change in electrical characteristics of a transistor including the oxide semiconductor film can be prevented, and a highly reliable semiconductor device can be provided.

Note that in this specification and the like, the carrier density of a substantially intrinsic oxide semiconductor film is lower than $1\times10^{17}/cm^3$, lower than $1\times10^{15}/cm^3$, or lower than $1\times10^{13}/cm^3$. With a highly purified intrinsic oxide semiconductor film, the transistor can have stable electrical characteristics.

The oxide semiconductor film 101a is provided between the insulating film 126 and the oxide semiconductor film 101b.

The oxide semiconductor film 101c is provided between the oxide semiconductor film 101b and the gate insulating film 104. Specifically, a bottom surface of the oxide semiconductor film 101c is in contact with a top surfaces of the pair of electrodes 103a and 103b and a bottom surface of the gate insulating film 104.

The oxide semiconductor film 101a and the oxide semiconductor film 101c each contain an oxide containing one or more metal elements that are also contained in the oxide semiconductor film 101b.

Note that the boundary between the oxide semiconductor film 101b and the oxide semiconductor film 101a or the boundary between the oxide semiconductor film 101b and the oxide semiconductor film 101c is not clear in some cases.

For example, the oxide semiconductor films 101a and 101c contain In or Ga; typically, a material such as an In—Ga-based oxide, an In—Zn-based oxide, or an In-M-Zn-based oxide (M is Al, Ti, Ga, Y, Zr, La, Ce, Nd, or Hf) that has energy at the bottom of the conduction band closer to the vacuum level than that of the oxide semiconductor film 101b is used. Typically, the difference in energy at the bottom of the conduction band between the oxide semiconductor film 101a or 101c and the oxide semiconductor film 101b is preferably 0.05 eV or more, 0.07 eV or more, 0.1 eV or more, or 0.15 eV or more and 2 eV or less, 1 eV or less, 0.5 eV or less, or 0.4 eV or less.

For each of the oxide semiconductor films 101a and 101c between which the oxide semiconductor film 101b is sandwiched, an oxide that contains a larger amount of Ga serving as a stabilizer than that of the oxide semiconductor film 101b is used, which can suppress release of oxygen from the oxide semiconductor film 101b.

When an In—Ga—Zn-based oxide in which the atomic ratio of In to Ga and Zn is 1:1:1, 4:2:4.1, or 3:1:2 is used for the oxide semiconductor film 101b, for example, an In—Ga—Zn-based oxide in which the atomic ratio of In to Ga and Zn is 1:3:2, 1:3:4, 1:3:6, 1:6:4, 1:6:8, 1:6:10, or 1:9:6 can be used for the oxide semiconductor films 101a and 101c. Note that the proportion of each metal element in the atomic ratio of each of the oxide semiconductor films 101a, 101b, and 101c varies within a range of ±20% of that in the above atomic ratio as an error. For the oxide semiconductor films 101a and 101c, materials with the same composition or materials with different compositions may be used.

Furthermore, when an In-M-Zn-based oxide is used for the oxide semiconductor film 101b, an oxide containing metal elements in the atomic ratio satisfying the following conditions is preferably used for a target for forming a semiconductor film to be the oxide semiconductor film 101b. Given that the atomic ratio of the metal elements in the target is In:M:Zn=$x_1$:$y_1$:$z_1$, $x_1/y_1$ is greater than or equal to ⅓ and less than or equal to 6, preferably greater than or equal to 1 and less than or equal to 6, and $z_1/y_1$ is greater than or equal to ⅓ and less than or equal to 6, preferably greater than or equal to 1 and less than or equal to 6. Note that when $z_1/y_1$ is less than or equal to 6, a CAAC-OS film to be described later is easily formed. Typical examples of the atomic ratio of the metal elements in the target are In:M:Zn=1:1:1, In:M:Zn=4:2:4.1, In:M:Zn=3:1:2, and the like.

When an In-M-Zn-based oxide is used for the oxide semiconductor films 101a and 101c, an oxide containing metal elements in the atomic ratio satisfying the following conditions is preferably used for a target for forming oxide semiconductor films to be the oxide semiconductor films 101a and 101c. Given that the atomic ratio of the metal elements in the target is In:M:Zn=$x_2$:$y_2$:$z_2$, $x_2/y_2$ is less than $x_1/y_1$, and $z_2/y_2$ is greater than or equal to ⅓ and less than or equal to 6, preferably greater than or equal to 1 and less than or equal to 6. Note that when $z_2/y_2$ is less than or equal to 6, a CAAC-OS film to be described later is easily formed. Typical examples of the atomic ratio of the metal elements in the target are In:M:Zn=1:3:4, In:M:Zn=1:3:6, In:M:Zn=1:3:8, In:M:Zn=1:2:4, and the like.

By using a material in which the energy at the bottom of the conduction band is closer to the vacuum level than that of the oxide semiconductor film 101b is for the oxide semiconductor films 101a and 101c, a channel is mainly formed in the oxide semiconductor film 101b, so that the oxide semiconductor film 101b serves as a main current path. When the oxide semiconductor film 101b in which a channel is formed is sandwiched between the oxide semiconductor films 101a and 101c as described above, formation of interface states between these films is suppressed, and thus reliability of the electrical characteristics of the transistor is improved.

Note that, without limitation to that described above, a material with an appropriate atomic ratio may be used depending on required semiconductor characteristics and electrical characteristics (e.g., field-effect mobility and threshold voltage). To obtain the required semiconductor characteristics of the transistor, it is preferable that the carrier density, the impurity concentration, the defect density, the atomic ratio of a metal element to oxygen, the interatomic distance, the density, and the like of the oxide semiconductor films 101a, 101b, and 101c be set to appropriate values.

Here, a mixed region of the oxide semiconductor film 101a and the oxide semiconductor film 101b might exist between the oxide semiconductor film 101a and the oxide semiconductor film 101b. Furthermore, a mixed region of the oxide semiconductor film 101b and the oxide semiconductor film 101c might exist between the oxide semiconductor film 101b and the oxide semiconductor film 101c. The mixed region has a low density of interface states. For that reason, the stack including the oxide semiconductor films 101a, 101b, and 101c has a band structure where energy at each interface and in the vicinity of the interface is changed continuously (continuous junction).

Here, a band structure is described. For easy understanding, the band structure is illustrated with the energy (Ec) at the bottom of the conduction band of each of the insulating film 126, the oxide semiconductor film 101a, the oxide semiconductor film 101b, the oxide semiconductor film 101c, and the gate insulating film 104.

Figure 3A:
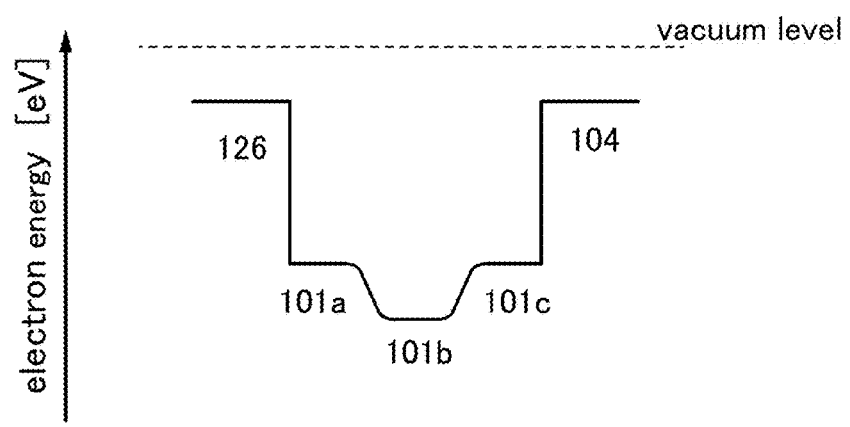
FIGS. 3A and 3B show band structures.
Figure 3B:
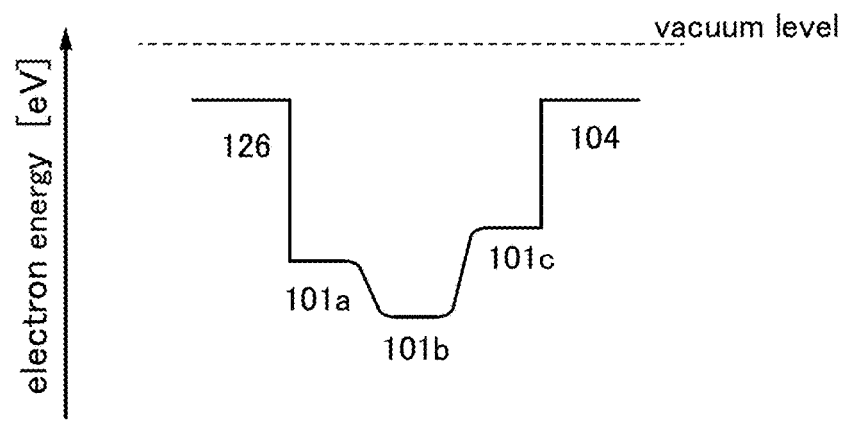

As illustrated in FIGS. 3A and 3B, the energy at the bottom of the conduction band changes continuously in the oxide semiconductor film 101a, the oxide semiconductor film 101b, and the oxide semiconductor film 101c. This can be understood also from the fact that the constituent elements are common among the oxide semiconductor film 101a, the oxide semiconductor film 101b, and the oxide semiconductor film 101c and oxygen is easily diffused among the oxide semiconductor films 101a to 101c. Thus, the oxide semiconductor films 101a to 101c have a continuous physical property although they are a stack of layers having different compositions.

The oxide semiconductor films, which contain the same main components and are stacked, are not simply stacked but formed to have continuous junction (here, particularly a U-shaped well structure where the energy at the bottom of the conduction band is continuously changed between the films). In other words, a stacked-layer structure is formed such that there exist no impurities which form a defect level such as a trap center or a recombination center at each interface. If impurities are mixed between the films in the stacked multilayer film, the continuity of the energy band is lost and carriers disappear by being trapped or recombined at the interface.

Note that FIG. 3A illustrates the case where the Ec of the oxide semiconductor film 101a and the Ec of the oxide semiconductor film 101c are equal to each other; however, they may be different from each other. For example, part of the band structure in the case where the Ec of the oxide semiconductor film 101c is higher than the Ec of the oxide semiconductor film 101a is illustrated in FIG. 3B.

As illustrated in FIGS. 3A and 3B, the oxide semiconductor film 101b serves as a well and a channel of the second transistor 100 is formed in the oxide semiconductor film 101b. Note that since the energies at the bottoms of the conduction bands are changed continuously, the oxide semiconductor films 101a, 101b, and 101c can also be referred to as a U-shaped well. Furthermore, a channel formed to have such a structure can also be referred to as a buried channel.

Note that trap levels due to impurities or defects might be formed in the vicinity of the interface between an insulating film such as a silicon oxide film and each of the oxide semiconductor films 101a and 101c. The oxide semiconductor film 101b can be distanced away from the trap levels owing to existence of the oxide semiconductor films 101a and 101c. However, when the energy difference between the Ec of the oxide semiconductor film 101a or 101c and the Ec of the oxide semiconductor film 101b is small, an electron in the oxide semiconductor film 101b might reach the trap level across the energy difference. When the electron is trapped in the trap level, a negative fixed charge is generated at the interface with the insulating film, whereby the threshold voltage of the transistor is shifted in the positive direction.

Thus, to reduce a change in the threshold voltage of the transistor, an energy difference between the Ec of the oxide semiconductor film 101b and the Ec of each of the oxide semiconductor films 101a and 101c is necessary. The energy difference is preferably greater than or equal to 0.1 eV, further preferably greater than or equal to 0.15 eV.

The oxide semiconductor films 101a, 101b, and 101c preferably include crystal parts. In particular, when a crystal in which c-axes are aligned is used, the transistor can have stable electrical characteristics.

In the band structure illustrated in FIG. 3B, instead of the oxide semiconductor film 101c, an In—Ga oxide (e.g., with an atomic ratio of In:Ga=7:93) may be provided between the oxide semiconductor film 101b and the gate insulating film 104.

For the oxide semiconductor film 101b, an oxide having an electron affinity higher than that of each of the oxide semiconductor films 101a and 101c is used. For example, for the oxide semiconductor film 101b, an oxide having an electron affinity higher than that of each of the oxide semiconductor films 101a and 101c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the bottom of the conduction band.

Here, it is preferable that the thickness of the oxide semiconductor film 101b be at least larger than that of the oxide semiconductor film 101a. The thicker the oxide semiconductor film 101b is, the larger the on-state current of the transistor can be. The thickness of the oxide semiconductor film 101a may be set as appropriate as long as formation of an interface state at the interface with the oxide semiconductor film 101b is inhibited. For example, the thickness of the oxide semiconductor film 101b is larger than that of the oxide semiconductor film 101a, preferably 2 or more times, further preferably 4 or more times, still further preferably 6 or more times as large as that of the oxide semiconductor film 101a. Note that the above does not apply in the case where the on-state current of the transistor need not be increased, and the thickness of the oxide semiconductor film 101a may be larger than or equal to than that of the oxide semiconductor film 101b.

The thickness of the oxide semiconductor film 101c may be set as appropriate, in a manner similar to that of the oxide semiconductor film 101a, as long as formation of an interface state at the interface with the oxide semiconductor film 101b is inhibited. For example, the thickness of the oxide semiconductor film 101c may be set smaller than or equal to that of the oxide semiconductor film 101a. If the oxide semiconductor film 101c is thick, it may become difficult for the electric field from the gate electrode to reach the oxide semiconductor film 101b. Therefore, it is preferable that the oxide semiconductor film 101c be thin, for example, thinner than the oxide semiconductor film 101b. Note that the thickness of the oxide semiconductor film 101c is not limited to the above, and may be set as appropriate depending on a driving voltage of the transistor in consideration of the withstand voltage of the gate insulating film 104.

Here, in the case where the oxide semiconductor film 101b is in contact with an insulating film containing different constituent elements (e.g., an insulating film containing a silicon oxide film), an interface state is sometimes formed at the interface between the two films and the interface state forms a channel. In that case, a second transistor having a different threshold voltage may be formed, and accordingly an apparent threshold voltage of the transistor may fluctuate. However, in the transistor of this structural example, the oxide semiconductor film 101a contains one or more kinds of metal elements that constitute the oxide semiconductor film 101b. Therefore, an interface state is not easily formed at the interface between the oxide semiconductor film 101a and the oxide semiconductor film 101b. Thus, providing the oxide semiconductor film 101a makes it possible to reduce variations or changes in electrical characteristics of the transistor, such as threshold voltage.

When a channel is formed at the interface between the gate insulating film 104 and the oxide semiconductor film 101b, interface scattering occurs at the interface and the field-effect mobility of the transistor decreases in some cases. In the transistor of this structural example, however, the oxide semiconductor film 101c contains one or more kinds of metal elements that constitute the oxide semiconductor film 101b. Therefore, scattering of carriers is less likely to occur at the interface between the oxide semiconductor film 101b and the oxide semiconductor film 101c, and thus the field-effect mobility of the transistor can be increased.

One of the pair of electrodes 103a and 103b serves as a source electrode and the other serves as a drain electrode.

Each of the pair of electrodes 103a and 103b is formed to have a single-layer structure or a stacked-layer structure using any of metals such as aluminum, titanium, chromium, nickel, copper, yttrium, zirconium, molybdenum, silver, tantalum, and tungsten, or an alloy containing any of these metals as a main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. A transparent conductive material containing indium oxide, tin oxide, or zinc oxide may be used.

As the gate insulating film 104, an insulating film containing a so-called high-k material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or (Ba, Sr)$TiO_3$ (BST) can be used, for example. The insulating film may have a single-layer structure or a stacked-layer structure. Alternatively, aluminum oxide, bismuth oxide, germanium oxide, niobium oxide, silicon oxide, titanium oxide, tungsten oxide, yttrium oxide, or zirconium oxide may be added to the insulating film, for example. Alternatively, the insulating film may be subjected to nitriding treatment.

As the gate insulating film 104, like the insulating film 126, an oxide insulating film that contains more oxygen than that in the stoichiometric composition is preferably used.

When a specific material is used for the gate insulating film, electrons are trapped in the gate insulating film under specific conditions and the threshold voltage can be increased. For example, like a stacked-layer film of silicon oxide and hafnium oxide, part of the gate insulating film uses a material having a lot of electron trap states, such as hafnium oxide, aluminum oxide, and tantalum oxide, and the state where the potential of the gate electrode is higher than that of the source electrode or the drain electrode is kept for one second or more, specifically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Thus, electrons are moved from the semiconductor film to the gate electrode, and some of the electrons are trapped by the electron trap states.

In the transistor in which a necessary amount of electrons is trapped by the electron trap states in this manner, the threshold voltage is shifted in the positive direction. By controlling the voltage of the gate electrode, the amount of electrons to be trapped can be controlled, and thus the threshold voltage can be controlled. Furthermore, the treatment for trapping the electrons may be performed in the manufacturing process of the transistor.

For example, the treatment is preferably performed at any step before factory shipment, such as after the formation of a wiring connected to the source electrode or the drain electrode of the transistor, after pretreatment (wafer processing), after a wafer-dicing step, or after packaging. In any case, it is preferable that the transistor not be exposed to a temperature higher than or equal to 125° C. for one hour or more after that.

The gate electrode 105 can be formed using, for example, a metal selected from aluminum, chromium, copper, tantalum, titanium, molybdenum, and tungsten; an alloy containing any of these metals as a component; or an alloy containing any of these metals in combination. Furthermore, one or more metals selected from manganese and zirconium may be used. Alternatively, a semiconductor typified by polycrystalline silicon doped with an impurity element such as phosphorus, or silicide such as nickel silicide may be used. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, and a three-layer structure in which a titanium film, an aluminum film, and a titanium film are stacked in this order can be given. Alternatively, an alloy film or a nitride film which contains aluminum and one or more metals selected from titanium, tantalum, tungsten, molybdenum, chromium, neodymium, and scandium may be used.

The gate electrode 105 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

Furthermore, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 105 and the gate insulating film 104. These films each have a work function higher than or equal to 5 eV, preferably higher than or equal to 5.5 eV; thus, the threshold voltage of the transistor can be positive, and what is called a normally-off switching element can be achieved. For example, in the case of using an In—Ga—Zn-based oxynitride semiconductor film, an In—Ga—Zn-based oxynitride semiconductor film having a higher nitrogen concentration than that of at least the oxide semiconductor film 101b, specifically, an In—Ga—Zn-based oxynitride semiconductor film having a nitrogen concentration of 7 at. % or higher is used.

For the insulating film 107, like the barrier film 120, a material relatively impermeable to water or hydrogen is preferably used. In particular, for the insulating film 107, a material relatively impermeable to oxygen is preferably used.

By covering the oxide semiconductor film 101b with the insulating film 107 including a material relatively impermeable to oxygen, oxygen can be prevented from being released from the oxide semiconductor film 101b to a portion over the insulating film 107. Furthermore, oxygen released from the insulating film 126 can be confined below the insulating film 107, resulting in an increase in the amount of oxygen to be supplied to the oxide semiconductor film 101b.

The insulating film 107 relatively impermeable to water or hydrogen can inhibit water or hydrogen, which is an impurity for an oxide semiconductor, from entering the oxide semiconductor film 101b from the outside; therefore, a change in the electrical characteristics of the second transistor 100 can be suppressed and the transistor can have high reliability.

Note that an insulating film from which oxygen is released by heating, like the insulating film 126, may be provided under the insulating film 107 to supply oxygen also from a portion over the oxide semiconductor film 101b through the gate insulating film 104.

Figure 4A:
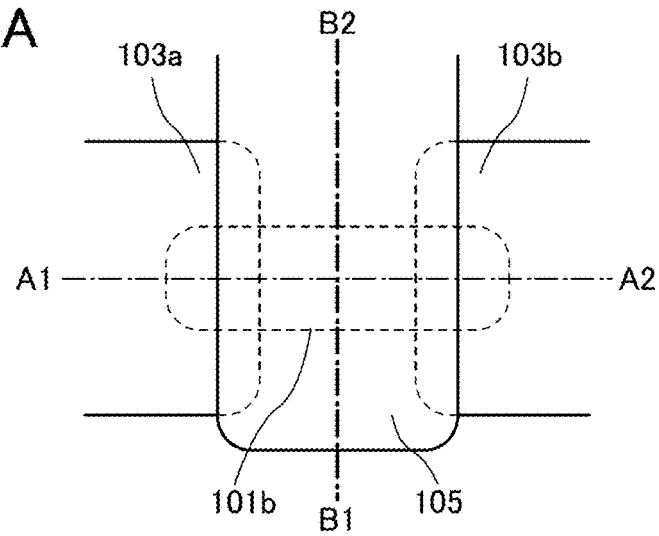
FIGS. 4A to 4C illustrate a structure example of a semiconductor device.
Figure 4B:
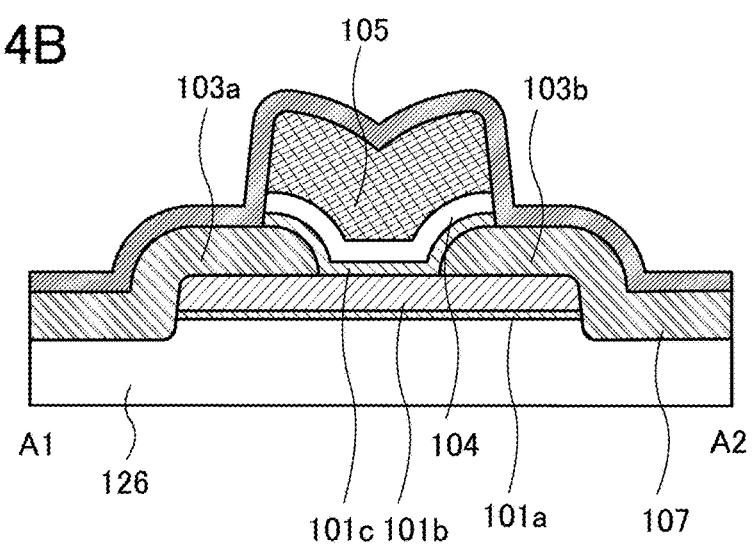
Figure 4C:
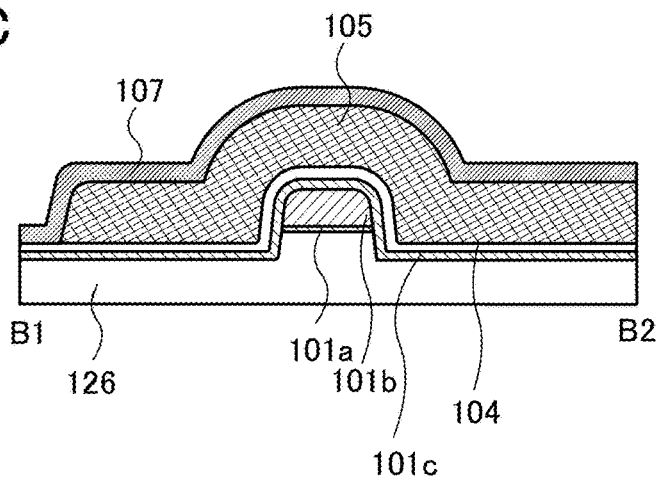

An example of a structure of a transistor which can be used as the second transistor 100 is described. FIG. 4A is a schematic top view of a transistor described below as an example, and FIGS. 4B and 4C are schematic cross-sectional views taken along section lines A1-A2 and B1-B2, respectively, in FIG. 4A. Note that FIG. 4B corresponds to a cross section of the transistor in a channel length direction, and FIG. 4C corresponds to a cross section of the transistor in a channel width direction.

As illustrated in FIG. 4C, the gate electrode is provided so as to face top and side surfaces of the oxide semiconductor film 101b in the cross section of the transistor in the channel width direction. Thus, a channel is formed not only in the vicinity of the top surface but also in the vicinity of the side surface of the oxide semiconductor film 101b, and the effective channel width is increased. Accordingly, current in an on state (on-state current) can be increased. In the case where the width of the oxide semiconductor film 101b is particularly very small (e.g., 50 nm or less, preferably 30 nm or less, more preferably 20 nm or less), a region where the channel is formed expands to an inner portion of the oxide semiconductor film 101b. Thus, as miniaturization advances, contribution of this structure to on-state current increases.

Figure 5A:
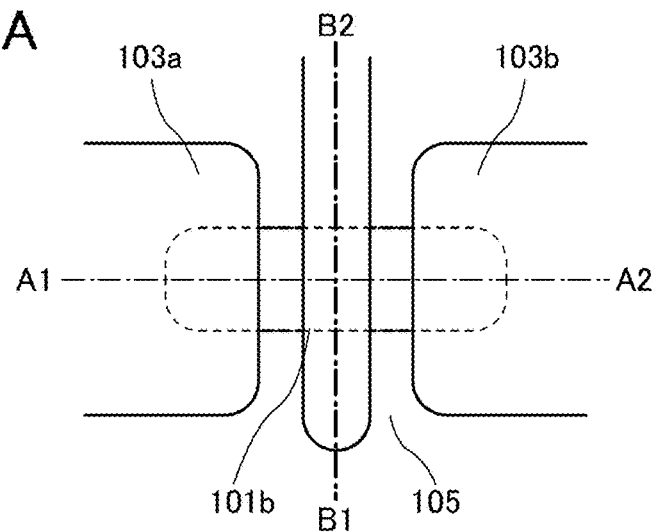
FIGS. 5A to 5C illustrate a structure example of a semiconductor device.
Figure 5B:
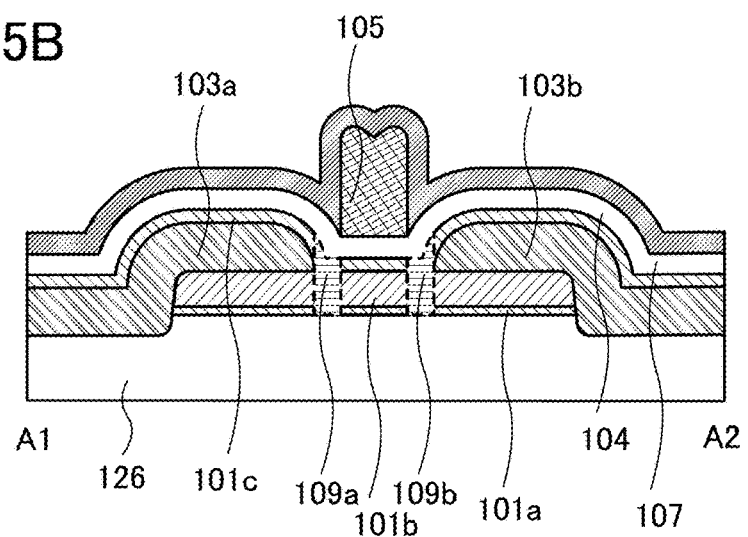
Figure 5C:
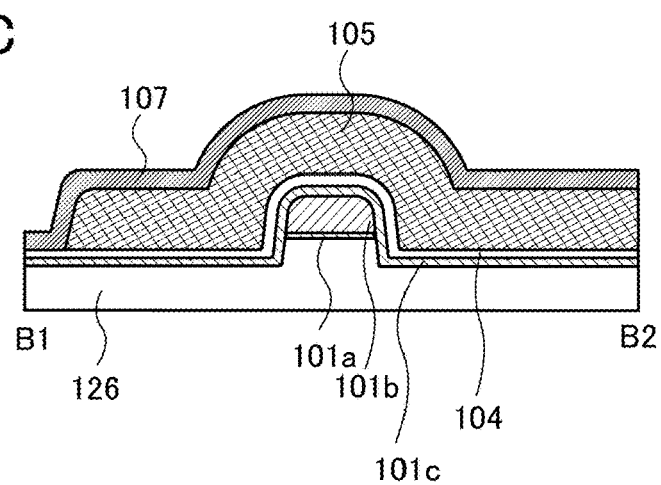

Note that the width of the gate electrode 105 may be made small as illustrated in FIGS. 5A to 5C. In that case, an impurity such as argon, hydrogen, phosphorus, or boron can be introduced into the oxide semiconductor film 101b or the like using the pair of electrodes 103a and 103b, the gate electrode 105, and the like as a mask, for example. As a result, low-resistance regions 109a and 109b can be provided in the oxide semiconductor film 101b or the like. Note that the low-resistance regions 109a and 109b are not necessarily provided. Note that the width of the gate electrode 105 can be made small not only in FIGS. 5A to 5C but also in other diagrams.

Figure 6A:
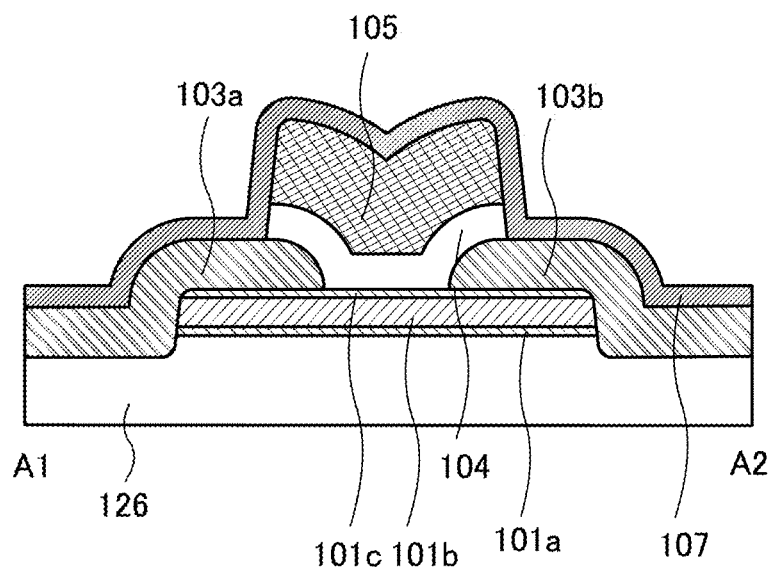
FIGS. 6A and 6B illustrate a structure example of a semiconductor device.
Figure 6B:
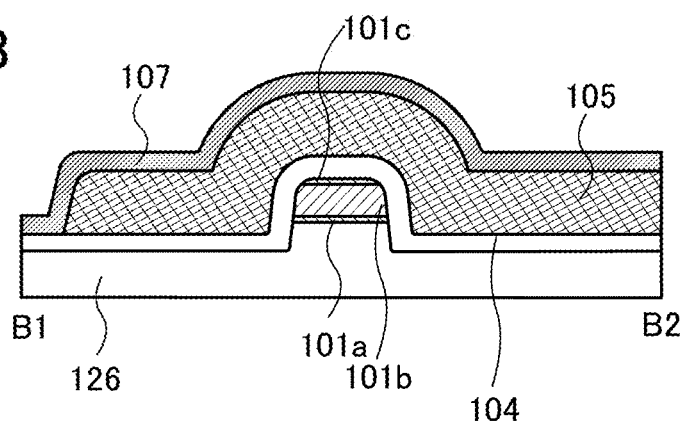

A transistor illustrated in FIGS. 6A and 6B differs from the transistor illustrated in FIGS. 4A to 4C mainly in that the oxide semiconductor film 101c is provided in contact with bottom surfaces of the electrodes 103a and 103b.

Such a structure enables films used for the oxide semiconductor films 101a, 101b, and 101c to be formed successively without contact with the air and therefore can reduce defects at each interface.

Although the oxide semiconductor film 101a and the oxide semiconductor film 101c are provided in contact with the oxide semiconductor film 101b in the above-described structure, only one of the oxide semiconductor films 101a and 101c or neither of them may be provided.

Figure 7A:
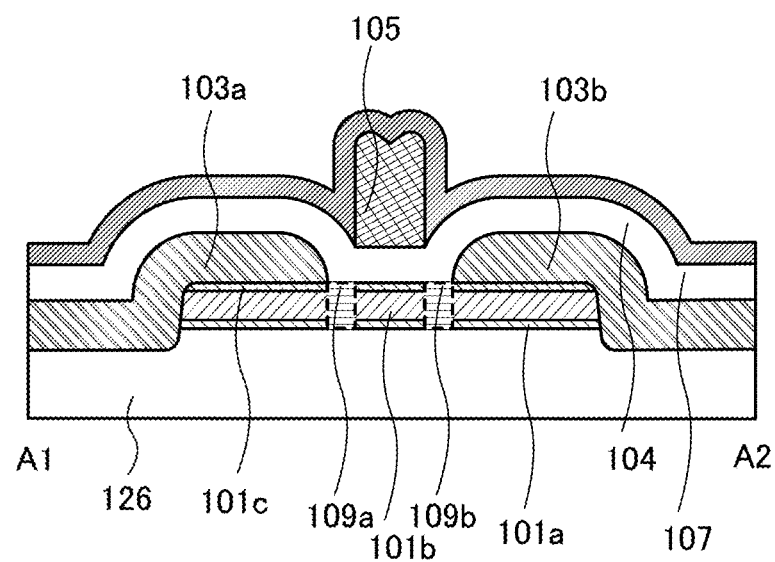
FIGS. 7A and 7B illustrate a structure example of a semiconductor device.
Figure 7B:
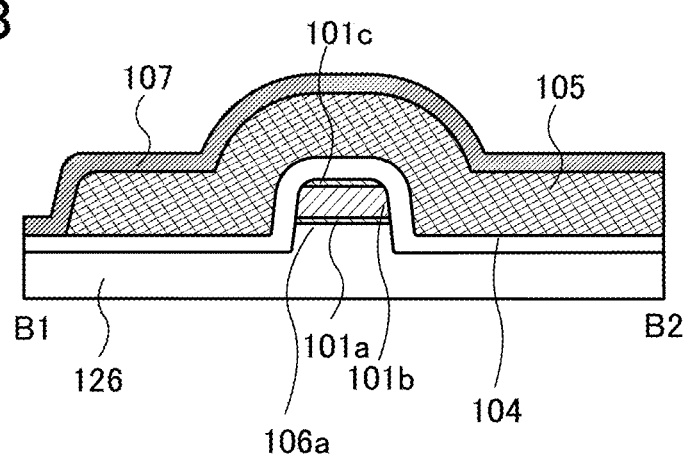

Note that the width of the gate electrode 105 can be made small in FIGS. 6A and 6B as well as in FIGS. 5A to 5C. An example in that case is illustrated in FIGS. 7A and 7B. Note that the width of the gate electrode 105 can be made small not only in FIGS. 5A to 5C and FIGS. 7A and 7B but also in other diagrams.

Figure 8A:
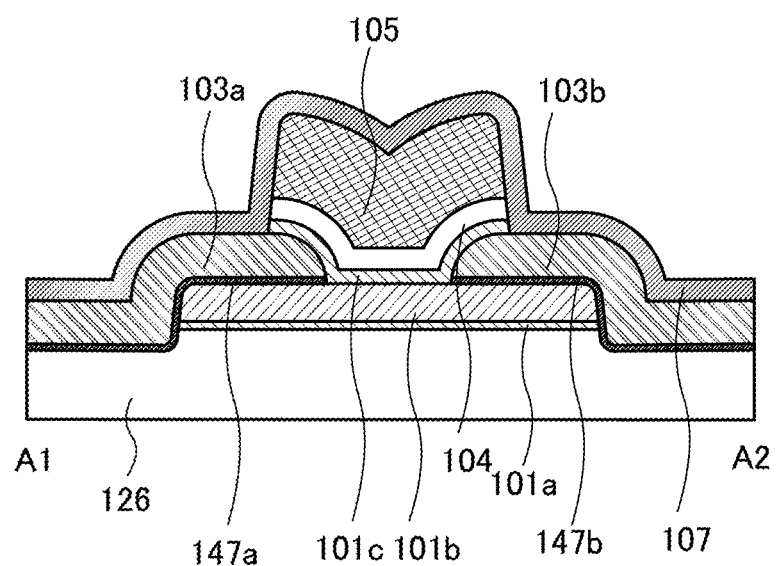
FIGS. 8A and 8B illustrate a structure example of a semiconductor device.
Figure 8B:
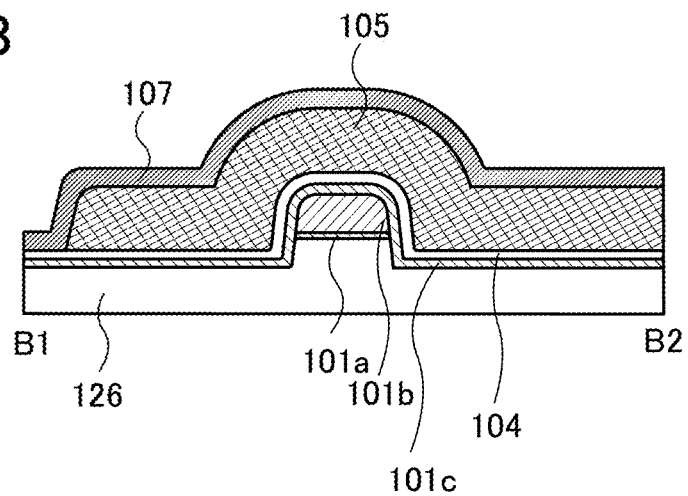

As illustrated in FIGS. 8A and 8B, it is possible to provide a layer 147a between and in contact with the oxide semiconductor film 101b and the electrode 103a and a layer 147b between and in contact with the oxide semiconductor film 101b and the electrode 103b.

The layers 147a and 147b may be formed using a transparent conductor, an oxide semiconductor, a nitride semiconductor, or an oxynitride semiconductor, for example. The layers 147a and 147b may be formed using, for example, a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, or a layer containing titanium and niobium. Alternatively, any of these layers may contain hydrogen, carbon, nitrogen, silicon, germanium, or argon.

The layers 147a and 147b may have a property of transmitting visible light. Alternatively, the layers 147a and 147b may have a property of not transmitting visible light, ultraviolet light, infrared light, or X-rays by reflecting or absorbing it. In some cases, such a property can suppress a change in electrical characteristics of the transistor due to stray light.

The layers 147a and 147b may preferably be formed using a layer which does not form a Schottky barrier with the oxide semiconductor film 101b or the like. Accordingly, on-state characteristics of the transistor can be improved.

Note that the layers 147a and 147b may preferably be formed using a layer having a resistance higher than that of the pair of electrodes 103a and 103b. The layers 147a and 147b may preferably be formed using a layer having a resistance lower than that of the channel of the transistor. For example, the layers 147a and 147b may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The layers 147a and 147b having a resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the layers 147a and 147b (e.g., the layer on the drain side) may preferably be provided.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the width of a source or a drain in a region where a semiconductor (or a portion where a current flows in a semiconductor when a transistor is on) and a gate electrode overlap with each other or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

The above is the description of the second transistor 100.

The insulating film 127 covering the second transistor 100 functions as a planarization film which covers an uneven surface shape of an underlying layer. The insulating film 108 may function as a protective film when the insulating film 127 is formed. The insulating film 108 is not necessarily provided.

The semiconductor device of one embodiment of the present invention includes the first transistor 110 and the second transistor 100 over the first transistor. Since these transistors are stacked, the area occupied by the elements can be decreased. Furthermore, the barrier film 120 provided between the first transistor 110 and the second transistor 100 can suppress diffusion of impurities such as water and hydrogen from an underlying layer to the second transistor 100 side.

The above is the description of a structural example.

[Example of Manufacturing Method]

An example of a method for manufacturing the semiconductor device described in the above structural example is described below with reference to FIGS. 9A to 9D, FIGS. 10A to 10C, FIGS. 11A and 11B, and FIG. 12.

First, the semiconductor substrate 111 is prepared. As the semiconductor substrate 111, a single crystal silicon substrate (including a p-type semiconductor substrate or an n-type semiconductor substrate), or a compound semiconductor substrate containing silicon carbide or gallium nitride can be used, for example. An SOI substrate may be used as the semiconductor substrate 111. The case where single crystal silicon is used for the semiconductor substrate 111 is described below.

Next, an element isolation layer (not illustrated) is formed in the semiconductor substrate 111. The element isolation layer may be formed by a local oxidation of silicon (LOCOS) method, a shallow trench isolation (STI) method, or the like.

In the case where a p-channel transistor and an n-channel transistor are formed on the same substrate, an n-well or a p-well may be formed in part of the semiconductor substrate 111. For example, a p-well may be formed by adding an impurity element imparting p-type conductivity, such as boron, to an n-type semiconductor substrate 111, and an n-channel transistor and a p-channel transistor may be formed on the same substrate.

Next, an insulating film to be the gate insulating film 114 is formed over the semiconductor substrate 111. For example, after surface nitriding treatment, oxidizing treatment may be performed to oxidize the interface between silicon and silicon nitride, whereby a silicon oxynitride film may be formed. For example, a silicon oxynitride film can be obtained by performing oxygen radical oxidation after a thermal silicon nitride film is formed on the surface at 700° C. in an $NH_3$ atmosphere.

The insulating film may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like.

Then, a conductive film to be the gate electrode 115 is formed. It is preferable that the conductive film be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Still alternatively, a stacked-layer structure including a film of metal nitride and a film of any of the above metals may be used. As the metal nitride, tungsten nitride, molybdenum nitride, or titanium nitride can be used. When the metal nitride film is provided, adhesiveness of the metal film can be increased; thus, separation can be prevented. A metal film which controls the work function of the gate electrode 115 may be provided.

The conductive film can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage.

Next, a resist mask is formed over the conductive film by a lithography process or the like and unnecessary portions of the conductive film are removed. Then, the resist mask is removed. Thus, the gate electrode 115 can be formed.

Here, a method for processing a film is described. In the case of finely processing a film, a variety of fine processing techniques can be used. For example, a method may be used in which a resist mask formed by a lithography process or the like is subjected to slimming treatment. Alternatively, a method may be used in which a dummy pattern is formed by a lithography process or the like, the dummy pattern is provided with a sidewall and is then removed, and a film is etched using the remaining sidewall as a mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely fine processing can be performed. Note that in the case of performing exposure by scanning of a beam such as an electron beam, a photomask is not needed.

An organic resin film having a function of improving adhesion between a film to be processed and a resist film may be formed before the resist film serving as a resist mask is formed. The organic resin film can be formed to planarize a surface by covering a step under the film by a spin coating method or the like, and thus can reduce variation in thickness of the resist mask over the organic resin film. In the case of fine processing, in particular, a material serving as a film having a function of preventing reflection of light for the exposure is preferably used for the organic resin film. Examples of the organic resin film having such a function include a bottom anti-reflection coating (BARC) film. The organic resin film may be removed at the same time as the removal of the resist mask or after the removal of the resist mask.

After the gate electrode 115 is formed, a sidewall covering a side surface of the gate electrode 115 may be formed. The sidewall can be formed in such a manner that an insulating film thicker than the gate electrode 115 is formed and subjected to anisotropic etching so that only a portion of the insulating film on the side surface of the gate electrode 115 remains.

The insulating film to be the gate insulating film 114 is etched at the same time as the formation of the sidewall, whereby the gate insulating film 114 is formed under the gate electrode 115 and the sidewall. Alternatively, after the gate electrode 115 is formed, the gate insulating film 114 may be formed by etching the insulating film using the gate electrode 115 or a resist mask for forming the gate electrode 115 as an etching mask. Alternatively, the insulating film can be used as the gate insulating film 114 without being processed by etching.

Figure 9A:
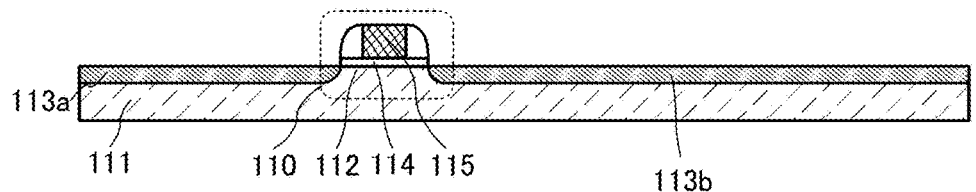
FIGS. 9A to 9D illustrate an example of a method for manufacturing a semiconductor device.

Next, an element which imparts n-type conductivity, such as phosphorus, or an element which imparts p-type conductivity, such as boron, is added to a region of the semiconductor substrate 111 where the gate electrode 115 (and the sidewall) is not provided. FIG. 9A is a schematic cross-sectional view at this stage.

Next, the insulating film 121 is formed, and then, first heat treatment is performed to activate the aforementioned element which imparts conductivity.

The insulating film 121 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulating film 121 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

The first heat treatment can be performed at a temperature higher than or equal to 400° C. and lower than the strain point of the substrate in an inert gas atmosphere such as a rare gas atmosphere or a nitrogen gas atmosphere or in a reduced-pressure atmosphere.

At this stage, the first transistor 110 is formed.

Next, the insulating film 122 and the insulating film 123 are formed.

The insulating film 122 can be formed using any of the materials that can be used for the insulating film 121, and is preferably formed using silicon nitride containing oxygen and hydrogen (SiNOH) because the amount of hydrogen released by heating can be increased. The insulating film 123 can be formed using any of the materials that can be used for the insulating film 121, and is preferably formed using silicon oxide with high step coverage which is formed by reacting tetraethyl orthosilicate (TEOS), silane, or the like with oxygen, nitrous oxide, or the like.

The insulating film 122 and the insulating film 123 can be formed by a sputtering method, a CVD method (including a thermal CVD method, an MOCVD method, a PECVD method, and the like), an MBE method, an ALD method, or a PLD method, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

Next, the top surface of the insulating film 123 is planarized by a CMP method or the like.

After that, second heat treatment is performed so that dangling bonds in the semiconductor film 112 are terminated by hydrogen released from the insulating film 122.

The second heat treatment can be performed under the conditions given as an example in the above description of the first heat treatment.

Then, the insulating film 124 is formed over the insulating film 123.

Figure 9B:
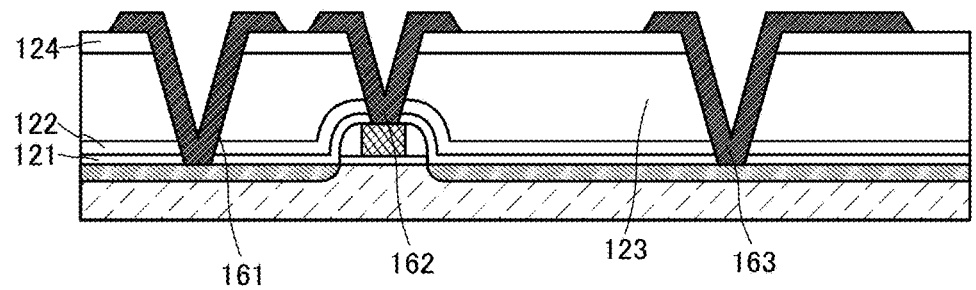
Figure 9C:
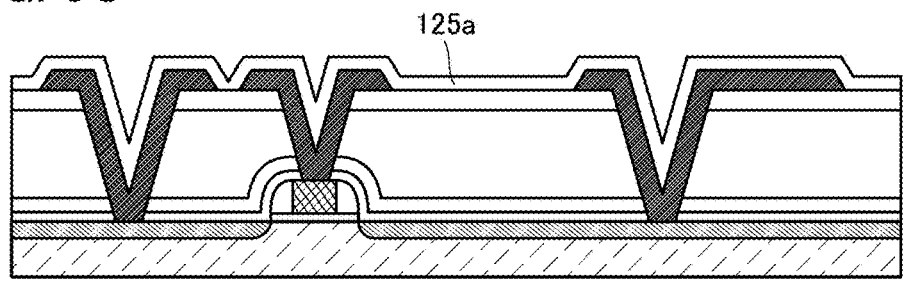

Next, openings are formed in the insulating films 121, 122, 123, and 124 so as to reach the low-resistance layers 113a and 113b, the gate electrode 115, and the like. After that, a conductive film is formed and etched, so that the conductive films 161 to 163 are formed. The conductive film can be formed by a sputtering method, a CVD method (including a thermal CVD method, an MOCVD method, a PECVD method, and the like), an MBE method, an ALD method, a PLD method, or the like. FIG. 9B illustrates a schematic cross-sectional view at this stage.

Next, the insulating film 125a is formed over the insulating film 124, the conductive film 161, the conductive film 162, and the conductive film 163. Since the insulating film 125a is in contact with the conductive films 161 to 163, a deposition method in which the conductive films 161 to 163 are not oxidized in deposition is employed (see FIG. 9C). For example, the insulating film 125a can be formed by a sputtering method, a CVD method (including a thermal CVD method, an MOCVD, a PECVD method, and the like), an MBE method, an ALD method, a PLD method, or the like so that the conductive films 161 to 163 are not oxidized.

Figure 9D:
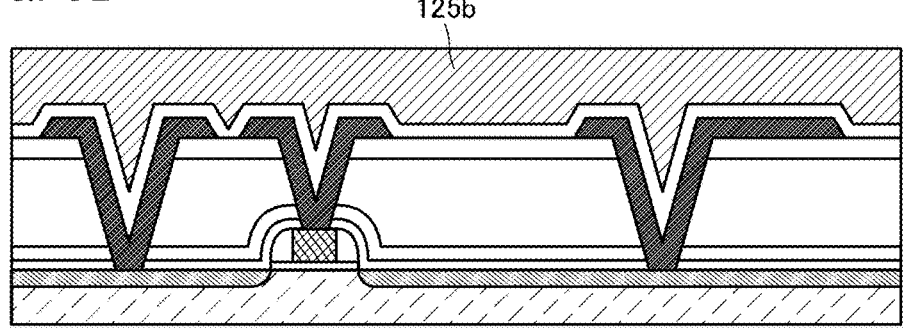

Then, the insulating film 125b is formed over the insulating film 125a (see FIG. 9D). The insulating film 125b is preferably formed by an atmospheric pressure CVD method with high embeddability. High embeddability can reduce the size of seams generated in an depressed portion or suppress generation of seams even when a surface of the insulating film 125a is not uniform. The deposition rate of the insulating film 125b is preferably greater than or equal to 100 nm/min and less than or equal to 200 nm/min.

After the insulating film 125b is formed, third heat treatment is preferably performed. By the third heat treatment, water and hydrogen are released from each layer; thus, the contents of water and hydrogen can be reduced. In the case where the third heat treatment is performed shortly before formation of the barrier film 120 to be described later to thoroughly remove hydrogen and water from layers under the barrier film 120 and then the barrier film 120 is formed, it is possible to suppress diffusion and release of water and hydrogen to the side under the barrier film 120 in a later step.

The third heat treatment can be performed under the conditions given as an example in the above description of the first heat treatment.

Figure 10A:
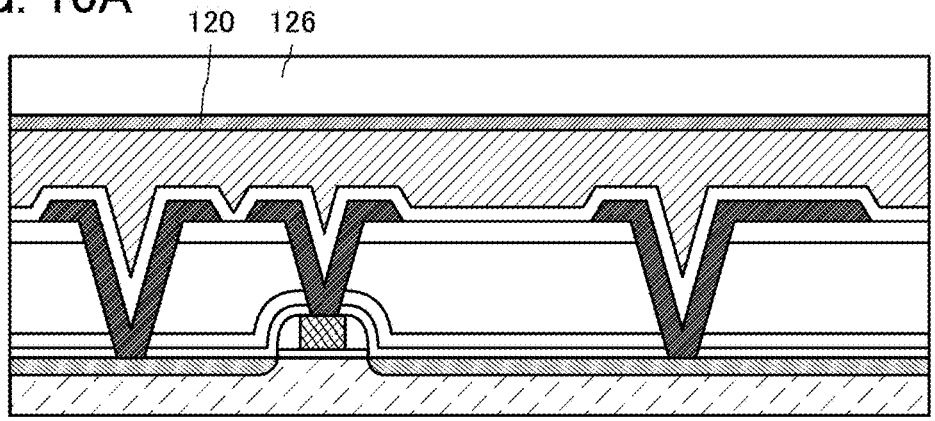
FIGS. 10A to 10C illustrate an example of a method for manufacturing a semiconductor device.
Figure 10B:
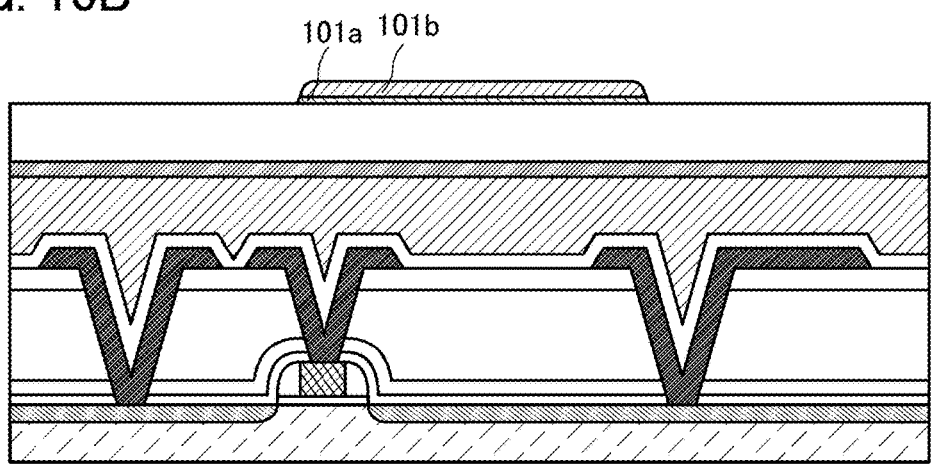
Figure 10C:
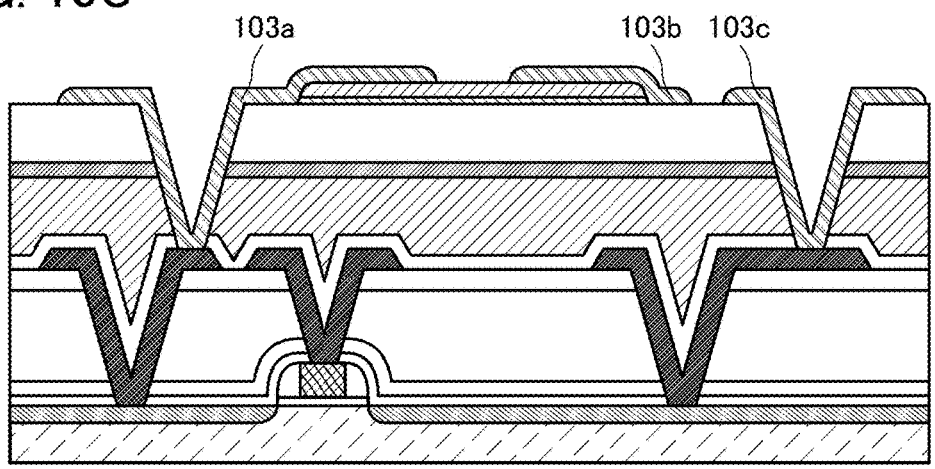

Next, the barrier film 120 is formed over the insulating film 125b (see FIG. 10A).

The barrier film 120 can be formed by a sputtering method, a CVD method (including a thermal CVD method, an MOCVD method, a PECVD method, and the like), an MBE method, an ALD method, or a PLD method, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

After the barrier film 120 is formed, heat treatment may be performed to reduce water and hydrogen contained in the barrier film 120 or suppress release of a gas.

The insulating film 126 is formed over the barrier film 120. The insulating film 126 can be formed by, for example, a sputtering method, a CVD method (including a thermal CVD method, an MOCVD method, a PECVD method, and the like), an MBE method, an ALD method, or a PLD method. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

In order to make the insulating film 126 contain excess oxygen, the insulating film 126 may be formed in an oxygen atmosphere, for example. Alternatively, a region containing excess oxygen may be formed by introducing oxygen into the insulating film 126 that has been formed. Both the methods may be combined.

For example, oxygen (at least including any of oxygen radicals, oxygen atoms, and oxygen ions) is introduced into the insulating film 126 which has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introduction treatment. As the gas containing oxygen, oxygen, dinitrogen monoxide, nitrogen dioxide, carbon dioxide, carbon monoxide, and the like can be used. A rare gas may be included in the gas containing oxygen for the oxygen introduction treatment. For example, a mixed gas of carbon dioxide, hydrogen, and argon can be used.

Next, an oxide semiconductor film to be the oxide semiconductor film 101a and an oxide semiconductor film to be the oxide semiconductor film 101b are formed sequentially. The oxide semiconductor films are preferably formed successively without contact with the air.

After an oxide semiconductor film to be the oxide semiconductor film 101b is formed, fourth heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidizing gas at 10 ppm or more, in order to compensate for released oxygen. The heat treatment may be performed directly after the formation of an oxide semiconductor film to be the oxide semiconductor film 101b or may be performed after an oxide semiconductor film to be the oxide semiconductor film 101b is processed into the island-shaped oxide semiconductor film 101b. Through the heat treatment, oxygen can be supplied to the oxide semiconductor film from the insulating film 126; thus, oxygen vacancies in the semiconductor film can be reduced.

Next, a conductive film to be a hard mask is formed over the oxide semiconductor film to be the oxide semiconductor film 101b. The conductive film can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage.

Next, the conductive film is used as a hard mask. A resist mask is formed over the conductive film, and an unnecessary portion of the conductive film is removed. After that, an unnecessary portion of the oxide semiconductor film is removed by etching using the conductive film as a mask. Then, the resist mask and the conductive film used as the hard mask are removed. In this manner, a stacked-layer structure including the island-shaped conductive film 101a and the island-shaped oxide semiconductor film 101b can be formed (see FIG. 10B).

Next, openings are formed in the insulating film 126, the barrier film 120, and the interlayer insulating film 125 so as to reach the conductive films 161 and 163. A conductive film is formed over the oxide semiconductor film 101b and the insulating film 126 and in the openings. By etching the conductive film, the pair of electrodes 103a and 103b functioning as a source electrode and a drain electrode and the electrode 103c are formed (see FIG. 10C).

Figure 11A:
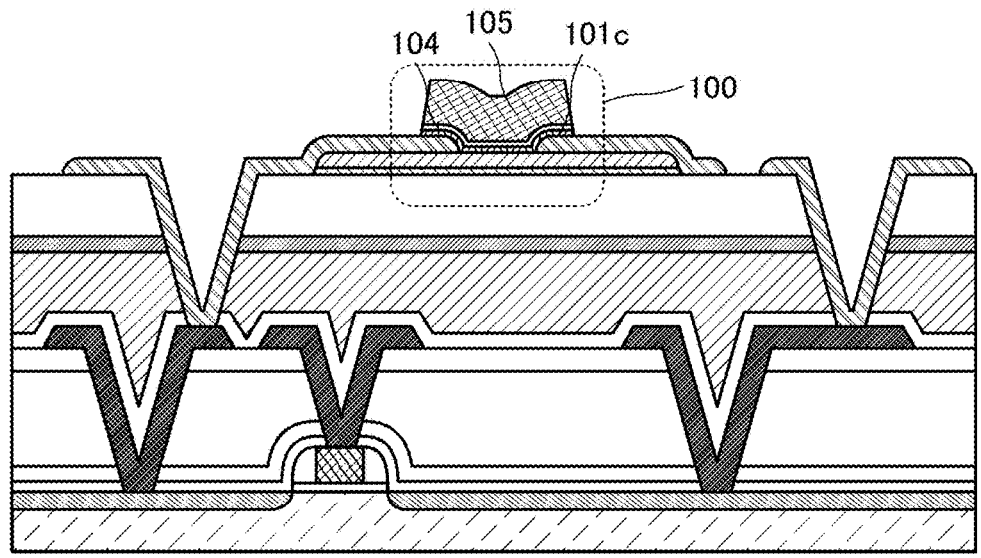
FIGS. 11A and 11B illustrate an example of a method for manufacturing a semiconductor device.

Next, the oxide semiconductor film 101c, the gate insulating film 104, and the gate electrode 105 are formed (see FIG. 11A).

At this stage, the second transistor 100 is formed.

Next, the insulating film 107 is formed. The insulating film 107 can be formed by a sputtering method, a CVD method (including a thermal CVD method, an MOCVD method, a PECVD method, and the like), an MBE method, an ALD method, or a PLD method, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

After the insulating film 107 is formed, fifth heat treatment is preferably performed. Through the heat treatment, oxygen can be supplied to the oxide semiconductor film 101b from the insulating film 126 or the like; thus, oxygen vacancies in the oxide semiconductor film 101b can be reduced. At this time, oxygen released from the insulating film 126 is blocked by the barrier film 120 and the insulating film 107 and does not diffuse into a layer under the barrier film 120 and a layer over the insulating film 107; therefore, oxygen can be effectively confined. Thus, the amount of oxygen supplied to the oxide semiconductor film 101b can be increased, so that oxygen vacancies in the oxide semiconductor film 101b can be effectively reduced.

Figure 11B:
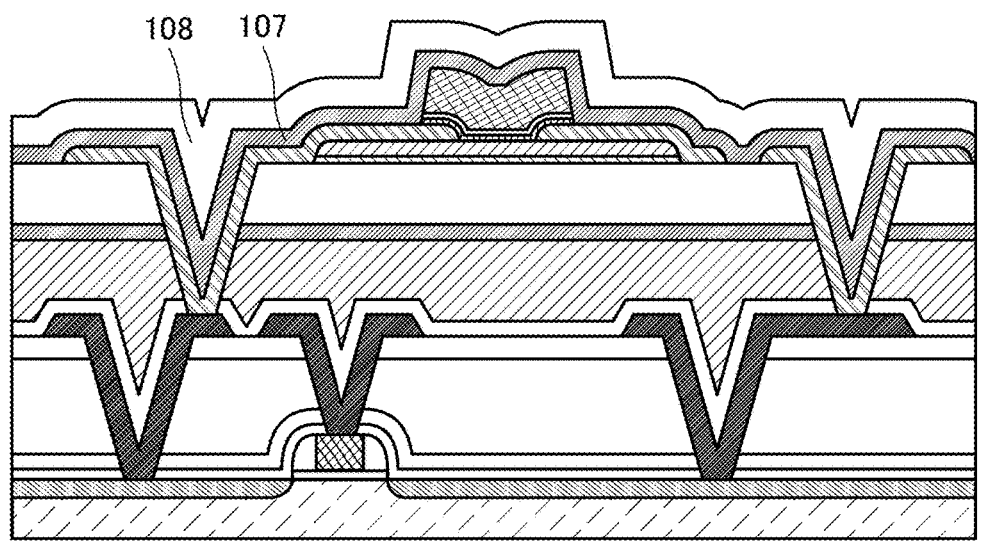

Next, the insulating film 108 is formed (see FIG. 11B). The insulating film 108 can be formed by a sputtering method, a CVD method (including a thermal CVD method, an MOCVD method, a PECVD method, an atmospheric pressure CVD (APCVD) method, and the like), an MBE method, an ALD method, or a PLD method, for example. In particular, it is preferable that the insulating film 108 be formed by a DC sputtering method, in which case a film with a high barrier property can be formed thick with high productivity. It is also preferable that the insulating film 108 be formed by an ALD method because coverage can be favorable.

Figure 12:
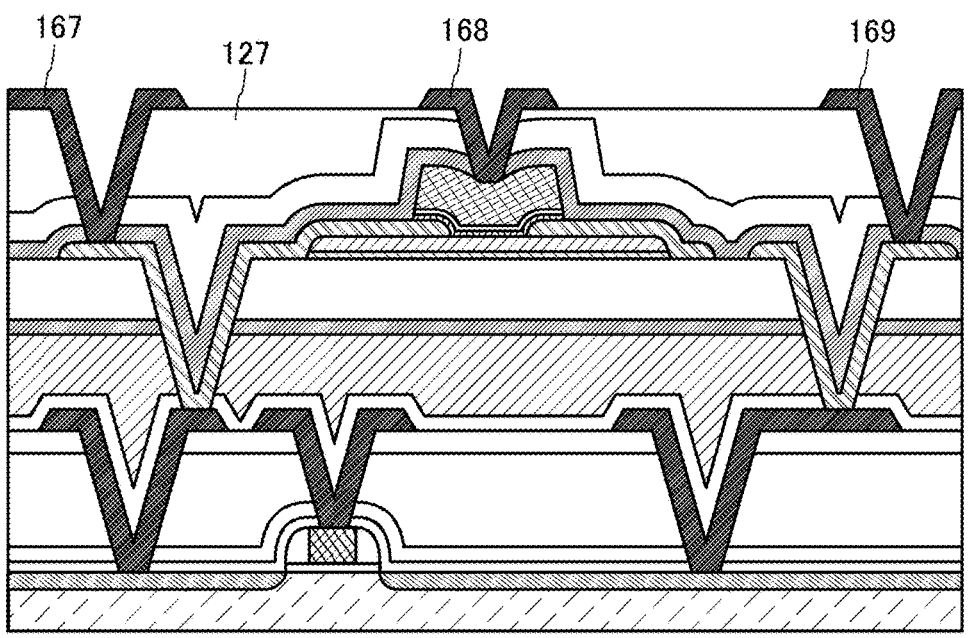
FIG. 12 illustrates an example of a method for manufacturing a semiconductor device.

Next, the insulating film 127 is formed, openings are formed in the insulating films 127, 108, and 107 so as to reach the electrodes 103a and 103c, and a conductive film is formed over the insulating film 127 and in the openings and etched, so that the conductive films 167 to 169 are formed (see FIG. 12).

After the insulating film 127 is formed, a top surface thereof is preferably subjected to planarization treatment. In order to achieve higher planarity, after the insulating film 127 is formed, it is preferable that an insulating film be stacked by a CVD method and a top surface thereof be subjected to planarization treatment.

Through the above steps, the semiconductor device of one embodiment of the present invention can be manufactured.

In Embodiment 1, one embodiment of the present invention has been described. Other embodiments of the present invention are described in Embodiments 2 to 8. Note that one embodiment of the present invention is not limited thereto. For example, the example in which another transistor is provided over a transistor is described as one embodiment of the present invention; however, one embodiment of the present invention is not limited thereto. Depending on circumstances or conditions, the provided transistor is not necessarily provided over the transistor in one embodiment of the present invention.

Note that the structures, methods, and the like described in this embodiment can be used as appropriate in combination with any of the structures, methods, and the like described in the other embodiments and examples.

(Embodiment 2)

In this embodiment, one embodiment which can be applied to an oxide semiconductor film in the transistor included in the semiconductor device described in the above embodiment is described.

An oxide semiconductor film is classified into a single crystal oxide semiconductor film and a non-single-crystal oxide semiconductor film. Examples of a non-single-crystal oxide semiconductor film include a c-axis aligned crystalline oxide semiconductor (CAAC-OS) film, a polycrystalline oxide semiconductor film, a microcrystalline oxide semiconductor film, and an amorphous oxide semiconductor film.

From another perspective, an oxide semiconductor film is classified into an amorphous oxide semiconductor film and a crystalline oxide semiconductor film. Examples of a crystalline oxide semiconductor film include a single crystal oxide semiconductor film, a CAAC-OS film, a polycrystalline oxide semiconductor film, and a microcrystalline oxide semiconductor film.

<CAAC-OS Film>

First, a CAAC-OS film is described. Note that a CAAC-OS film can also be referred to as an oxide semiconductor film including c-axis aligned nanocrystals (CANC).

A CAAC-OS film is one of oxide semiconductor films having a plurality of c-axis aligned crystal parts (also referred to as nanocrystal (nc)).

In a combined analysis image (also referred to as a high-resolution TEM image) of a bright-field image and a diffraction pattern of a CAAC-OS film, which is obtained using a transmission electron microscope (TEM), a plurality of nanocrystals can be observed. However, in the high-resolution TEM image, a boundary between nanocrystals, that is, a grain boundary is not clearly observed. Thus, in the CAAC-OS film, a reduction in electron mobility due to the grain boundary is less likely to occur.

Figure 13A:
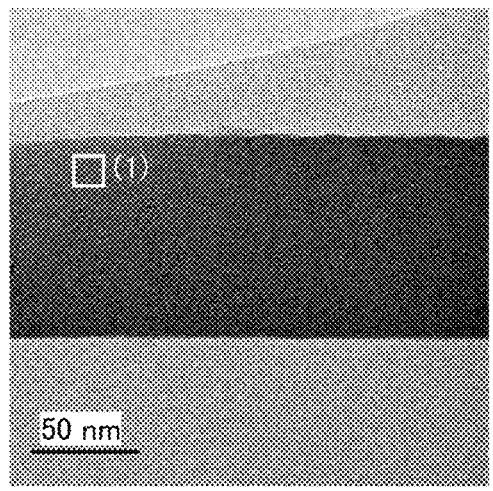
FIGS. 13A to 13D are Cs-corrected high-resolution TEM images of a cross section of a CAAC-OS film and a cross-sectional schematic view of a CAAC-OS film.

A CAAC-OS film observed with TEM is described below. FIG. 13A shows a high-resolution TEM image of a cross section of the CAAC-OS film which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 13B:
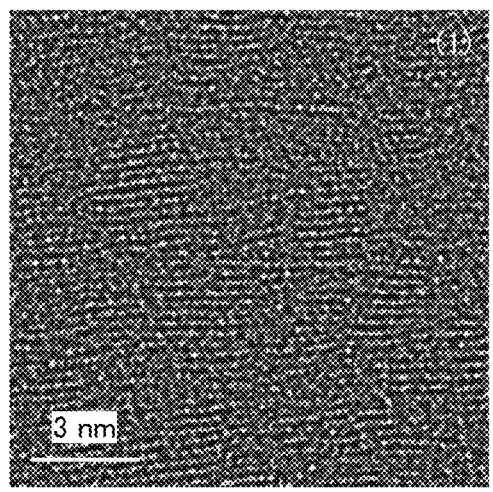

FIG. 13B is an enlarged Cs-corrected high-resolution TEM image of a region (1) in FIG. 13A. FIG. 13B shows that metal atoms are arranged in a layered manner in a nanocrystal. Each metal atom layer has a configuration reflecting unevenness of a surface over which the CAAC-OS film is formed (hereinafter, the surface is referred to as a formation surface) or a top surface of the CAAC-OS film, and is arranged parallel to the formation surface or the top surface of the CAAC-OS film.

Figure 13C:
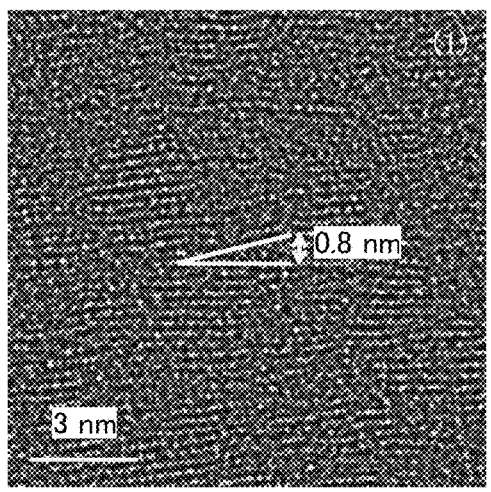

As shown in FIG. 13B, the CAAC-OS film has a characteristic atomic arrangement. The characteristic atomic arrangement is denoted by an auxiliary line in FIG. 13C. FIGS. 13B and 13C prove that the size of a nanocrystal is approximately 1 nm to 3 nm, and the size of a space caused by tilt of the nanocrystals is approximately 0.8 nm.

Figure 13D:
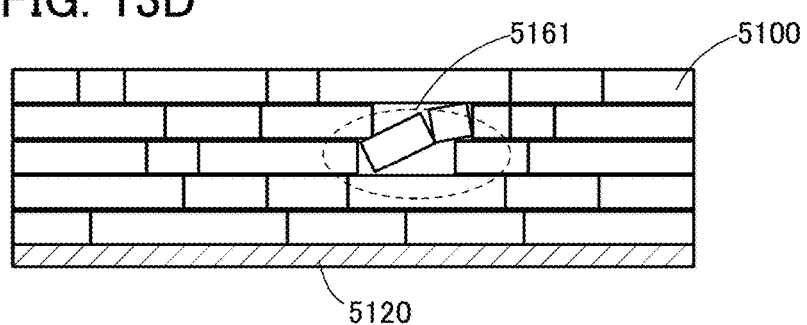

Here, according to the Cs-corrected high-resolution TEM images, the schematic arrangement of nanocrystals 5100 of a CAAC-OS film over a substrate 5120 is illustrated by such a structure in which bricks or blocks are stacked (see FIG. 13D). The part in which the nanocrystals are tilted as observed in FIG. 13C corresponds to a region 5161 shown in FIG. 13D.

FIG. 14A shows a Cs-corrected high-resolution TEM image of a plane of the CAAC-OS film which is observed from a direction substantially perpendicular to the sample surface. FIGS. 14B, 14C, and 14D are enlarged Cs-corrected high-resolution TEM images of regions (1), (2), and (3) in FIG. 14A, respectively. FIGS. 14B, 14C, and 14D indicate that metal atoms are arranged in a triangular, quadrangular, or hexagonal configuration in a nanocrystal. However, there is no regularity of arrangement of metal atoms between different nanocrystals.

Figure 15A:
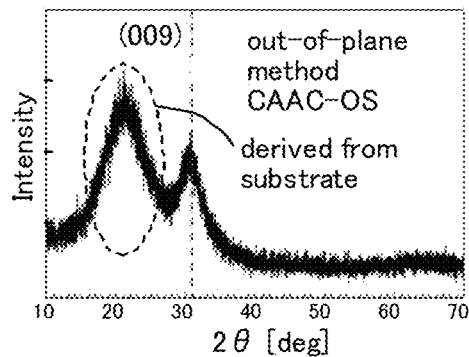
FIGS. 15A to 15C show structural analyses of a CAAC-OS film and a single crystal oxide semiconductor film by XRD.

Next, the CAAC-OS film analyzed by X-ray diffraction (XRD) is described. For example, when the structure of a CAAC-OS film including an InGaZnO$_4$ crystal is analyzed by an out-of-plane method, a peak appears at a diffraction angle (2θ) of around 31° as shown in FIG. 15A. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that in structural analysis of the CAAC-OS film by an out-of-plane method, another peak may appear when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film analyzed by an out-of-plane method, a peak appear when 2θ is around 31° and that a peak not appear when 2θ is around 36°.

Figure 15B:
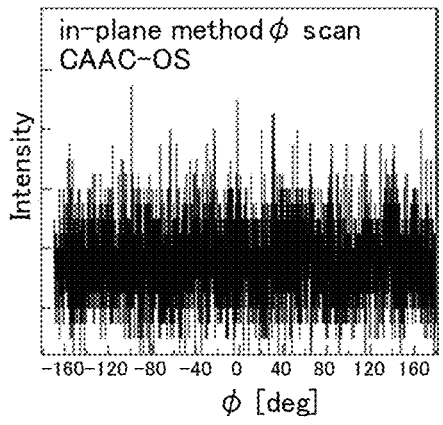
Figure 15C:
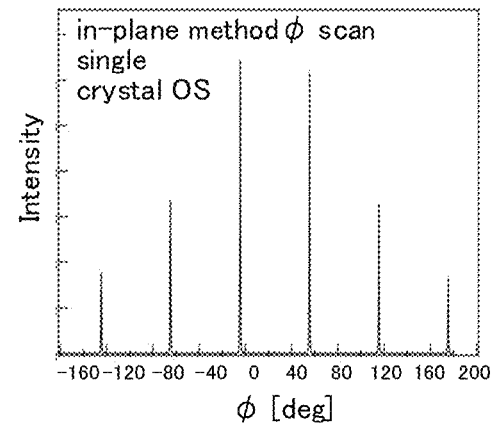

On the other hand, in structural analysis of the CAAC-OS film by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS film, when analysis (φ scan) is performed with 2θ fixed at around 56° and with the sample rotated using a normal vector of the sample surface as an axis (φ axis), as shown in FIG. 15B, a peak is not clearly observed. In contrast, in the case of a single crystal oxide semiconductor of InGaZnO$_4$, when φ scan is performed with 2θ fixed at around 56°, as shown in FIG. 15C, six peaks which are derived from crystal planes equivalent to the (110) plane are observed. Accordingly, the structural analysis using XRD shows that the directions of a-axes and b-axes are irregularly oriented in the CAAC-OS film.

Figure 16A:
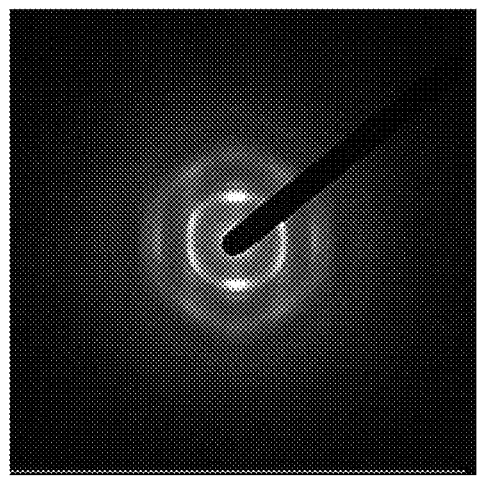
FIGS. 16A and 16B show electron diffraction patterns of a CAAC-OS film.
Figure 16B:
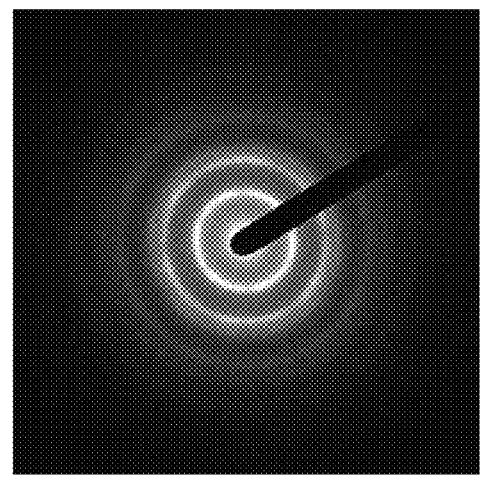

Next, the CAAC-OS film analyzed by electron diffraction is described. For example, when an electron beam with a probe diameter of 300 nm is incident on a CAAC-OS film including an InGaZnO$_4$ crystal in a direction parallel to the sample surface, a diffraction pattern (also referred to as a selected-area transmission electron diffraction pattern) shown in FIG. 16A can be obtained. In this diffraction pattern, spots derived from the (009) plane of an InGaZnO$_4$ crystal are included. Thus, the electron diffraction also indicates that nanocrystals included in the CAAC-OS film have c-axis alignment and that the c-axes are aligned in a direction substantially perpendicular to the formation surface or the top surface of the CAAC-OS film. Meanwhile, FIG. 16B shows a diffraction pattern obtained in such a manner that an electron beam with a probe diameter of 300 nm is incident on the same sample in a direction perpendicular to the sample surface. As shown in FIG. 16B, a ring-like diffraction pattern is observed. Thus, the electron diffraction also indicates that the a-axes and b-axes of the nanocrystals included in the CAAC-OS film do not have regular alignment. The first ring in FIG. 16B is considered to be derived from the (010) plane, the (100) plane, and the like of the InGaZnO$_4$ crystal. The second ring in FIG. 16B is considered to be derived from the (110) plane and the like.

The CAAC-OS film is an oxide semiconductor film having a low density of defect states. Defects in the oxide semiconductor film are, for example, a defect due to impurity and oxygen vacancies. Therefore, the CAAC-OS film can be regarded as an oxide semiconductor film with a low impurity concentration, or an oxide semiconductor film having a small number of oxygen vacancies.

The impurity contained in the oxide semiconductor film might serve as carrier traps or serve as carrier generation sources. In addition, oxygen vacancies in the oxide semiconductor film might serve as carrier traps or serve as carrier generation sources when hydrogen is captured therein.

Note that the impurity means an element other than the main components of the oxide semiconductor film, such as hydrogen, carbon, silicon, or a transition metal element. For example, an element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. A heavy metal such as iron or nickel, argon, carbon dioxide, or the like has a large atomic radius (or molecular radius), and thus disturbs the atomic arrangement of the oxide semiconductor film and decreases crystallinity.

An oxide semiconductor film having a low density of defect states (a small number of oxygen vacancies) can have a low carrier density. Such an oxide semiconductor film is referred to as a highly purified intrinsic or substantially highly purified intrinsic oxide semiconductor film. A CAAC-OS film has a low impurity concentration and a low density of defect states. That is, a CAAC-OS film is likely to be highly purified intrinsic or substantially highly purified intrinsic oxide semiconductor film. Thus, a transistor including a CAAC-OS film rarely has negative threshold voltage (is rarely normally on). The highly purified intrinsic or substantially highly purified intrinsic oxide semiconductor film has few carrier traps. Electric charge trapped by the carrier traps in the oxide semiconductor film takes a long time to be released, and might behave like fixed electric charge. Thus, the transistor which includes the oxide semiconductor film having a high impurity concentration and a high density of defect states might have unstable electrical characteristics. However, a transistor including a CAAC-OS film has small variation in electrical characteristics and high reliability.

Since the CAAC-OS film has a low density of defect states, carriers generated by light irradiation are less likely to be trapped in defect states. Therefore, in a transistor using the CAAC-OS, change in electrical characteristics due to irradiation with visible light or ultraviolet light is small.

<Microcrystalline Oxide Semiconductor Film>

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including a nanocrystal is referred to as a nanocrystalline oxide semiconductor (nc-OS) film. In a high-resolution TEM image of the nc-OS film, for example, a grain boundary cannot be found clearly in some cases. Note that there is a possibility that the origin of the nanocrystal is the same as that of a nanocrystal in a CAAC-OS film. Therefore, a crystal part of the nc-OS film may be referred to as a nanocrystal in the following description.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different nanocrystals in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a nanocrystal, a peak that shows a crystal plane does not appear. Furthermore, a halo pattern is shown in a selected-area electron diffraction pattern of the nc-OS film obtained by using an electron beam having a probe diameter (e.g., larger than or equal to 50 nm) larger than the diameter of a nanocrystal. Meanwhile, spots are shown in a nanobeam electron diffraction pattern of the nc-OS film obtained by using an electron beam having a probe diameter close to or smaller than the diameter of a nanocrystal. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

Since there is no regularity of crystal orientation between the nanocrystals as mentioned above, the nc-OS film can also be referred to as an oxide semiconductor film including random aligned nanocrystals (RANC) or an oxide semiconductor film including non-aligned nanocrystals (NANC).

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different nanocrystals in the nc-OS film; thus, the nc-OS film has a higher density of defect states than the CAAC-OS film.

<Amorphous Oxide Semiconductor Film>

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a spot is not observed and only a halo pattern appears when the amorphous oxide semiconductor film is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor film to be called an amorphous oxide semiconductor film as long as even a negligible degree of ordering is present in an atomic arrangement. At least an oxide semiconductor film having long-term ordering cannot be called an amorphous oxide semiconductor film. Accordingly, because of the presence of crystal part, for example, a CAAC-OS film and an nc-OS film cannot be called an amorphous oxide semiconductor film or a completely amorphous oxide semiconductor film.

<Amorphous-like Oxide Semiconductor Film>

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed.

An a-like OS film has an unstable structure because it includes a void. To verify that an a-like OS film has an unstable structure as compared with a CAAC-OS film and an nc-OS film, a change in structure caused by electron irradiation is described below.

An a-like OS film, an nc-OS film, and a CAAC-OS film are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that a crystal part is determined as follows. It is known that a unit cell of the InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 17:
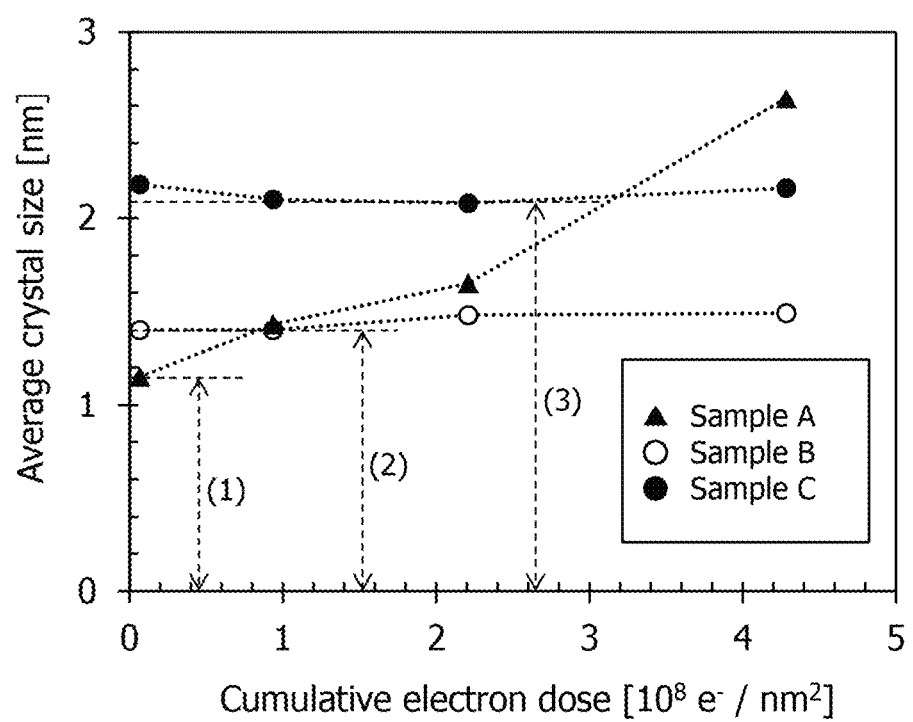
FIG. 17 shows a change of crystal parts of an In—Ga—Zn oxide owing to electron irradiation.

FIG. 17 shows change in the average size of crystal parts (at 22 points to 45 points) in each sample. Note that the crystal part size corresponds to the length of a lattice fringe. FIG. 17 indicates that the crystal part size in the a-like OS film increases with an increase in the cumulative electron dose. Specifically, as shown by (1) in FIG. 17, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS film and the CAAC-OS film shows little change from the start of electron irradiation to a cumulative electron dose of $4.2 \times 10^8$ e$^-$/nm$^2$. Specifically, as shown by (2) and (3) in FIG. 17, the average crystal sizes in an nc-OS film and a CAAC-OS film are approximately 1.4 nm and approximately 2.1 nm, respectively, regardless of the cumulative electron dose.

In this manner, growth of the crystal part in the a-like OS film is induced by electron irradiation. In contrast, in the nc-OS film and the CAAC-OS film, growth of the crystal part is hardly induced by electron irradiation. Therefore, the a-like OS film has an unstable structure as compared with the nc-OS film and the CAAC-OS film.

The a-like OS film has a lower density than the nc-OS film and the CAAC-OS film because it includes a void. Specifically, the density of the a-like OS film is higher than or equal to 78.6% and lower than 92.3% of the density of the single crystal oxide semiconductor film having the same composition. The density of each of the nc-OS film and the CAAC-OS film is higher than or equal to 92.3% and lower than 100% of the density of the single crystal oxide semiconductor film having the same composition. Note that it is difficult to deposit an oxide semiconductor film having a density of lower than 78% of the density of the single crystal oxide semiconductor film.

For example, in the case of an oxide semiconductor film having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor film having an atomic ratio of In:Ga:Zn=1:1:1, the density of the a-like OS film is higher than or equal to 5.0 g/cm$^3$ and lower than 5.9 g/cm$^3$. For example, in the case of the oxide semiconductor film having an atomic ratio of In:Ga:Zn=1:1:1, the density of each of the nc-OS film and the CAAC-OS film is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductor films have various structures and various properties. Note that an oxide semiconductor film may be a stacked film including two or more films of an amorphous oxide semiconductor film, an a-like OS film, a microcrystalline oxide semiconductor film, and a CAAC-OS film, for example.

The structures, methods, and the like described in this embodiment can be used as appropriate in combination with any of the structures, methods, and the like described in the other embodiments and examples.

(Embodiment 3)

In this embodiment, a structural example of a semiconductor device including the transistor of one embodiment of the present invention will be described with reference to drawings.

[Cross-sectional Structure]

FIG. 18A is a cross-sectional view of a semiconductor device of one embodiment of the present invention. The semiconductor device illustrated in FIG. 18A includes a transistor 2200 containing a first semiconductor material in a lower portion and a transistor 2100 containing a second semiconductor material in an upper portion. As the transistor 2100, any of the transistors described in the above embodiments can be used, and in FIG. 18A, an example in which the transistor 100 in the above embodiment is used as the transistor 2100 is shown. A cross-sectional view of the transistors in the channel length direction is on the left side of a dashed-dotted line, and a cross-sectional view of the transistors in the channel width direction is on the right side of the dashed-dotted line.

Note that the transistor 2100 may be provided with a back gate.

The first and second semiconductor materials preferably have different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor including an oxide semiconductor has a low off-state current.

The transistor 2200 may be either an n-channel transistor or a p-channel transistor; an appropriate transistor is used depending on a circuit. Furthermore, the specific structure of the semiconductor device, such as the material or the structure used for the semiconductor device, is not necessarily limited to those described here except for the use of the transistor of one embodiment of the present invention that includes an oxide semiconductor.

FIG. 18A illustrates a structure in which the transistor 2100 is provided over the transistor 2200 with an insulating film 2201 and an insulating film 2207 provided therebetween. A plurality of wirings 2202 are provided between the transistor 2200 and the transistor 2100. Furthermore, wirings and electrodes provided over and under the insulating films are electrically connected to each other through a plurality of conductive films 2203 embedded in the insulating films. An insulating film 2204 covering the transistor 2100, a wiring 2205 over the insulating film 2204, and a wiring 2206 formed by processing a conductive film that is also used for a pair of electrodes of the transistor 2100 are provided.

Since the two kinds of transistors are stacked, the area occupied by the circuit can be reduced, allowing a plurality of circuits to be arranged at high density Here, in the case where a silicon-based semiconductor material is used for the transistor 2200 provided in a lower portion, hydrogen in an insulating film provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating film provided in the vicinity of the semiconductor film of the transistor 2100 becomes a factor of generating carriers in the oxide semiconductor; thus, the reliability of the transistor 2100 might be decreased. Therefore, in the case where the transistor 2100 formed using an oxide semiconductor is provided over the transistor 2200 formed using a silicon-based semiconductor material, it is particularly effective that the insulating film 2207 having a function of preventing diffusion of hydrogen is provided between the transistors 2100 and 2200. The insulating film 2207 makes hydrogen remain in the lower portion, thereby improving the reliability of the transistor 2200. In addition, since the insulating film 2207 suppresses diffusion of hydrogen from the lower portion to the upper portion, the reliability of the transistor 2100 can also be improved.

The insulating film 2207 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

The insulating film 2201 is preferably the stacked-layer film of the insulating film 125a and the insulating film 125b described in the above embodiment. With the above stacked-layer film, the embeddability of the insulating film 2201 can be maintained and the plurality of wirings 2202 can be prevented from being oxidized.

Furthermore, a blocking film having a function of preventing entry of hydrogen may be formed over the transistor 2100 to cover the transistor 2100 including an oxide semiconductor film. For the blocking film, a material that is similar to that of the insulating film 2207 can be used, and in particular, aluminum oxide is preferably used. The aluminum oxide film has a high shielding (blocking) effect of preventing penetration of both oxygen and impurities such as hydrogen and moisture. Thus, by using the aluminum oxide film as the blocking film covering the transistor 2100, release of oxygen from the oxide semiconductor film included in the transistor 2100 and entry of water and hydrogen into the oxide semiconductor film can be prevented.

Note that the transistor 2200 can be any of transistors of various types without being limited to a planar type transistor. For example, the transistor 2200 can be a fin-type transistor, a tri-gate transistor, or the like. An example of a cross-sectional view in such a case is shown in FIG. 18D. An insulating film 2212 is provided over a semiconductor substrate 2211. The semiconductor substrate 2211 has a projecting portion with a thin tip (also referred to as a fin). Note that an insulating film may be provided over the projecting portion. The insulating film functions as a mask for preventing the semiconductor substrate 2211 from being etched when the projecting portion is formed. The projecting portion does not necessarily have the thin tip; a cuboid-like projecting portion and a projecting portion with a thick tip are permitted, for example. A gate insulating film 2214 is provided over the projecting portion of the semiconductor substrate 2211, and a gate electrode 2213 is provided over the gate insulating film 2214. Although the gate electrode 2213 has a two-layer structure in this embodiment, the present invention is not limited to this example, and the gate electrode 2213 may have a single-layer structure or a multilayer structure including three or more layers. Source and drain regions 2215 are formed in the semiconductor substrate 2211. Note that here is shown an example in which the semiconductor substrate 2211 has the projecting portion; however, the semiconductor device of one embodiment of the present invention is not limited thereto. For example, a semiconductor region having a projecting portion may be formed by processing an SOI substrate.

[Circuit Configuration Example]

In the above structure, electrodes of the transistors 2100 and 2200 can be connected in a variety of ways; thus, a variety of circuits can be configured. Examples of circuit configurations that can be achieved by using the semiconductor device of one embodiment of the present invention will be described below.

A circuit diagram in FIG. 18B shows a configuration of what is called a CMOS circuit in which the p-channel transistor 2200 and the n-channel transistor 2100 are connected to each other in series and in which gates of them are connected to each other.

A circuit diagram in FIG. 18C shows a configuration in which sources of the transistors 2100 and 2200 are connected to each other and drains of the transistors 2100 and 2200 are connected to each other. With such a configuration, the transistors can function as what is called an analog switch.

Figure 19:
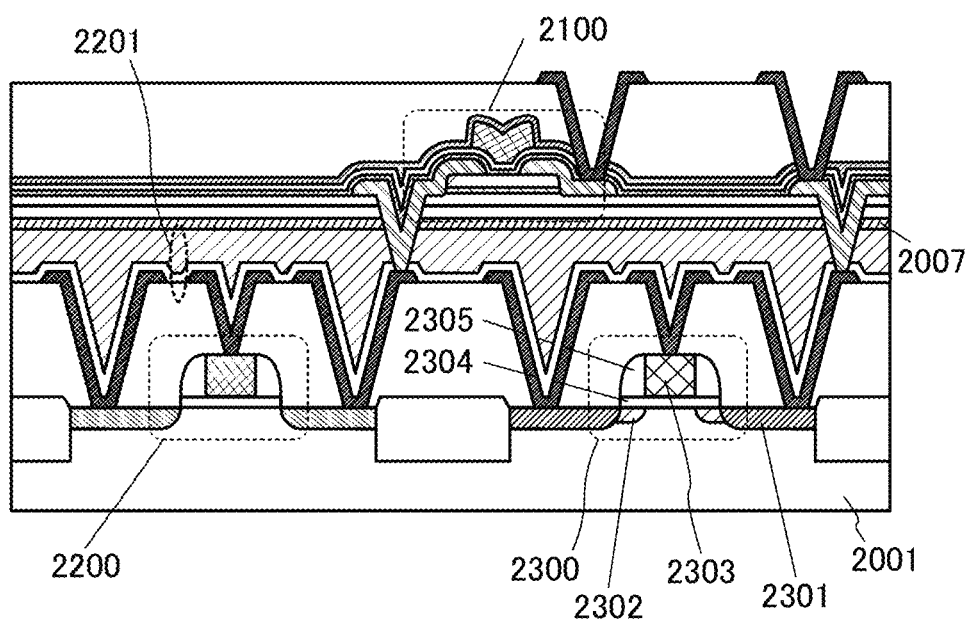
FIG. 19 is a cross-sectional view illustrating a structure example of a semiconductor device.

FIG. 19 is a cross-sectional view of a semiconductor device in which a CMOS circuit includes the transistor 2200 and a transistor 2300 each having a channel formed using a first semiconductor material.

The transistor 2300 includes impurity regions 2301 serving as a source region or a drain region, a gate electrode 2303, a gate insulating film 2304, and a sidewall insulating film 2305. The transistor 2300 may also include an impurity region 2302 serving as an LDD region under the sidewall insulating film 2305. The description for FIG. 18A can be referred to for the other components in FIG. 19.

The polarities of the transistor 2200 and the transistor 2300 are preferably different from each other. For example, when the transistor 2200 is a p-channel transistor, the transistor 2300 is preferably an n-channel transistor.

A photoelectric conversion element such as a photodiode may be provided in the semiconductor devices illustrated in FIG. 18A and FIG. 19.

The photodiode may be formed using a single crystal semiconductor or a polycrystalline semiconductor. A photodiode using a single crystal semiconductor or a polycrystalline semiconductor is preferred because of its high light detection sensitivity.

Figure 20A:
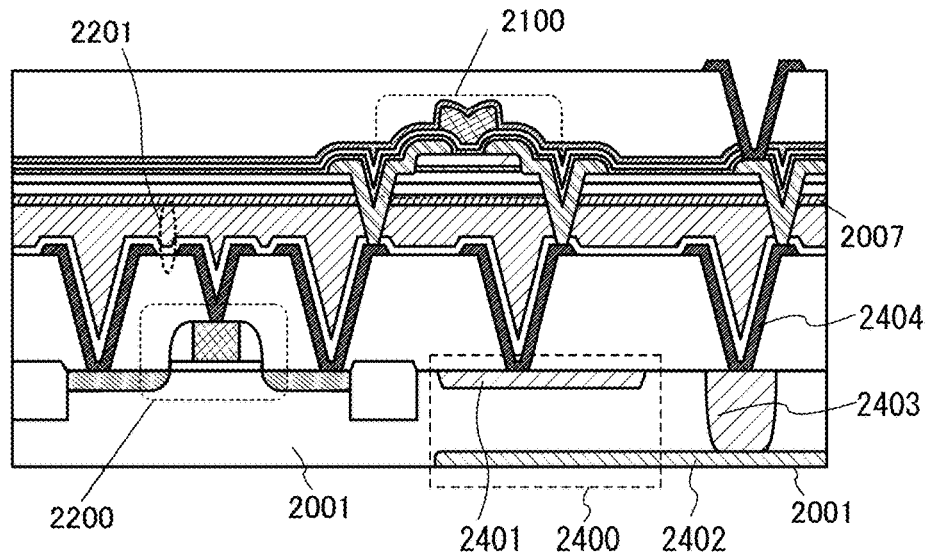
FIGS. 20A to 20C are cross-sectional views and a circuit diagram illustrating structure examples of semiconductor devices.
Figure 20B:
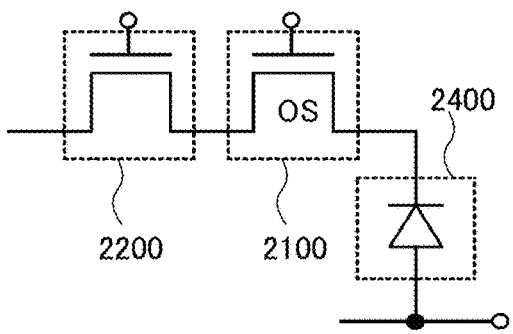

FIG. 20A is a cross-sectional view of a semiconductor device where a substrate 2001 is provided with a photodiode 2400. FIG. 20B is a circuit diagram of a structure of the semiconductor device of FIG. 20A. The photodiode 2400 includes a conductive film 2401 having a function as one of an anode and a cathode, a conductive film 2402 having a function as the other of the anode and the cathode, and a conductive film 2403 electrically connecting the conductive film 2402 and a conductive film 2404. The conductive films 2401 to 2403 may be formed by injecting an impurity in the substrate 2001.

Although the photodiode 2400 is provided so that a current flows in the vertical direction with respect to the substrate 2001 in FIG. 20A, the photodiode 2400 may be provided so that a current flows in the lateral direction with respect to the substrate 2001.

Figure 20C:
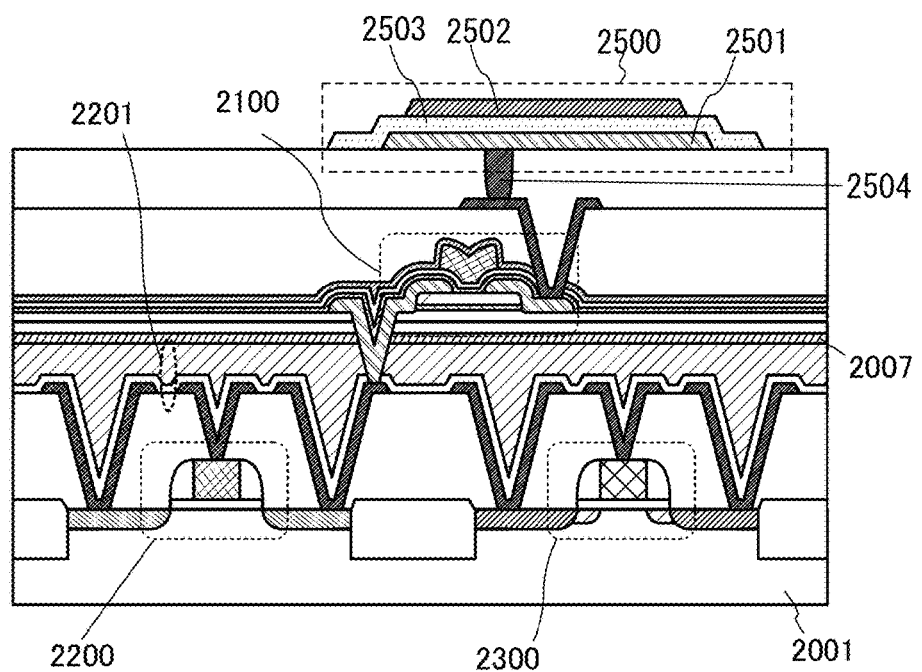

FIG. 20C is a cross-sectional view of a semiconductor device where a photodiode 2500 is provided above the transistor 2100. The photodiode 2500 includes a conductive film 2501 having a function as one of an anode and a cathode, a conductive film 2502 having a function as the other of the anode and the cathode, and a semiconductor layer 2503. Furthermore, the photodiode 2500 is electrically connected to the transistor 2100 through a plug 2504.

In FIG. 20C, the photodiode 2500 may be provided at the same level as the transistor 2100. Alternatively, the photodiode 2500 may be provided at the level between the transistor 2200 and the transistor 2100.

The description for FIG. 18A and FIG. 19 can be referred to for the details of other components in FIGS. 20A and 20C.

The photodiode 2400 or the photodiode 2500 may be formed using a material capable of generating charge by absorbing a radiation. Examples of the material capable of generating charge by absorbing a radiation include selenium, lead iodide, mercury iodine, gallium arsenide, CdTe, and CdZn.

The use of selenium for the photodiode 2400 or the photodiode 2500 can provide a photoelectric conversion element having a light absorption coefficient in a wide wavelength range of visible light, ultraviolet light, X-rays, and gamma rays, for example.

<Memory Device>

Figure 21A:
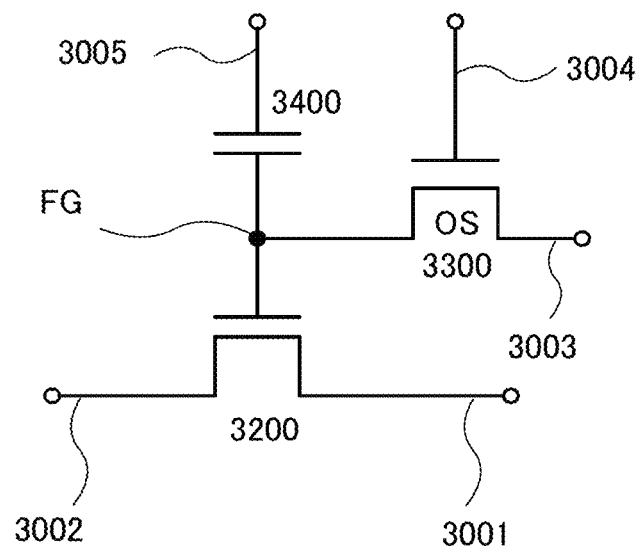
FIGS. 21A and 21B are circuit diagrams illustrating examples of memory devices.
Figure 21B:
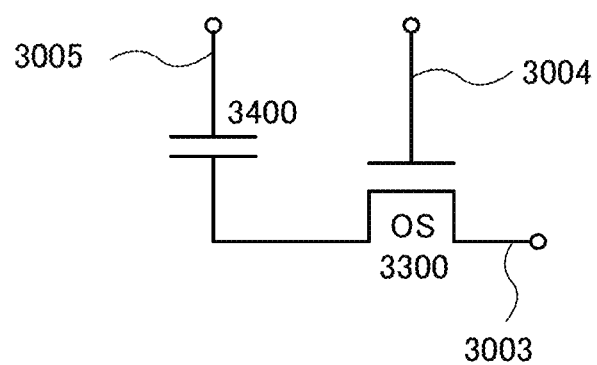

Examples of a semiconductor device (memory device) which includes the transistor of one embodiment of the present invention, which can retain stored data even when not powered, and which has an unlimited number of write cycles are shown in FIGS. 21A and 21B.

The semiconductor device illustrated in FIG. 21A includes a transistor 3200 containing a first semiconductor material, a transistor 3300 containing a second semiconductor material, and a capacitor 3400. Note that any of the structures described in Embodiment 1 can be used for the transistors 3200 and 3300.

In the transistor 3300, a channel is formed in a semiconductor layer including an oxide semiconductor. Since the off-state current of the transistor 3300 is low, stored data can be retained for a long time. In other words, power consumption can be sufficiently reduced because a semiconductor memory device in which refresh operation is unnecessary or the frequency of refresh operation is extremely low can be provided.

In FIG. 21A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400.

A fifth wiring 3005 is electrically connected to the other electrode of the capacitor 3400.

The semiconductor device in FIG. 21A has a feature that the potential of the gate electrode of the transistor 3200 can be retained, and thus enables writing, retaining, and reading of data as follows.

Writing and retaining of data will be described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate of the transistor 3200 (writing). Here, one of two kinds of charge providing different potential levels (hereinafter referred to as low-level charge and high-level charge) is supplied. After that, the potential of the fourth wiring 3004 is set to a potential at which the transistor 3300 is turned off, so that the transistor 3300 is turned off. Thus, the charge supplied to the gate of the transistor 3200 is retained (retaining).

Since the off-state current of the transistor 3300 is extremely low, the charge of the gate of the transistor 3200 is retained for a long time.

Next, reading of data will be described. An appropriate potential (a reading potential) is supplied to the fifth wiring 3005 while a predetermined potential (a constant potential) is supplied to the first wiring 3001, whereby the potential of the second wiring 3002 varies in accordance with the amount of charge retained in the gate of the transistor 3200. This is because in general, when an n-channel transistor is used as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate of the transistor 3200 can be determined For example, in the case where the high-level charge is supplied to the gate of the transistor 3200 in writing and the potential of the fifth wiring 3005 is $V_0$ ($>V_{th\_H}$), the transistor 3200 is turned on. In the case where the low-level charge is supplied to the gate of the transistor 3200 in writing, the transistor 3200 remains off even when the potential of the fifth wiring 3005 is $V_0$ ($<V_{th\_L}$). Thus, the data retained in the gate of the transistor 3200 can be read by determining the potential of the second wiring 3002.

Note that in the case where memory cells are arrayed, it is necessary that only data of a desired memory cell be able to be read. In the case where data is not read, the fifth wiring 3005 may be supplied with a potential at which the transistor 3200 is turned off regardless of the state of the gate, that is, a potential lower than $V_{th\_H}$. Alternatively, the fifth wiring 3005 may be supplied with a potential at which the transistor 3200 is turned on regardless of the state of the gate, that is, a potential higher than $V_{th\_L}$.

The semiconductor device illustrated in FIG. 21B is different from the semiconductor device illustrated in FIG. 21A in that the transistor 3200 is not provided. In this case, data writing and retaining operations can be performed in a manner similar to those of the semiconductor device illustrated in FIG. 21A.

Next, reading of data in the semiconductor device illustrated in FIG. 21B will be described. When the transistor 3300 is turned on, the third wiring 3003 which is in a floating state and the capacitor 3400 are electrically connected to each other, and charge is redistributed between the third wiring 3003 and the capacitor 3400. As a result, the potential of the third wiring 3003 is changed. The amount of change in potential of the third wiring 3003 depends on the potential of the first terminal of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0$ ($V_1 > V_0$), the potential of the third wiring 3003 when the potential $V_1$ is retained ($=(C_B \times V_{B0} + C \times V_1)/(C_B + C)$) is higher than the potential of the third wiring 3003 when the potential $V_0$ is retained ($=(C_B \times V_{B0} + C \times V_0)/(C_B + C)$).

Then, by comparing the potential of the third wiring 3003 with a predetermined potential, data can be read.

In this case, a transistor containing the first semiconductor material may be used in a driver circuit for driving a memory cell, and a transistor containing the second semiconductor material may be stacked as the transistor 3300 over the driver circuit.

When a transistor having a channel formation region formed using an oxide semiconductor and having an extremely low off-state current is used in the semiconductor device described in this embodiment, the semiconductor device can retain stored data for an extremely long time. In other words, refresh operation becomes unnecessary or the frequency of the refresh operation can be extremely low, leading to a sufficient reduction in power consumption. Moreover, stored data can be retained for a long time even when not powered (note that a potential is preferably fixed).

Furthermore, in the semiconductor device described in this embodiment, a high voltage is not needed for data writing and there is no problem of deterioration of elements. Unlike in a conventional nonvolatile memory, for example, it is not necessary to inject and extract electrons into and from a floating gate; thus, a problem such as deterioration of a gate insulating film is unlikely to be caused. That is, the semiconductor device of the disclosed invention does not have a limit on the number of times data can be rewritten, which is a problem of a conventional nonvolatile memory, and the reliability thereof is drastically improved. Moreover, since data is written depending on the state of the transistor (on or off), high-speed operation can be easily achieved.

The memory device described in this embodiment can also be used in an LSI such as a central processing unit (CPU), a digital signal processor (DSP), a custom LSI, or a programmable logic device (PLD), and a radio frequency (RF) tag, for example.

The structures, methods, and the like described in this embodiment can be used as appropriate in combination with any of the structures, methods, and the like described in the other embodiments and examples.

(Embodiment 4)

In this embodiment, a CPU in which the structure described in Embodiment 1 can be used and the memory device described in Embodiment 3 is included will be described.

Figure 22:
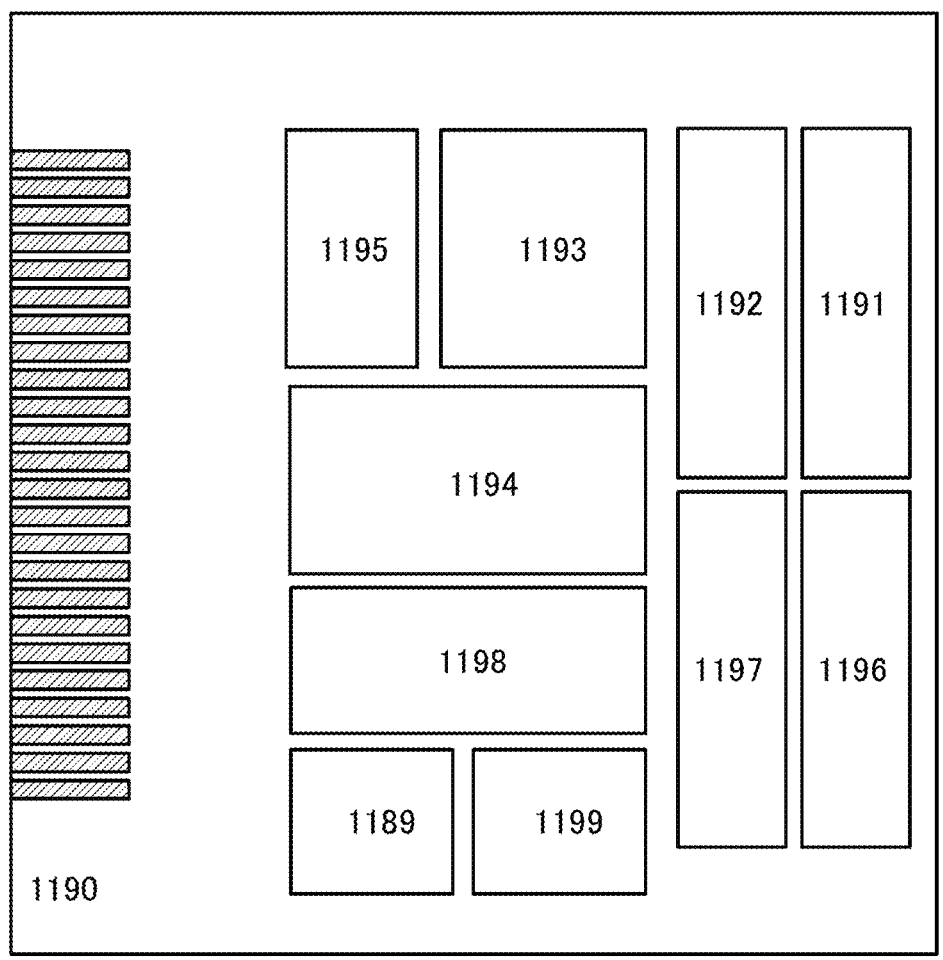
FIG. 22 is a block diagram illustrating an example of a CPU.

FIG. 22 is a block diagram illustrating a configuration example of a CPU at least partly including any of the transistors described in the above embodiments as a component.

The CPU illustrated in FIG. 22 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (BUS I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 22 is just an example in which the configuration is simplified, and an actual CPU may have a variety of configurations depending on the application. For example, the CPU may have the following configuration: a structure including the CPU illustrated in FIG. 22 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in response to the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 22, a memory cell is provided in the register 1196. For the memory cell of the register 1196, the structure described in Embodiment 1 or the memory device described in Embodiment 3 can be used.

In the CPU illustrated in FIG. 22, the register controller 1197 selects operation of retaining data in the register 1196 in accordance with an instruction from the ALU 1191. That is, the register controller 1197 selects whether data is retained by a flip-flop or whether it is retained by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

The structures, methods, and the like described in this embodiment can be used as appropriate in combination with any of the structures, methods, and the like described in the other embodiments and examples.

(Embodiment 5)

In this embodiment, structure examples of a display device including a semiconductor device of one embodiment of the present invention will be described.

[Structure Example]

Figure 23A:
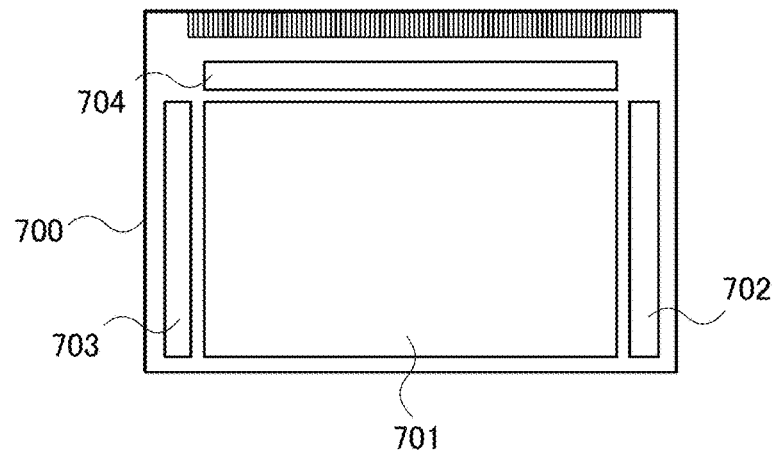
FIG. 23A illustrates a structure example of a display device.
Figure 23B:
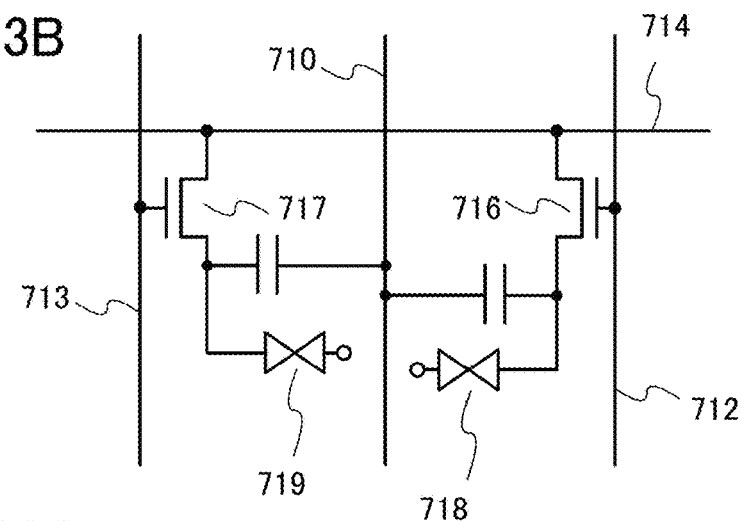
FIGS. 23B and 23C are circuit diagrams of pixels.
Figure 23C:
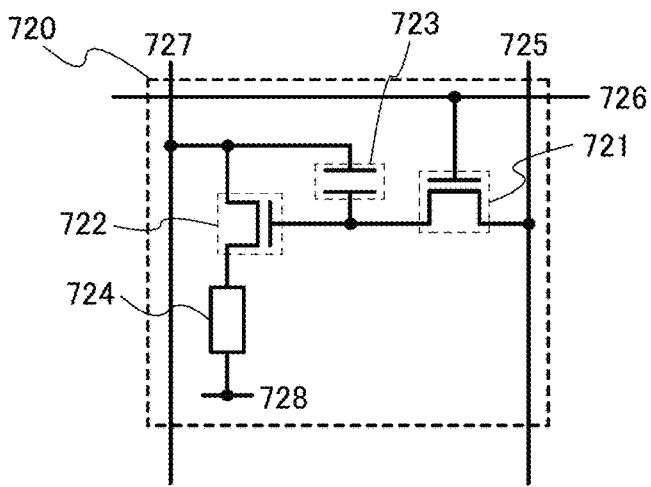

FIG. 23A is a top view of the display device including the semiconductor device of one embodiment of the present invention. FIG. 23B is a circuit diagram illustrating a pixel circuit that can be used in the case where a liquid crystal element is used in a pixel in the display device including the semiconductor device of one embodiment of the present invention. FIG. 23C is a circuit diagram illustrating a pixel circuit that can be used in the case where an organic EL element is used in a pixel in the display device including the semiconductor device of one embodiment of the present invention.

A transistor in a pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 23A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 23A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved. One or more of the first scan line driver circuit 702, the second scan line driver circuit 703, and the signal line driver circuit 704 may be mounted on the substrate 700 or provided outside the substrate 700.

[Liquid Crystal Display Device]

FIG. 23B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a data line 714 is shared by the transistors 716 and 717. The transistor described in any of the above embodiments can be used as appropriate as each of the transistors 716 and 717. Thus, a highly reliable liquid crystal display device can be provided.

A first pixel electrode layer is electrically connected to the transistor 716 and a second pixel electrode layer is electrically connected to the transistor 717. The first pixel electrode layer and the second pixel electrode layer are separated. Shapes of the first pixel electrode layer and the second pixel electrode layer are not especially limited. For example, the first pixel electrode layer may have a V-like shape.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Furthermore, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 23B. For example, a switch, a resistor, a capacitor, a transistor, a sensor, a logic circuit, or the like may be added to the pixel circuit illustrated in FIG. 23B.

[Organic EL Display Device]

FIG. 23C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 23C illustrates an applicable example of a pixel circuit. Here, one pixel includes two n-channel transistors. Furthermore, digital time grayscale driving can be employed for the pixel circuit.

The configuration of the applicable pixel circuit and operation of a pixel employing digital time grayscale driving will be described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, any of the transistors described in the above embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted.

Next, a signal input to the driver transistor 722 will be described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage greater than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 23C. For example, a switch, a resistor, a capacitor, a sensor, a transistor, a logic circuit, or the like may be added to the pixel circuit illustrated in FIG. 23C.

In the case where the transistor shown in any of the above embodiments is used for the circuit shown in FIGS. 23A to 23C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

In this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by an electrical or magnetic effect may be included. Note that examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that this embodiment can be combined with any of the other embodiments and examples in this specification as appropriate.

(Embodiment 6)

In this embodiment, a display module using a semiconductor device of one embodiment of the present invention is described with reference to FIG. 24.

Figure 24:
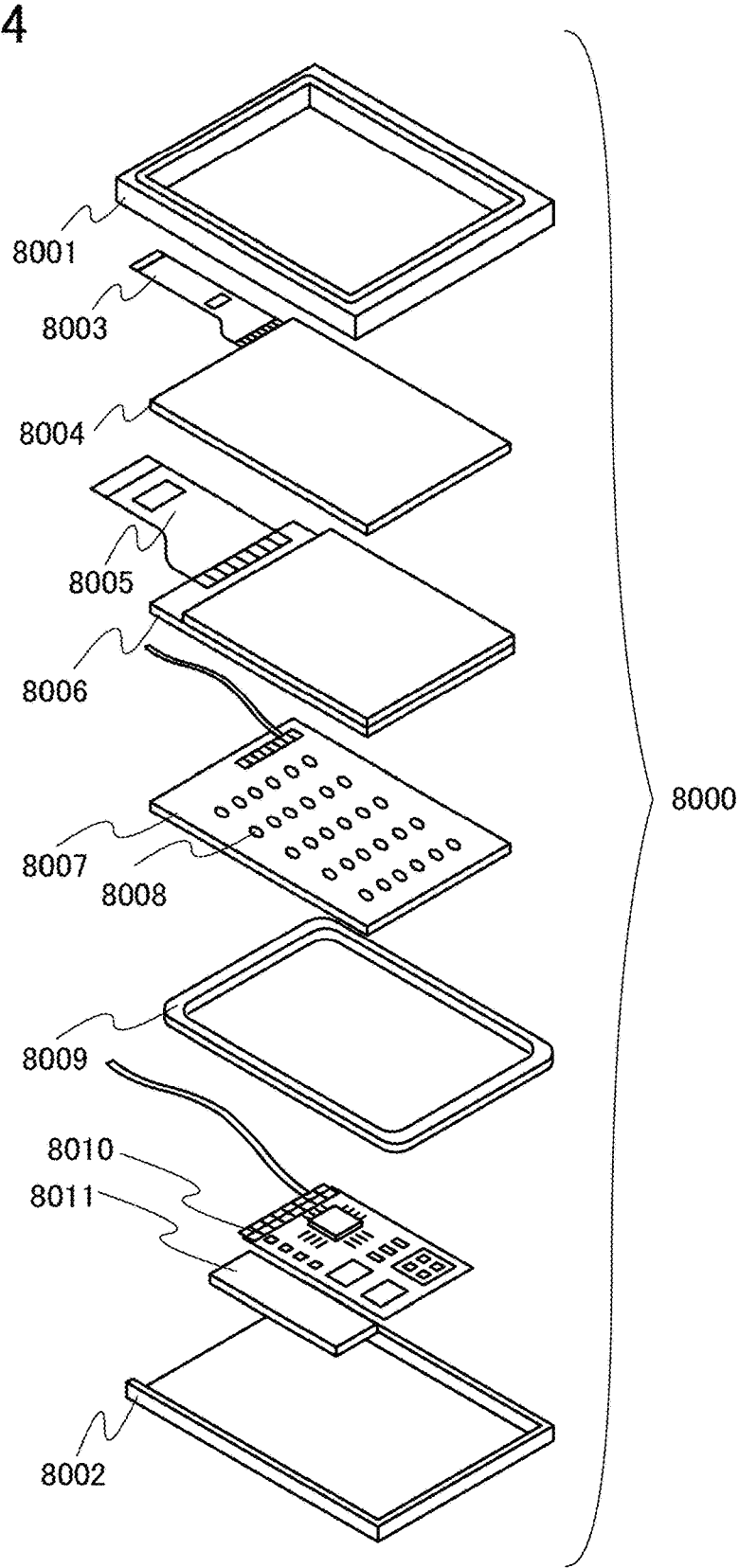
FIG. 24 illustrates a display module.

In a display module 8000 in FIG. 24, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. A counter substrate (sealing substrate) of the display panel 8006 can have a touch panel function. A photosensor may be provided in each pixel of the display panel 8006 so that an optical touch panel function is added. An electrode for a touch sensor may be provided in each pixel of the display panel 8006 so that a capacitive touch panel function is added. A display module with a position input function may be used as the display panel 8006. Note that the position input function can be added by providing the display panel 8006 with the touch panel 8004.

The backlight unit 8007 includes a light source 8008. The light source 8008 may be provided at an end portion of the backlight unit 8007 and a light diffusing plate may be used.

The frame 8009 protects the display panel 8006 and also serves as an electromagnetic shield for blocking electromagnetic waves generated by the printed board 8010. The frame 8009 may serve as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. Note that the battery 8011 is not necessary in the case where a commercial power source is used.

The display module 8000 can be additionally provided with a member such as a polarizing plate, a retardation plate, or a prism sheet.

Note that this embodiment can be combined with any of the other embodiments and examples in this specification as appropriate.

(Embodiment 7)

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 25A to 25F illustrate specific examples of these electronic devices.

Figure 25A:
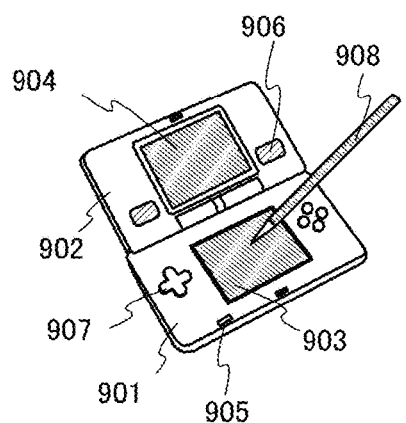
FIGS. 25A to 25F illustrate examples of electronic devices.

FIG. 25A illustrates a portable game machine which includes a housing 901, a housing 902, a display portion 903, a display portion 904, a microphone 905, a speaker 906, an operation key 907, a stylus 908, and the like. Although the portable game machine in FIG. 25A has the two display portions 903 and 904, the number of display portions included in a portable game machine is not limited to this.

Figure 25B:
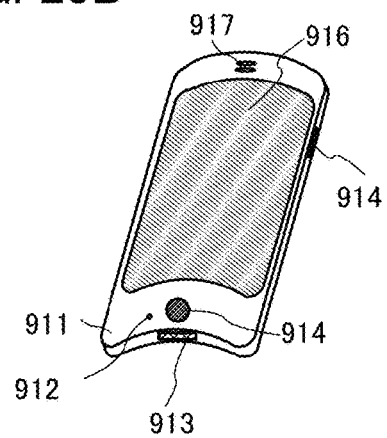

FIG. 25B illustrates a cellular phone which is provided with a housing 911, a display portion 916, operation buttons 914, an external connection port 913, a speaker 917, a microphone 912, and the like. When the display portion 916 of the cellular phone illustrated in FIG. 25B is touched with a finger or the like, data can be input. Furthermore, operations such as making a call and inputting text can be performed by touch on the display portion 916 with a finger or the like. With the operation button 914, the power can be turned on or off. In addition, the type of image displayed on the display portion 916 can be switched with the operation button 914; for example, switching images from a mail creation screen to a main menu screen can be performed.

Figure 25C:
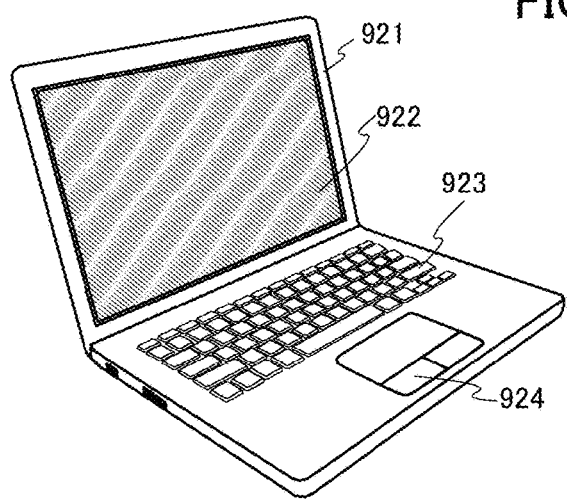

FIG. 25C illustrates a notebook personal computer which includes a housing 921, a display portion 922, a keyboard 923, a pointing device 924, and the like.

Figure 25D:
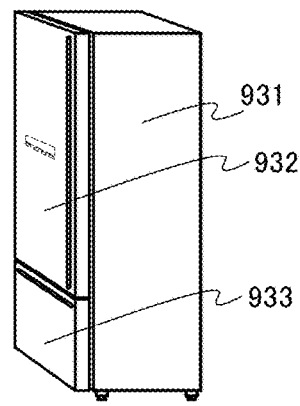

FIG. 25D illustrates an electric refrigerator-freezer which includes a housing 931, a refrigerator door 932, a freezer door 933, and the like.

Figure 25E:
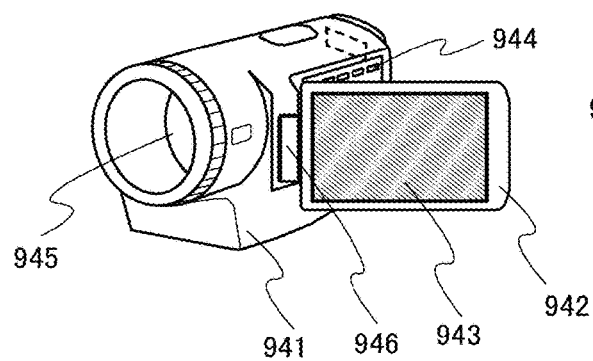

FIG. 25E illustrates a video camera which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 25F:
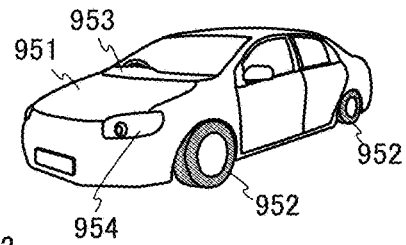
Figure 26A:
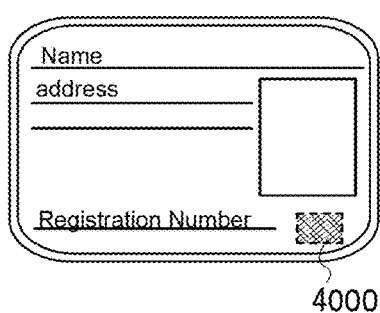
FIGS. 26A to 26F illustrate RF tag examples.
Figure 26B:
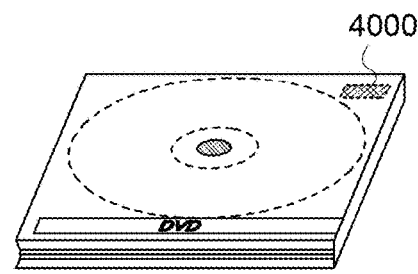
Figure 26C:
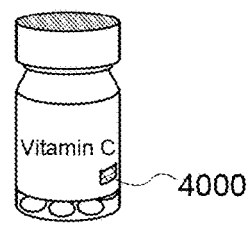
Figure 26D:
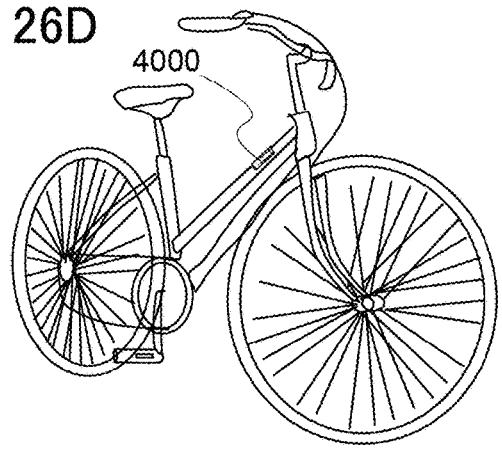
Figure 26E:
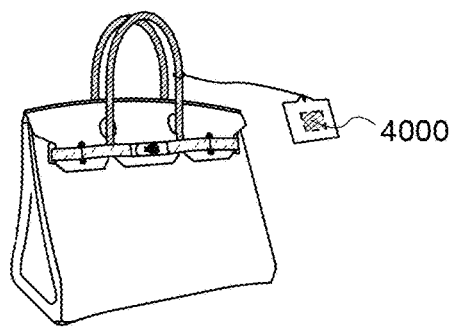
Figure 26F:
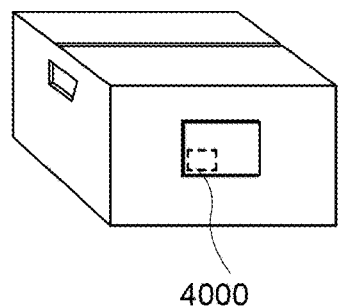

FIG. 25F illustrates a car, a vehicle, or the like which includes a car body 951, wheels 952, a dashboard 953, lights 954, and the like.

The structures, methods, and the like described in this embodiment can be used as appropriate in combination with any of the structures, methods, and the like described in the other embodiments and examples.

(Embodiment 8)

In this embodiment, application examples of an RF tag that can be formed using the semiconductor device of one embodiment of the present invention will be described with reference to FIGS. 26A to 26F. The RF tag is widely used and can be provided for, for example, products such as bills, coins, securities, bearer bonds, documents (e.g., driver's licenses or resident's cards, see FIG. 26A), recording media (e.g., DVDs or video tapes, see FIG. 26B), packaging containers (e.g., wrapping paper or bottles, see FIG. 26C), vehicles (e.g., bicycles, see FIG. 26D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 26E and 26F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have a higher level of security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Next, an example of use of a display device that can include the semiconductor device of one embodiment of the present invention will be described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be employed, for example.

The structures, methods, and the like described in this embodiment can be used as appropriate in combination with any of the structures, methods, and the like described in the other embodiments and examples.

EXAMPLE 1

In this example, cross-sectional observation of a conductive film and an interlayer insulating film which were formed in a depressed portion of an insulating film was conducted.

A method for fabricating a sample 1A subjected to cross-sectional observation is described below.

First, a 200-nm-thick silicon oxynitride (SiON) film was formed over a silicon wafer by a CVD method.

Next, a 150-nm-thick tungsten (W) film was formed by a sputtering method using a tungsten target in an atmosphere of an argon (Ar) gas at a flow rate of 80 sccm as a deposition gas under the conditions where the pressure was 0.8 Pa, the substrate temperature was 230° C., the distance between the target and the substrate was 60 mm, and a source power (DC) of 1.0 kW was applied.

Next, a 550-nm-thick silicon oxynitride (SiON) film was formed by a CVD method.

Next, the silicon oxynitride (SiON) film was etched to form an opening reaching the tungsten (W) film. As the etching, first etching and second etching were performed for 3 seconds and 74 seconds, respectively, by an inductively coupled plasma (ICP) etching method. The conditions of the first etching were as follows: a mixed atmosphere of trifluoromethane and helium ($CHF_3$: He=50 sccm: 100 sccm); a source power of 475 W; a bias power of 300 W; and a pressure of 5.5 Pa. The second etching was performed after the first etching under the following conditions: a mixed atmosphere of trifluoromethane and helium ($CHF_3$: He=7.5 sccm: 142.5 sccm); a source power of 475 W; a bias power of 300 W; and a pressure of 5.5 Pa. Then, the first etching and the second etching were repeated in this order. Thus, a depressed portion was formed in the silicon oxynitride (SiON) film.

Next, a 150-nm-thick tungsten (W) film was formed by a sputtering method using a tungsten target in an atmosphere of an argon (Ar) gas at a flow rate of 80 sccm as a deposition gas under the conditions where the pressure was 0.8 Pa, the substrate temperature was 230° C., the distance between the target and the substrate was 60 mm, and a source power (DC) of 1.0 kW was applied.

Next, a 500-nm-thick silicon oxide (TEOS-SiOx) film was formed by an atmospheric pressure CVD method in a mixed atmosphere of a tetraethoxysilane (TEOS) gas and an ozone ($O_3$) gas (TEOS=31.5% (Max 1.0 g/min), $O_3$=58 g/m$^3$, and the flow ratio of $O_3$ to TEOS was 8.) as a deposition gas under the conditions where the exhaust gas pressure was −200 Pa, the substrate temperature was 420° C., and the deposition rate was 100 nm/min. Here, "TEOS=31.5% (Max 1.0 g/min)" means the maximum value of the TEOS gas in deposition is 0.315 g/min. Furthermore, "the exhaust gas pressure was −200 Pa" means a pressure (101.125 kPa) obtained by exhausting a pressure of 200 Pa from an atmospheric pressure (101.325 kPa) with a blower.

Through the above process, the sample 1A was fabricated.

In addition, a sample 1B was fabricated. A method for fabricating the sample 1B is described below.

First, a 200-nm-thick silicon oxynitride (SiON) film was formed over a silicon wafer by a CVD method. Next, a 150-nm-thick tungsten (W) film was formed. Next, a 550-nm-thick silicon oxynitride (SiON) film was formed by a CVD method. Next, the silicon oxynitride (SiON) film was etched to form an opening reaching the tungsten (W) film. Next, a 150-nm-thick tungsten (W) film was formed. The steps up to here are similar to those of the sample 1A.

Next, a 500-nm-thick silicon oxide film was formed by a plasma CVD method in which tetraethoxysilane (TEOS) at a flow rate of 15 sccm and oxygen ($O_2$) at a flow rate of 750 sccm were used as source gases, the substrate temperature was 300° C., a high-frequency power of 300 W was supplied to parallel plate electrodes by using a 27 MHz high-frequency power source, and the deposition rate was 100 nm/min.

Through the above process, the sample 1B was fabricated.

Figure 27A:
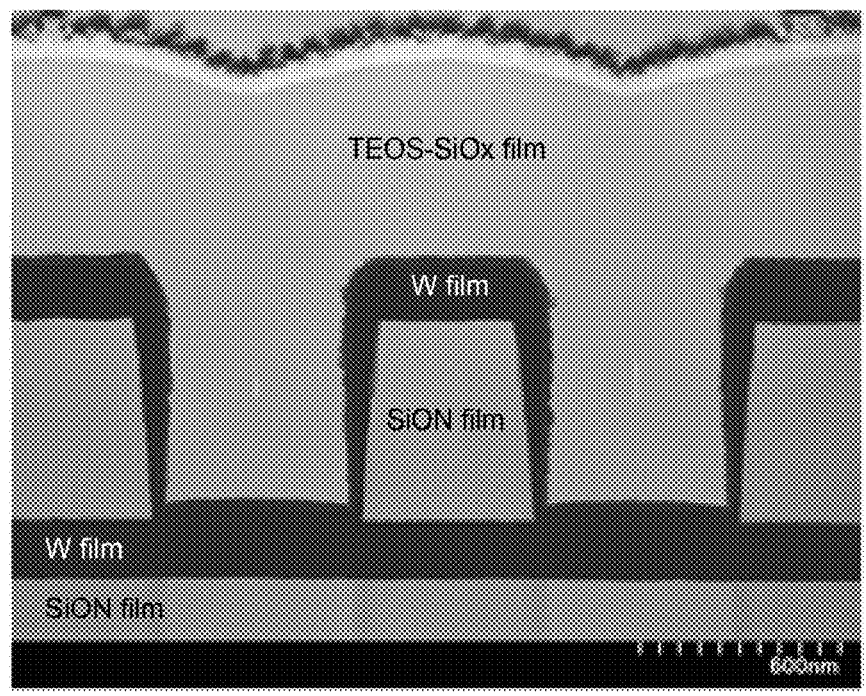
FIGS. 27A and 27B are cross-sectional STEM images of samples used in Example.
Figure 27B:
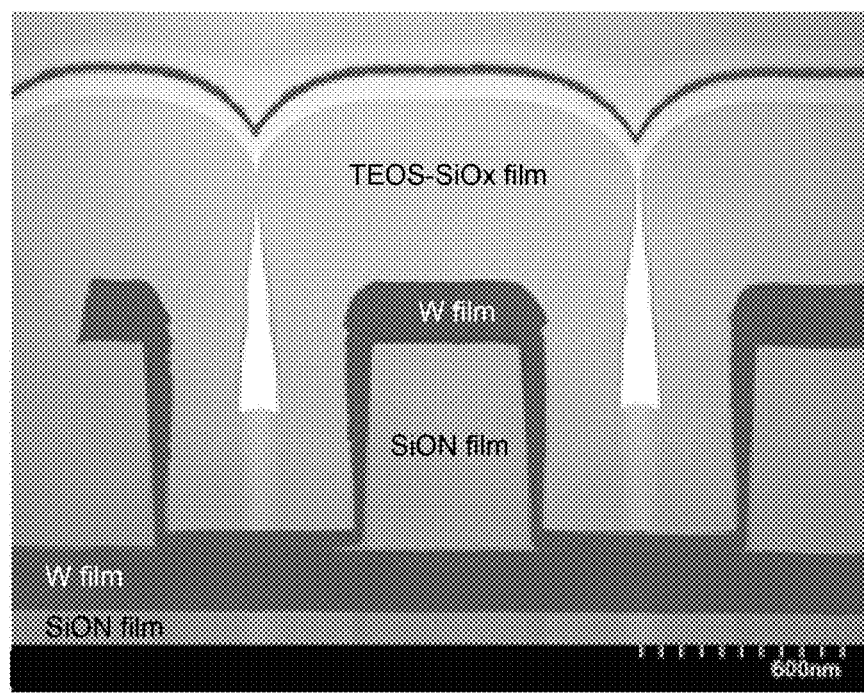
Figures 28A, 28B, 28C, 28D, 28E:
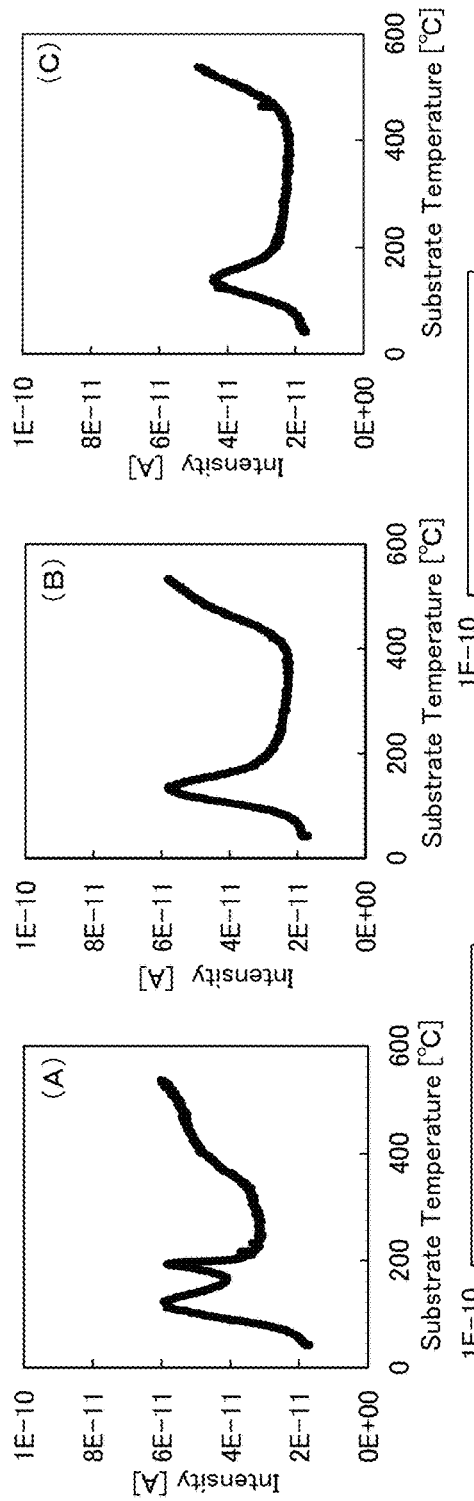
FIGS. 28A to 28E show results of TDS measurement of samples used in Example.
Figure 29A:
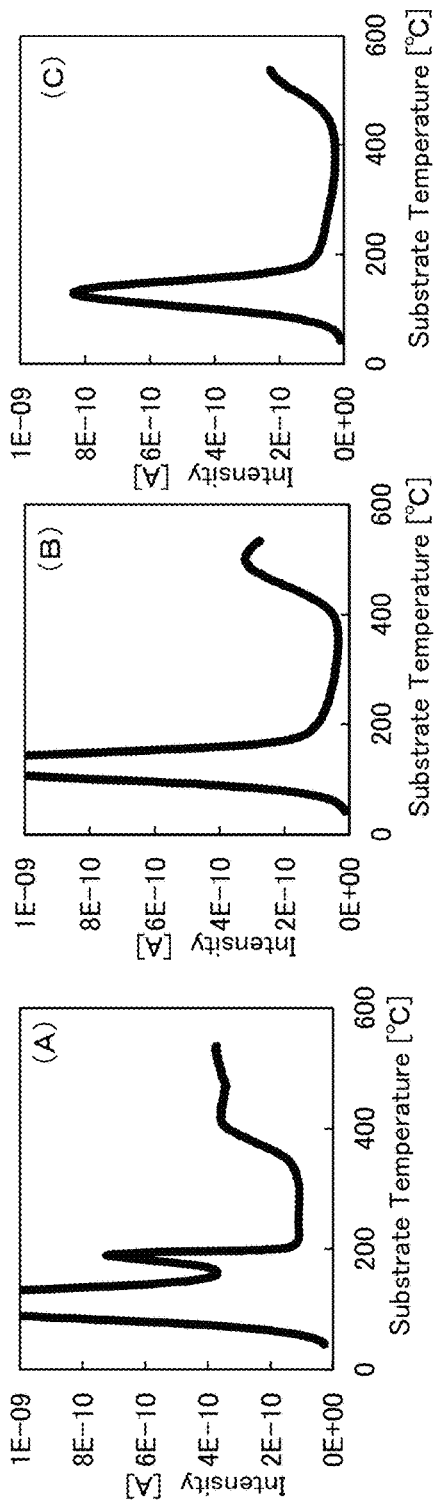
FIGS. 29A to 29E show results of TDS measurement of samples used in Example.
Figure 29B:
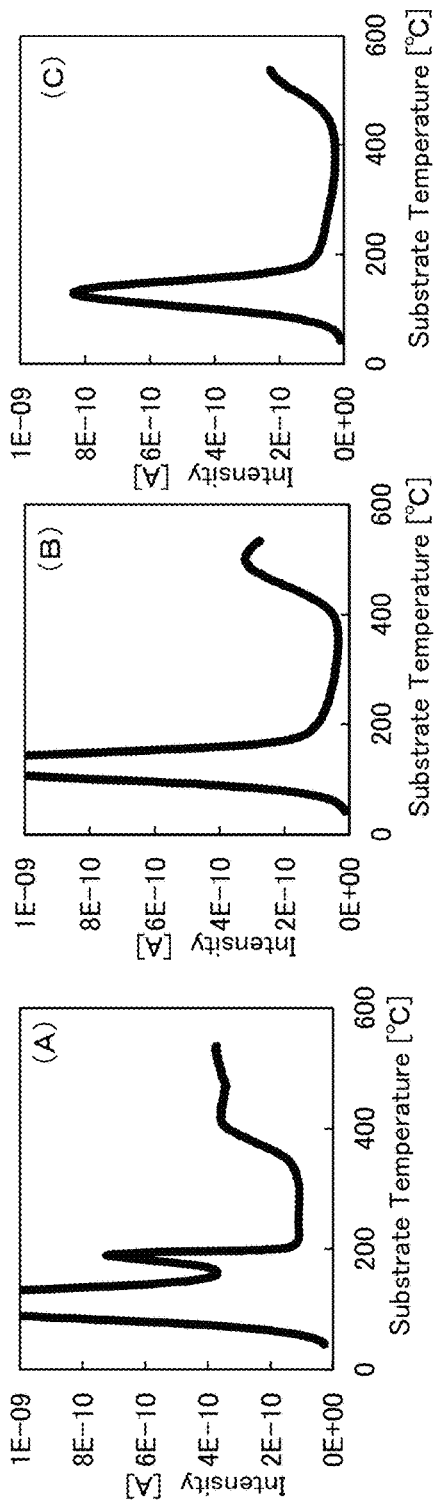
Figure 29C:
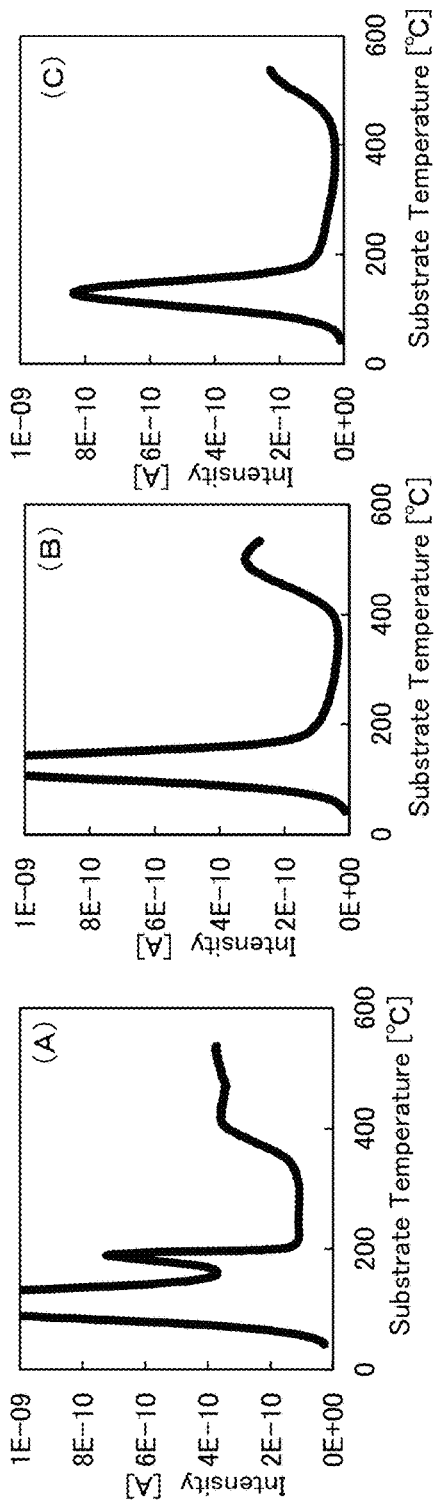
Figure 29D:
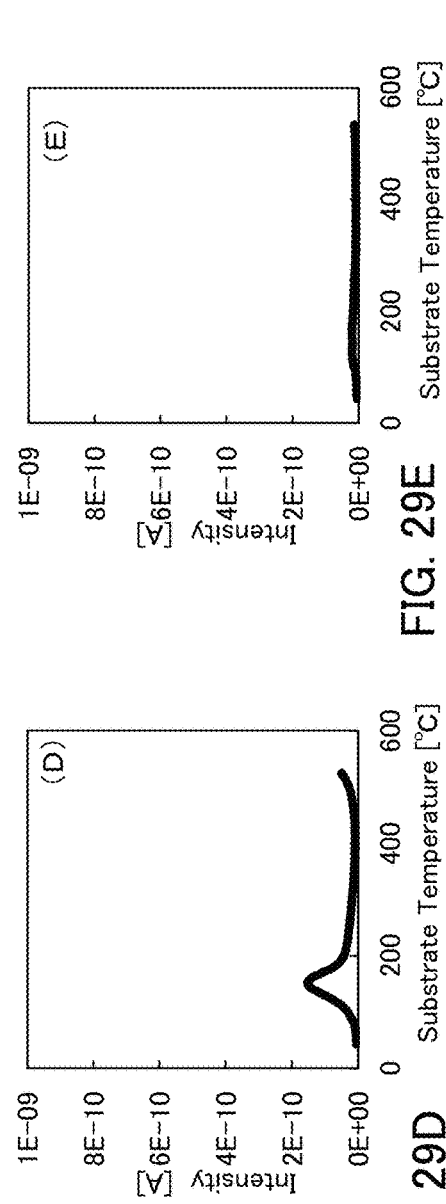
Figure 29E:
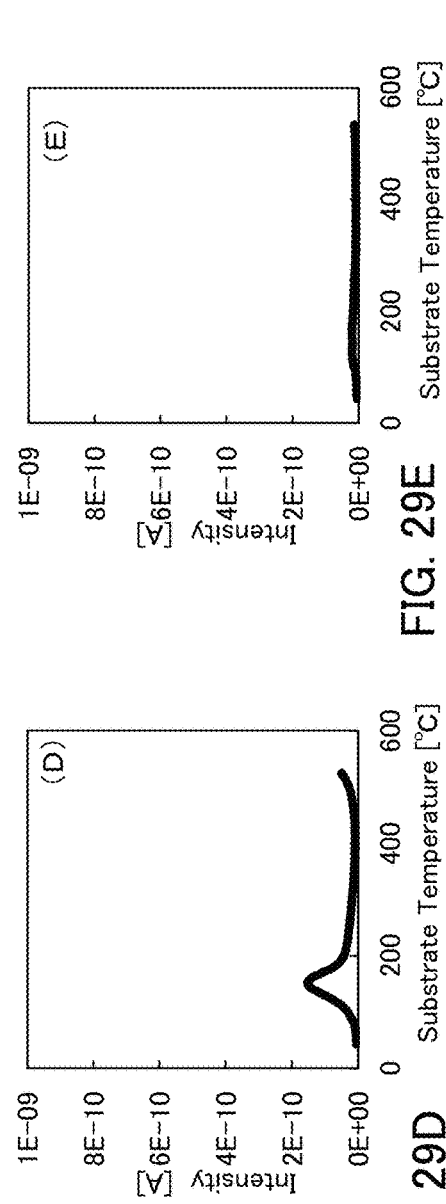
Figures 30A, 30B, 30C, 30D, 30E:
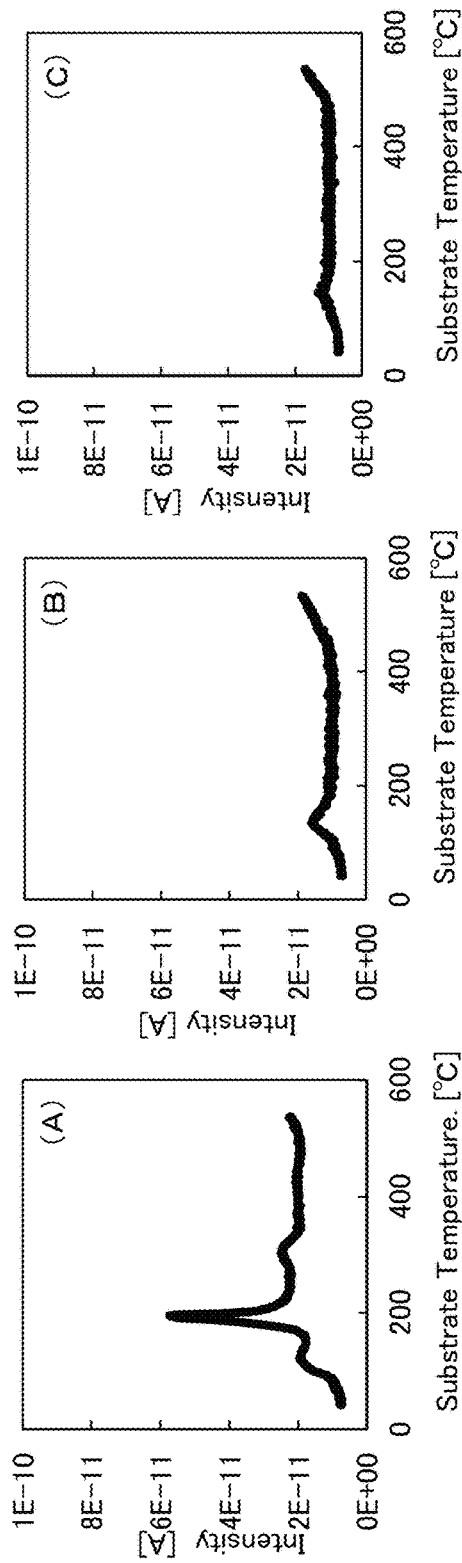
FIGS. 30A to 30E show results of TDS measurement of samples used in Example.

FIG. 27A is a cross-sectional scanning transmission electron microscope (STEM) image of the sample 1A and FIG. 27B is a cross-sectional STEM image of the sample 1B.

It is found from FIG. 27A that the TEOS-SiOx film formed by an atmospheric pressure CVD method in the sample 1A is embedded in the depressed portion of the SiON film, and a seam in the depressed portion has a small size or is not substantially generated. It is found from FIG. 27B that the TEOS-SiOx film formed by a plasma CVD method in the sample 1B is not firmly embedded in the depressed portion of the SiON film, and a large-sized seam is generated in the depressed portion.

EXAMPLE 2

In this example, gas release from the silicon oxide film formed using a TEOS as a material by an atmospheric pressure CVD method was evaluated by TDS.

First, measurement samples are described.

A 500-nm-thick silicon oxide (TEOS-SiOx) film was formed over a silicon wafer by an atmospheric pressure CVD method in a mixed atmosphere of a tetraethoxysilane (TEOS) gas and an ozone ($O_3$) gas (TEOS=31.5% (Max 1.0 g/min), $O_3$=58 g/m$^3$, and the flow ratio of $O_3$ to TEOS was 8.) as a deposition gas under the conditions where the exhaust gas pressure was −200 Pa, the substrate temperature was 420° C., and the deposition rate was 100 nm/min.

A sample formed through the above steps is referred to as a sample 2A, a sample in which heat treatment was performed in a nitrogen atmosphere at 450° C. for 10 hours after the TEOS-SiOx film was formed is referred to as a sample 2B, a sample in which heat treatment was performed in a nitrogen atmosphere at 490° C. for 10 hours after the TEOS-SiOx film was formed is referred to as a sample 2C, a sample in which heat treatment was performed in a nitrogen atmosphere at 540° C. for 10 hours after the TEOS-SiOx film was formed is referred to as a sample 2D, and a sample in which heat treatment was performed in a nitrogen atmosphere at 590° C. for 10 hours after the TEOS-SiOx film was formed is referred to as a sample 2E.

FIGS. 28A to 28E show the substrate temperature and the ion intensity at a mass-to-charge ratio (m/z) of 2 of the samples 2A to 2E measured by TDS. FIGS. 29A to 29E show the substrate temperature and the ion intensity at a mass-to-charge ratio (m/z) of 18 of the samples 2A to 2E measured by TDS. FIGS. 30A to 30E show the substrate temperature and the ion intensity at a mass-to-charge ratio (m/z) of 28 of the samples 2A to 2E measured by TDS. FIGS. 31A to 31E show the substrate temperature and the ion intensity at a mass-to-charge ratio (m/z) of 32 of the samples 2A to 2E measured by TDS. Furthermore, (A) in FIGS. 28A to 31E show measurement results of the sample 2A, (B) in FIGS. 28A to 31E show measurement results of the sample 2B, (C) in FIGS. 28A to 31E show measurement results of the sample 2C, (D) in FIGS. 28A to 31E show measurement results of the sample 2D, and (E) in FIGS. 28A to 31E show measurement results of the sample 2E. Examples of a gas detected when m/z is 2 include a hydrogen gas ($H_2$). In this example, all the gases detected when m/z is 2 were regarded as a hydrogen gas. Examples of a gas detected when m/z is 18 include water ($H_2O$). In this example, all the gases detected when m/z is 18 were regarded as water (water vapor). Examples of a gas detected when m/z is 28 include a nitrogen gas ($N_2$). In this example, all the gases detected when m/z is 28 were regarded as a nitrogen gas. Examples of a gas detected when m/z is 32 include an oxygen gas ($O_2$). In this example, all the gases detected when m/z is 32 were regarded as an oxygen gas.

It is found from FIGS. 28A to 31E that release of a hydrogen gas and water is suppressed in the samples 2D and 2E in which heat treatment is performed in a nitrogen atmosphere at 540° C. or higher after the TEOS-SiOx film is formed.

EXAMPLE 3

In this example, evaluation results of a silicon oxide film using TEOS as a material, by secondary ion mass spectrometry (SIMS) are described.

First, measurement samples are described.

A 500-nm-thick silicon oxide (TEOS-SiOx) film was formed over a silicon wafer. In a sample 3A, the TEOS-SiOx film was formed by an atmospheric pressure CVD method in a mixed atmosphere of a tetraethoxysilane (TEOS) gas and an ozone ($O_3$) gas (TEOS=90% (Max 1.0 g/min), $O_3$=166 g/m$^3$, and the flow ratio of $O_3$ to TEOS was 8.) as a deposition gas under the conditions where the exhaust gas pressure was −200 Pa, the substrate temperature was 420° C., and the deposition rate was 200 nm/min. In a sample 3B, the TEOS-SiOx film was formed by an atmospheric pressure CVD method in a mixed atmosphere of a tetraethoxysilane (TEOS) gas and an ozone ($O_3$) gas (TEOS=31.5% (Max 1.0 g/min), $O_3$=58 g/m$^3$, and the flow ratio of $O_3$ to TEOS was 8.) as a deposition gas under the conditions where the exhaust gas pressure was −200 Pa, the substrate temperature was 420° C., and the deposition rate was 100 nm/min. In a sample 3C, the TEOS-SiOx film was formed by a plasma CVD method in which tetraethoxysilane (TEOS) at a flow rate of 15 sccm and oxygen ($O_2$) at a flow rate of 750 sccm were used as source gases, the substrate temperature was 300° C., a high-frequency power of 300 W was supplied to parallel plate electrodes by using a 27 MHz high-frequency power source, and the deposition rate was 150 nm/min.

Figure 32B:
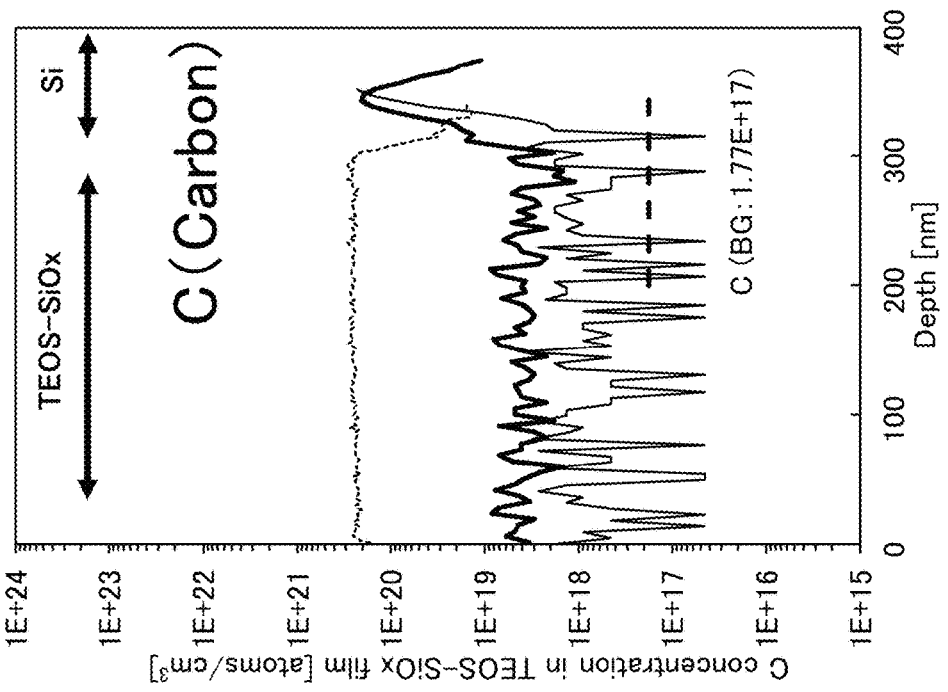
FIGS. 32A and 32B show results of SIMS measurement of samples used in Example.
Figure 32A:
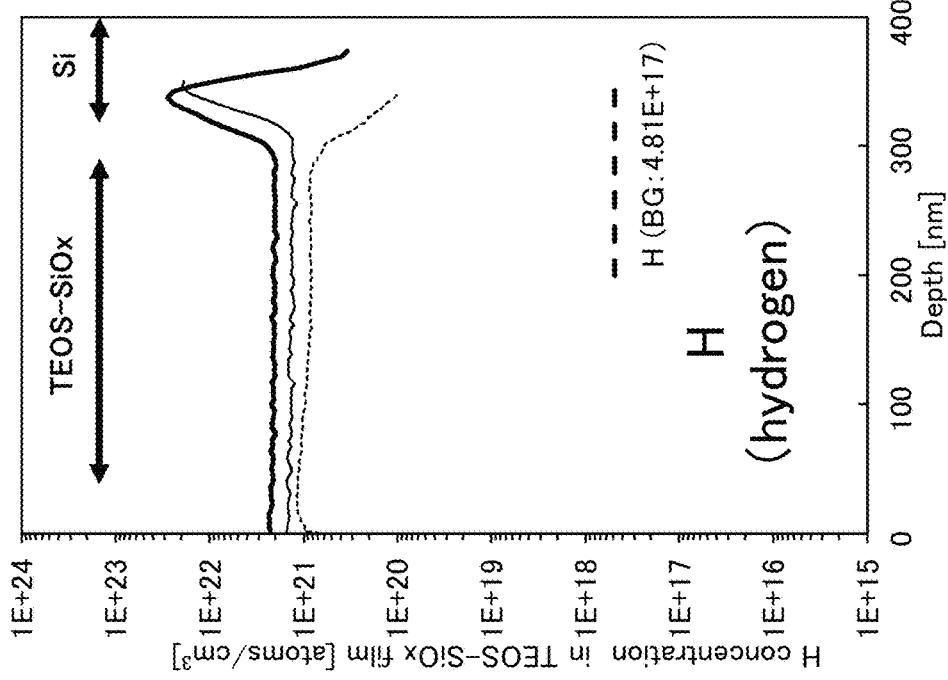

FIG. 32A shows hydrogen concentration profiles of the samples 3A to 3C. FIG. 32B shows carbon concentration profiles of the samples 3A to 3C. In FIGS. 32A and 32B, bold lines indicate profiles of the sample 3A, thin lines indicate profiles of the sample 3B, and dotted lines indicate profiles of the sample 3C. The lower measurement limit (BG) of hydrogen is $4.81 \times 10^{17}$ atoms/cm$^3$ and the lower measurement limit (BG) of carbon is $1.77 \times 10^{17}$ atoms/cm$^3$.

As shown in FIG. 32A, the hydrogen concentrations do not significantly differ between the samples 3A to 3C. On the other hand, as shown in FIG. 32B, the carbon concentrations of the samples 3A and 3B are approximately $1 \times 10^{18}$ atoms/cm$^3$, which are lower than the carbon concentration of the sample 3C.

EXAMPLE 4

In this example, stress of the silicon oxide film formed using TEOS as a material was evaluated.

First, measurement samples are described.

A 100-nm-thick silicon oxide (TEOS-SiOx) film was formed over a silicon wafer. In a sample 4A, the TEOS-SiOx film was formed by an atmospheric pressure CVD method in a mixed atmosphere of a tetraethoxysilane (TEOS) gas and an ozone ($O_3$) gas (TEOS=31.5% (Max 1.0 g/min), $O_3$=58 g/m$^3$, and the flow ratio of $O_3$ to TEOS was 8.) as a deposition gas under the conditions where the exhaust gas pressure was −200 Pa, the substrate temperature was 420° C., and the deposition rate was 100 nm/min. In a sample 4B, the TEOS-SiOx film was formed by an atmospheric pressure CVD method in a mixed atmosphere of a tetraethoxysilane (TEOS) gas and an ozone ($O_3$) gas (TEOS=90% (Max 1.0 g/min), $O_3$=166 g/m$^3$, and the flow ratio of $O_3$ to TEOS was 8.) as a deposition gas under the conditions where the exhaust gas pressure was −200 Pa, the substrate temperature was 420° C., and the deposition rate was 200 nm/min. In a sample 4C, the TEOS-SiOx film was formed by a plasma CVD method in which tetraethoxysilane (TEOS) at a flow rate of 15 sccm and oxygen ($O_2$) at a flow rate of 750 sccm were used as source gases, the substrate temperature was 300° C., a high-frequency power of 300 W was supplied to parallel plate electrodes by using a 27 MHz high-frequency power source, and the deposition rate was 150 nm/min.

Figure 33:
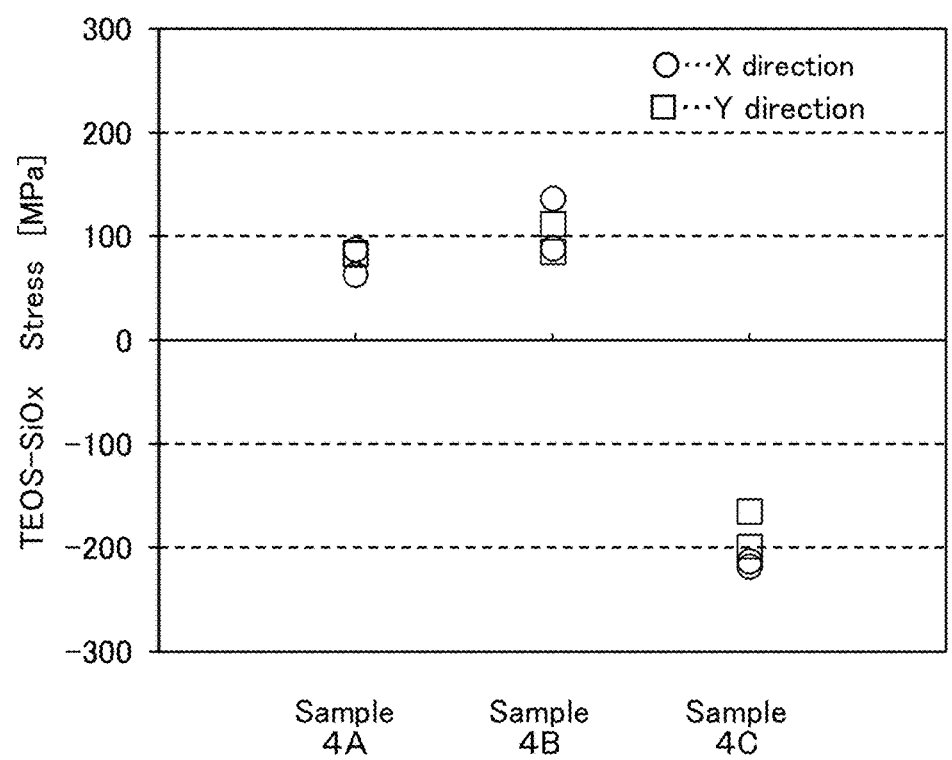
FIG. 33 shows measurement results of stress of samples used in Example.
Figure 34A:
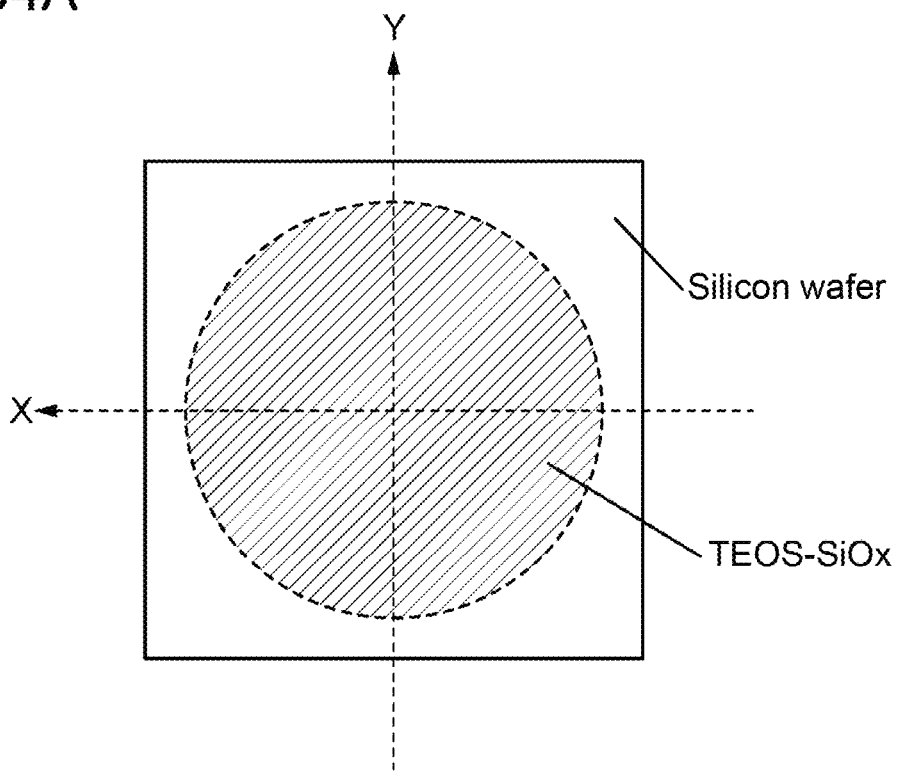
FIGS. 34A and 34B illustrate stress of samples used in Example.

FIG. 33 shows evaluation results of stress of the TEOS-SiOx films of the samples 4A to 4C. The stress at 4 points (each two points in the X direction and the Y direction in FIG. 34A) of each sample was evaluated.

Figure 34B:
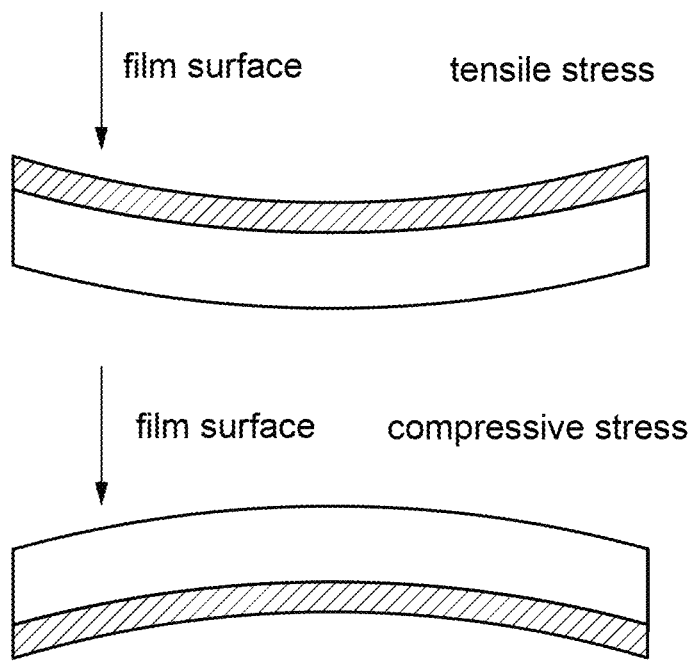

The positive value of the stress in FIG. 33 indicates tensile stress shown in FIG. 34B, and the negative value of the stress in FIG. 33 indicates compressive stress shown in FIG. 34B. As shown in FIG. 33, the TEOS-SiOx films of the samples 4A and 4B formed by an atmospheric pressure CVD method are affected by tensile stress, and this indicates that a crack is less likely to be generated in a film when the film is formed over the TEOS-SiOx film. Because an error occurs in a transfer mechanism such as a light exposure apparatus in the case of a film that largely warps owing to increased film stress in one direction, light exposure treatment cannot be performed in some cases; however, the TEOS-SiOx film formed by an atmospheric pressure CVD method has a smaller stress value (absolute value) than the TEOS-SiOx film formed by a plasma CVD method, and thus, the warpage of the film is small and misalignment of light exposure of the center and an edge at minute patterning can be suppressed.

Furthermore, stress of the TEOS-SiOx film formed by an atmospheric pressure CVD method was evaluated.

First, measurement samples are described.

A 100-nm-thick silicon oxide (TEOS-SiOx) film was formed over a silicon wafer. A sample that is the same as the sample 4A is regarded as a sample 4a. In a sample 4b, the TEOS-SiOx film was formed by an atmospheric pressure CVD method in a mixed atmosphere of a tetraethoxysilane (TEOS) gas and an ozone ($O_3$) gas (TEOS=33.5% (Max 1.0 g/min), $O_3$=77 g/m$^3$, and the flow ratio of $O_3$ to TEOS was 10.) as a deposition gas under the conditions where the exhaust gas pressure was −200 Pa, the substrate temperature was 420° C., and the deposition rate was 100 nm/min. In a sample 4c, the TEOS-SiOx film was formed by an atmospheric pressure CVD method in a mixed atmosphere of a tetraethoxysilane (TEOS) gas and an ozone ($O_3$) gas (TEOS=58% (Max 1.0 g/min), $O_3$=107 g/m$^3$, and the flow ratio of $O_3$ to TEOS was 8.) as a deposition gas under the conditions where the exhaust gas pressure was −200 Pa, the substrate temperature was 420° C., and the deposition rate was 150 nm/min. A sample that is the same as the sample 4B is regarded as a sample 4d.

Figure 35:
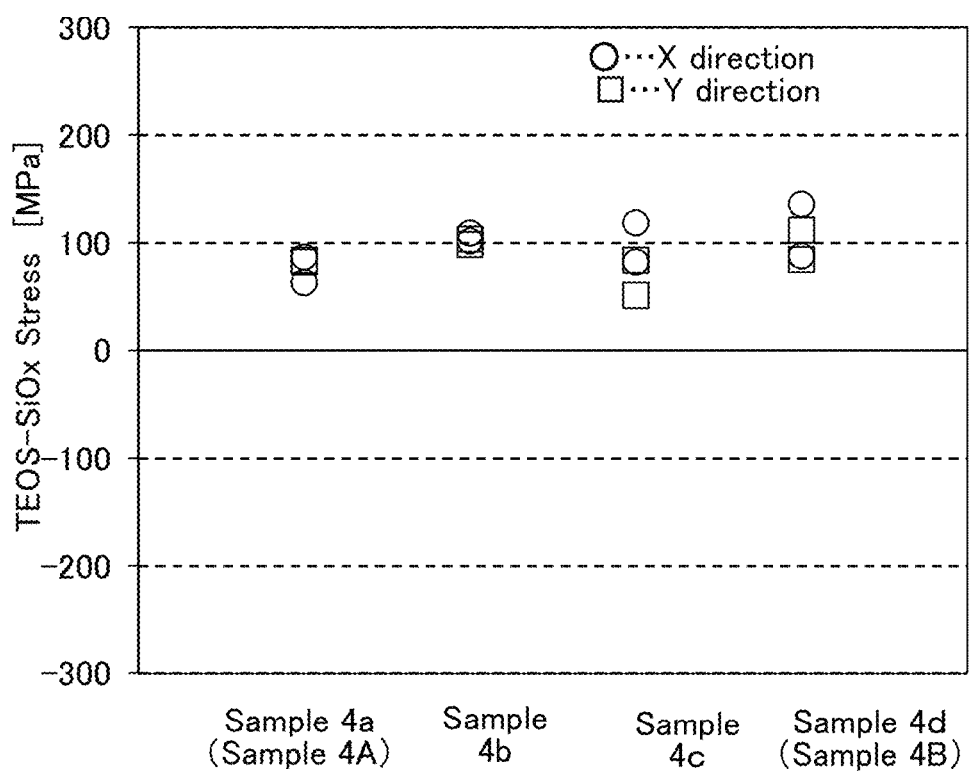
FIG. 35 shows measurement results of stress of samples used in Example.

FIG. 35 shows evaluation results of stress of the TEOS-SiOx films of the samples 4a to 4d. The stress at 4 points (each two points in the X direction and the Y direction in FIG. 34A) of each sample was evaluated.

As shown in FIG. 35, the TEOS-SiOx films formed by an atmospheric pressure CVD method of the samples 4a to 4d are affected by tensile stress, and the stress was approximately 100 Mpa under each condition.

This application is based on Japanese Patent Application serial no. 2014-168143 filed with Japan Patent Office on Aug. 21, 2014, the entire contents of which are hereby incorporated by reference.

What is claimed is:

1. A semiconductor device comprising:
a first layer;
a second layer over the first layer; and
a third layer over the second layer,
wherein the first layer comprises a first transistor and a first insulating film over the first transistor,
wherein the third layer comprises a second transistor,
wherein a channel formation region of the first transistor comprises a single crystal semiconductor,
wherein a channel formation region of the second transistor comprises an oxide semiconductor,
wherein the second layer comprises a second insulating film, a third insulating film, and a conductive film,
wherein the conductive film is electrically connected to the first transistor through an opening in the first insulating film,
wherein the second insulating film is over and in contact with a top surface of the conductive film,
wherein the third insulating film is over the second insulating film,
wherein the third insulating film comprises a first region in the opening of the first insulating film,
wherein the second insulating film is thinner than the third insulating film, and
wherein a carbon concentration in the second insulating film is larger than a carbon concentration in the third insulating film.

2. The semiconductor device according to claim 1, wherein the third insulating film comprises oxygen and silicon.

3. The semiconductor device according to claim 1, wherein the third insulating film is formed by an atmospheric pressure chemical vapor deposition method.

4. The semiconductor device according to claim 1, wherein the conductive film is provided with a nitride film.

5. An electronic device comprising:
the semiconductor device according to claim 1; and
a display device, a microphone, a speaker, an operation key, a touch panel, or an antenna.

6. The semiconductor device according to claim 1, wherein the third insulating film comprises a second region whose carbon concentration is greater than or equal to $1.77 \times 10^{17}$ atoms/cm$^3$ and less than or equal to $1.0 \times 10^{18}$ atoms/cm$^3$.

7. The semiconductor device according to claim 1,
wherein each of the second insulating film and the third insulating film comprises a first material, and
wherein the first material is any one of silicon oxide, silicon oxynitride, silicon nitride oxide, aluminum oxide, hafnium oxide, tantalum oxide, zirconium oxide, lead zirconate titanate (PZT), strontium titanate (SrTiO$_3$), and (Ba,Sr)TiO$_3$ (BST).

8. The semiconductor device according to claim 1, wherein the first material is silicon oxide.

9. The semiconductor device according to claim 1, wherein a top surface of the second insulating film has unevenness which reflects unevenness of the top surface of the conductive film.

10. A semiconductor device comprising:
a first layer;
a second layer over the first layer; and
a third layer over the second layer,
wherein the first layer comprises a first transistor and a first insulating film over the first transistor,
wherein the third layer comprises a second transistor,
wherein a channel formation region of the first transistor comprises a single crystal semiconductor,
wherein a channel formation region of the second transistor comprises an oxide semiconductor,
wherein the second layer comprises a second insulating film, a third insulating film, and a conductive film,
wherein the conductive film is electrically connected to the first transistor through an opening in the first insulating film,
wherein the second insulating film is over the conductive film,
wherein the third insulating film is over the second insulating film,
wherein the third insulating film comprises a first region in the opening of the first insulating film,
wherein the second insulating film is thinner than the third insulating film,
wherein a carbon concentration in the second insulating film is larger than a carbon concentration in the third insulating film,
wherein a nitride film is on a surface of the conductive film, and
wherein the oxide semiconductor comprises In and Zn.

11. The semiconductor device according to claim 10, wherein the third insulating film comprises oxygen and silicon.

12. The semiconductor device according to claim 10, wherein the third insulating film is formed by an atmospheric pressure chemical vapor deposition method.

13. The semiconductor device according to claim 10, wherein the oxide semiconductor further comprises Ga.

14. An electronic device comprising:
the semiconductor device according to claim 10; and
a display device, a microphone, a speaker, an operation key, a touch panel, or an antenna.

15. The semiconductor device according to claim 10, wherein the third insulating film comprises a second region whose carbon concentration is greater than or equal to $1.77 \times 10^{17}$ atoms/cm$^3$ and less than or equal to $1.0 \times 10^{18}$ atoms/cm$^3$.

16. The semiconductor device according to claim 10,
wherein each of the second insulating film and the third insulating film comprises a first material, and
wherein the first material is any one of silicon oxide, silicon oxynitride, silicon nitride oxide, aluminum oxide, hafnium oxide, tantalum oxide, zirconium oxide, lead zirconate titanate (PZT), strontium titanate (SrTiO$_3$), and (Ba,Sr)TiO$_3$(BST).

17. The semiconductor device according to claim 10,
wherein each of the second insulating film and the third insulating film comprises a first material, and
wherein the first material is silicon oxide.

18. The semiconductor device according to claim 10, wherein a top surface of the second insulating film has unevenness which reflects unevenness of a top surface of the conductive film.

* * * * *